US012777971B2

(12) United States Patent
Jeon et al.

(10) Patent No.: US 12,777,971 B2
(45) Date of Patent: Oct. 27, 2026

(54) DISPLAY DEVICE INCLUDING DRIVING VOLTAGE LINE

(71) Applicant: Samsung Display Co., LTD., Yongin-si (KR)

(72) Inventors: Sang Jin Jeon, Hwaseong-si (KR); Hyun Joon Kim, Hwaseong-si (KR); Kye Uk Lee, Seoul (KR); Jung Hwan Hwang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 930 days.

(21) Appl. No.: 18/076,148

(22) Filed: Dec. 6, 2022

(65) Prior Publication Data

US 2023/0230964 A1 Jul. 20, 2023

(30) Foreign Application Priority Data

Jan. 17, 2022 (KR) ........................ 10-2022-0006667
Mar. 18, 2022 (KR) ........................ 10-2022-0033789

(51) Int. Cl.
*H10W 90/00* (2026.01)
*H10D 86/40* (2025.01)
(Continued)

(52) U.S. Cl.
CPC .......... *H10W 90/00* (2026.01); *H10D 86/441* (2025.01); *H10D 86/481* (2025.01); *H10D 86/60* (2025.01); *H10H 29/49* (2025.01)

(58) Field of Classification Search
CPC ... H10W 90/00; H10D 86/441; H10D 86/481; H10D 86/60; H10D 86/423; H10H 29/49; H10H 29/39; H10H 29/41; H10H 29/32
See application file for complete search history.

(56) References Cited

U.S. PATENT DOCUMENTS 10,770,441 B2 * 9/2020 Kuo ........................ H10H 20/85
11,721,286 B2 * 8/2023 Zhang .................. G09G 3/3233
345/204
(Continued)

FOREIGN PATENT DOCUMENTS

KR 2019-0012789 A 2/2019
KR 2019-0047565 A 5/2019
(Continued)

OTHER PUBLICATIONS

International Search Report dated Apr. 20, 2023 for corresponding Korean PCT Application No. PCT/KR2023/000710 (4 pages).

*Primary Examiner* — Tan N Tran
(74) *Attorney, Agent, or Firm* — Womble Bond Dickinson (US) LLP

(57) ABSTRACT

A display device includes a first data line configured to receive a first data voltage, a second data line configured to receive a second data voltage, a low driving voltage line configured to receive a low driving voltage, and a first sub-pixel connected to the first data line, the second data line, and the low driving voltage line. The first sub-pixel includes a cathode pad electrode connected to the low driving voltage line, a first transistor configured to generate a control current according to the first data voltage of the first data line and having a first gate electrode, an eighth transistor configured to generate a driving current applied to a light emitting element according to the second data voltage of the second data line, and a first capacitor including a first capacitor electrode connected to the first gate electrode, and a second capacitor electrode on the first capacitor electrode.

21 Claims, 28 Drawing Sheets

(51) Int. Cl.

| | |
|---|---|
| ***H10D 86/60*** | (2025.01) |
| ***H10H 29/49*** | (2025.01) |

(56) References Cited

U.S. PATENT DOCUMENTS

| | | | | |
|---|---|---|---|---|
| 2015/0008405 | A1 | 1/2015 | Kim et al. | |
| 2019/0348491 | A1* | 11/2019 | Chung ................. | H10K 59/124 |
| 2021/0241682 | A1 | 8/2021 | Jung et al. | |
| 2021/0257347 | A1 | 8/2021 | Shih et al. | |
| 2021/0375194 | A1 | 12/2021 | Kwag et al. | |
| 2022/0102477 | A1* | 3/2022 | Sim ...................... | H10K 59/131 |

FOREIGN PATENT DOCUMENTS

| | | | |
|---|---|---|---|
| KR | 2019-0073849 | A | 6/2019 |
| KR | 2020-0006211 | A | 1/2020 |

* cited by examiner

T3: T31, T32
T4: T41, T42
T10: T101, T102
T16: T161, T162

DISPLAY DEVICE INCLUDING DRIVING VOLTAGE LINE

CROSS-REFERENCE TO RELATED APPLICATION

This application claims priority to, and the benefit of, Korean Patent Application No. 10-2022-0006667 filed on Jan. 17, 2022 and Korean Patent Application No. 10-2022-0033789 filed on Mar. 18, 2022 in the Korean Intellectual Property Office (KIPO), the entire contents of both of which are incorporated by reference herein.

BACKGROUND

1. Field

The present disclosure relates to a display device.

2. Description of the Related Art

As the information society develops, the demand for a display device for displaying an image is increasing in various forms. The display device may be a flat panel display, such as a liquid crystal display, a field emission display, or a light emitting display panel. The light emitting display device may include an organic light emitting diode display device including an organic light emitting diode element as a light emitting element or a light emitting diode display device including an inorganic light emitting diode element such as a light emitting diode (LED) as a light emitting element.

SUMMARY

Aspects and features of embodiments of the present disclosure provide a display device capable of reducing manufacturing cost by reducing the number of masks.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a first data line configured to receive a first data voltage, a second data line configured to receive a second data voltage, a low driving voltage line configured to receive a low driving voltage, and a first sub-pixel connected to the first data line, the second data line, and the low driving voltage line. The first sub-pixel includes a cathode pad electrode connected to the low driving voltage line, a first transistor configured to generate a control current according to the first data voltage of the first data line and having a first gate electrode, an eighth transistor configured to generate a driving current applied to a light emitting element according to the second data voltage of the second data line, and a first capacitor including a first capacitor electrode connected to the first gate electrode, and a second capacitor electrode on the first capacitor electrode. The low driving voltage line is at a same layer as the second capacitor electrode and is surrounding the second capacitor electrode.

The display device may further include a scan write line configured to receive a scan write signal, and a second transistor including a second gate electrode connected to the scan write line. The second gate electrode may overlap the low driving voltage line.

The low driving voltage line may be disposed on a lower side of the first data line and the second data line.

The cathode pad electrode may be connected to the low driving voltage line through a pad contact hole.

The cathode pad electrode may include a stem portion extending in a first direction, and a branch portion connected to the stem portion and extending in a second direction intersecting the first direction. The pad contact hole may be in the stem portion.

The display device may further include a second light emitting line configured to receive a second light emitting signal, a second high driving voltage line configured to receive a second high driving voltage, and a twelfth transistor connecting the second high driving voltage line to one electrode of the eighth transistor according to the second light emitting signal. The second high driving voltage line may be on the low driving voltage line.

The low driving voltage line may further include a hole exposing one electrode of the twelfth transistor, and a connection electrode having a contact hole connecting one electrode of the twelfth transistor and the second high driving voltage line to each other in the hole.

The display device may further include a substrate supporting the first sub-pixel. The low driving voltage line, the connection electrode, and the second high driving voltage line may be sequentially located in a thickness direction of the substrate.

The second high driving voltage line may include an opening exposing the low driving voltage line. The cathode pad electrode may be connected to the low driving voltage line in the opening.

The display device may further include an anode pad electrode spaced from the cathode pad electrode. The light emitting element may be on the cathode pad electrode and the anode pad electrode.

The display device may further include a first light emitting line configured to receive a first light emitting signal, a first high driving voltage line configured to receive a first high driving voltage, and a fifth transistor connecting the first high driving voltage line to one electrode of the first transistor according to the first light emitting signal. The low driving voltage line may include a hole exposing one electrode of the fifth transistor.

The light emitting element may be a flip chip type micro light emitting diode element.

According to one or more embodiments of the present disclosure, there is provided a display device including a first data line configured to receive a first data voltage, a second data line configured to receive a second data voltage, a low driving voltage line configured to receive a low driving voltage, a second high driving voltage line configured to receive a second high driving voltage, and a first sub-pixel connected to the first data line, the second data line, the low driving voltage line, and the second high driving voltage line. The first sub-pixel may include a first transistor configured to generate a control current according to the first data voltage of the first data line and having a first gate electrode, an eighth transistor configured to generate a driving current applied to a light emitting element according to the second data voltage of the second data line, and a capacitor electrode on the first gate electrode. The low-potential line may be at a same layer as the capacitor electrode, and the second high driving voltage line includes an opening exposing the low driving voltage line.

The display device may further include a cathode pad electrode connected to the low driving voltage line within the opening.

The light emitting element may be a flip chip type micro light emitting diode element.

According to one or more embodiments of the present disclosure, there is provided a display device including a substrate, an active layer including a first channel, a first source electrode, and a first drain electrode on the substrate, a first insulating layer on the active layer, a first gate electrode and a first capacitor electrode on the first insulating layer and overlapping the first channel, a second insulating layer on the first gate electrode and the first capacitor electrode, a second capacitor electrode and a low driving voltage line on the second insulating layer and overlapping the first capacitor electrode, a third insulating layer on the second capacitor electrode and the low driving voltage line, a scan write line on the third insulating layer and configured to receive a scan write signal is applied, a fourth insulating layer on the scan write line, a second high driving voltage line on the fourth insulating layer and configured to receive a second high driving voltage, and a cathode pad electrode on the second high driving voltage line and connected to the low driving voltage line.

The second high driving voltage line may include an opening exposing the low driving voltage line, and the cathode pad electrode is connected to the low driving voltage line in the opening.

The cathode pad electrode may be directly connected to the low driving voltage line through a pad contact hole penetrating through the fourth insulating layer and the third insulating layer.

The pad contact hole may be formed through laser drilling.

The display device may further include a first anode connection electrode on the fourth insulating layer, a fifth insulating layer on the first anode connection electrode, a second anode connection electrode on the fifth insulating layer, and an anode pad electrode on the second anode connection electrode.

The second anode connection electrode may be in contact with the anode pad electrode.

The second high driving voltage line may be at a same layer as the second anode connection electrode.

The display device may further include a cathode connection electrode at the same layer as the second anode connection electrode. The cathode pad electrode may be on a lower side of the cathode connection electrode.

The cathode pad electrode may be in direct contact with the fifth insulating layer.

The display device may further include a buffer layer disposed between the substrate and the active layer. The buffer layer may be in direct contact with the first channel, the first source electrode, and the first drain electrode.

According to one or more embodiments of the present disclosure, there is provided a display device including a substrate, an active layer on the substrate and having a first channel, a first gate metal layer on the active layer and having a first gate electrode and a first capacitor electrode overlapping the first channel, a second gate metal layer on the first gate metal layer and having a second capacitor electrode overlapping the first capacitor electrode and a low driving voltage line spaced from the second capacitor electrode, a first source metal layer on the second gate metal layer and having a first light emitting line configured to receive a first light emitting signal, a second source metal layer on the first source metal layer and having a data line configured to receive a data voltage, a third source metal layer on the second source metal layer and having a high driving voltage line configured to receive a high driving voltage, and an anode pad electrode and a cathode pad electrode on the third source metal layer.

The anode pad electrode and the cathode pad electrode may include a transparent conductive material.

The active layer may further include a second channel connected to the first channel. The first gate metal layer further includes a second gate electrode overlapping the second channel and connected to the first light emitting line. The low driving voltage line may overlap the second gate electrode in a thickness direction of the substrate.

The high driving voltage line may be electrically connected to one electrode connected to the second channel.

According to one or more embodiments of the present disclosure, there is provided a tiled display device including a plurality of display devices and a joint between the plurality of display devices, a first display device of the plurality of display devices including: a substrate, a first data line on one surface of the substrate and configured to receive a first data voltage, a second data line configured to receive a second data voltage, a low driving voltage line configured to receive a low driving voltage, and a first sub-pixel connected to the first data line, the second data line, and the low driving voltage line. The first sub-pixel includes a light emitting element; a cathode pad electrode connected to the low driving voltage line, a first transistor configured to generate a control current according to the first data voltage of the first data line and having a first gate electrode, an eighth transistor configured to generate a driving current applied to the light emitting element according to the second data voltage of the second data line, and a first capacitor including a first capacitor electrode connected to the first gate electrode, and a second capacitor electrode on the first capacitor electrode. The low driving voltage line is at a same layer as the second capacitor electrode and is surrounding the second capacitor electrode.

The light emitting element may be a flip chip type micro light emitting diode element.

The substrate may include glass.

The first display device may further include a pad on a first surface of the substrate, and a side connection line on the first surface of the substrate, a second surface opposite to the first surface, and one side surface between the first surface and the second surface, and connected to the pad.

The first display device may further include a connection line on the second surface of the substrate, and a flexible film connected to the connecting wiring through a conductive adhesive member. The side connection line may be connected to the connection line.

The plurality of display devices may be arranged in a matrix form of M rows and N columns.

According to the aforementioned and other embodiments of the present disclosure, the display device may include a first gate metal layer including a gate electrode of a transistor, and a second gate metal layer including an upper capacitor electrode. Since the second gate metal layer includes a low driving voltage wiring to which a low driving voltage is applied to an area where the upper capacitor electrode is not disposed, the number of masks may be reduced. Accordingly, the manufacturing cost of the display device may be reduced and the manufacturing process thereof may be simplified.

BRIEF DESCRIPTION OF THE DRAWINGS

The above and other embodiments and features of the present disclosure will become more apparent by describing embodiments thereof with reference to the attached drawings, in which.

DETAILED DESCRIPTION

Figure 1:
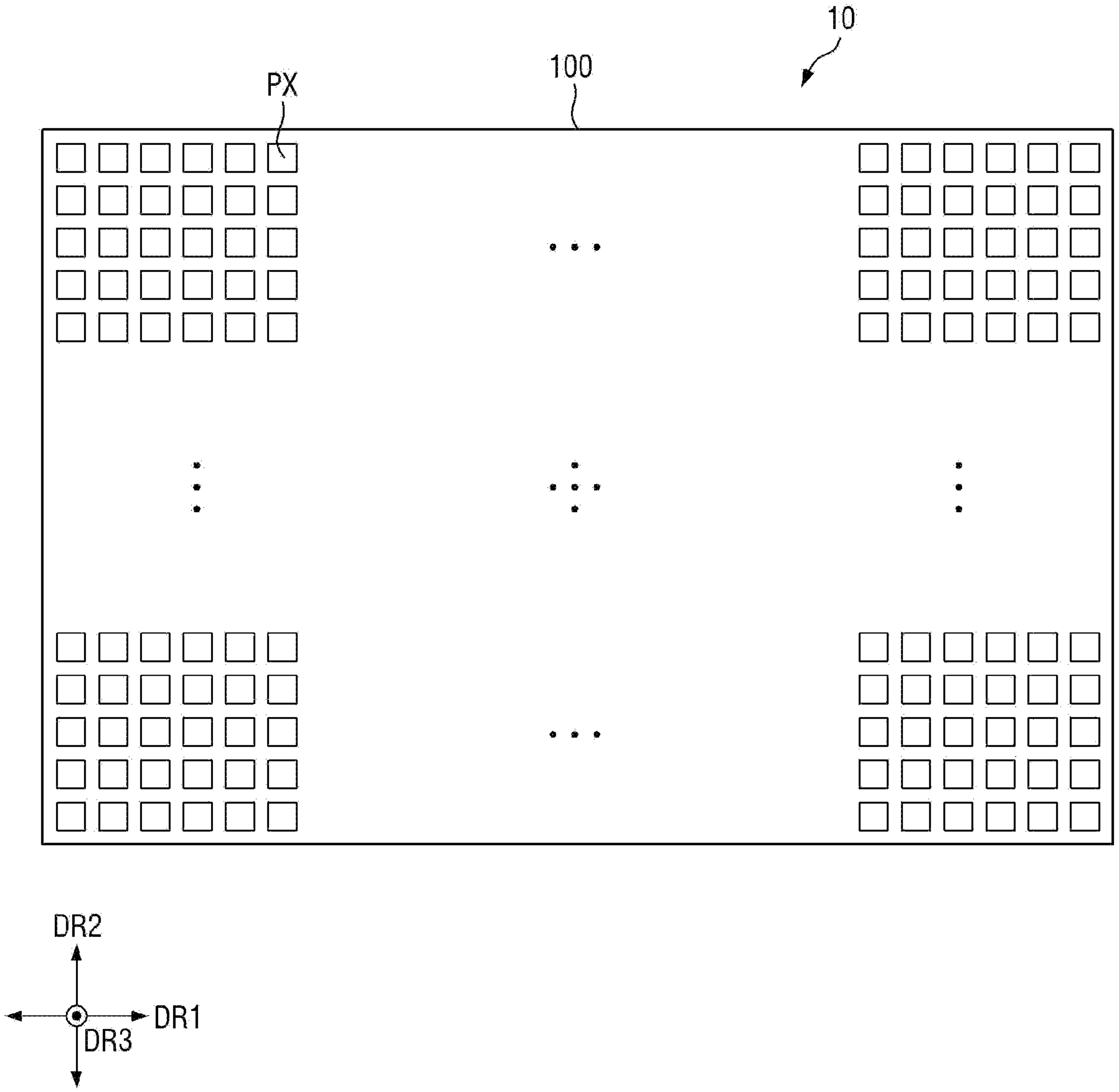
FIG. 1 is a plan view illustrating a display device according to one or more embodiments.

Aspects and features of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure might not be described.

Unless otherwise noted, like reference numerals, characters, or combinations thereof denote like elements throughout the attached drawings and the written description, and thus, descriptions thereof will not be repeated. Further, parts not related to the description of one or more embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as “beneath,” “below,” “lower,” “under,” “above,” “upper,” and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
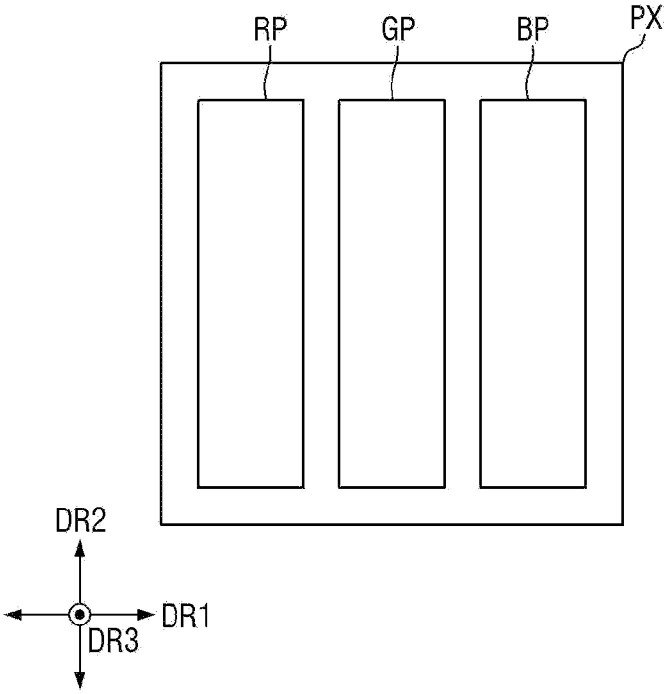
FIG. 2 is an exemplary view illustrating an example of a pixel of FIG. 1.
Figure 3:
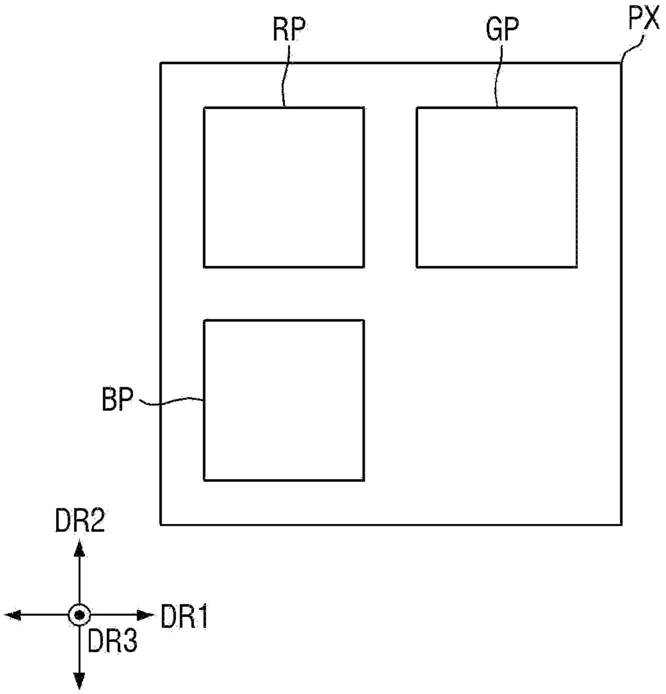
FIG. 3 is an exemplary view illustrating another example of the pixel of FIG. 1.

FIG. 1 is a plan view illustrating a display device according to one or more embodiments. FIG. 2 is an exemplary view illustrating an example of a pixel of FIG. 1. FIG. 3 is an exemplary view illustrating another example of the pixel of FIG. 1.

Referring to FIGS. 1 to 3, a display device 10 is a device that displays a moving image or a still image, and may be used as a display screen of each of various products such as televisions, laptop computers, monitors, billboards, and Internet of Things (IoT) as well as portable electronic devices such as mobile phones, smartphones, tablet personal computers (PCs), smartwatches, watch phones, mobile communication terminals, electronic organizers, electronic books, portable multimedia players (PMPs), navigation devices, and ultra mobile PCs (UMPCs).

A display panel 100 may be formed in a rectangular plane having a long side in a first direction DR1 and a short side in a second direction DR2 intersecting the first direction DR1. A corner where the long side in the first direction DR1 and the short side in the second direction DR2 meet may be rounded to have a suitable curvature (e.g., a predetermined curvature) or may be formed at a right angle. The planar shape of the display panel 100 is not limited to the rectangular shape, and may be other polygonal shapes, a circular shape, or an elliptical shape. The display panel 100 may be formed to be flat, but is not limited thereto. For example, the display panel 100 may include curved surface portions formed at left and right distal ends thereof and having a constant curvature or a variable curvature. In addition, the display panel 100 may be flexibly formed to be curved, bent, folded, or rolled.

The display panel 100 may further include pixels PXs, scan lines extending in the first direction DR1, and data lines extending in the second direction DR2 to display an image. The pixels PX may be arranged in a matrix form in the first direction DR1 and the second direction DR2. For example, the pixels PX may be arranged along rows and columns of a matrix in the first direction DR1 and the second direction DR2.

Each of the pixels PX may include a plurality of sub-pixels RP, GP, and BP as illustrated in FIGS. 2 and 3. It is illustrated in FIGS. 2 and 3 that each of the pixels PX includes three sub-pixels RP, GP, and BP, that is, a first sub-pixel RP, a second sub-pixel GP, and a third sub-pixel BP, but one or more embodiments of the present specification are not limited thereto.

The first sub-pixel RP, the second sub-pixel GP, and the third sub-pixel BP may be connected to any one of the data lines and at least one of the scan lines.

Each of the first sub-pixel RP, the second sub-pixel GP, and the third sub-pixel BP may have a rectangular, square, or rhombus planar shape. For example, each of the first sub-pixel RP, the second sub-pixel GP, and the third sub-pixel BP may have a rectangular planar shape having a short side in the first direction DR1 and a long side in the second direction DR2 as illustrated in FIG. 2. Alternatively, each of the first sub-pixel RP, the second sub-pixel GP, and the third sub-pixel BP may have a square or rhombus planar shape including sides having the same length in the first direction DR1 and the second direction DR2 as illustrated in FIG. 3.

As illustrated in FIG. 2, the first sub-pixel RP, the second sub-pixel GP, and the third sub-pixel BP may be arranged along the first direction DR1. Alternatively, any one of the second sub-pixel GP and the third sub-pixel BP and the first sub-pixel RP may be arranged along the first direction DR1, and the other one of the second sub-pixel GP and the third sub-pixel BP and the first sub-pixel RP may be arranged along the second direction DR2. For example, as illustrated in FIG. 3, the first sub-pixel RP and the second sub-pixel GP may be arranged along the first direction DR1, and the first sub-pixel RP and the third sub-pixel BP may be arranged along the second direction DR2.

Alternatively, any one of the first sub-pixel RP and the third sub-pixel BP and the second sub-pixel GP may be arranged along the first direction DR1, and the other one of the first sub-pixel RP and the third sub-pixel BP and the second sub-pixel GP may be arranged along the second direction DR2. Alternatively, any one of the first sub-pixel RP and the second sub-pixel GP and the third sub-pixel BP may be arranged along the first direction DR1, and the other one of the first sub-pixel RP and the second sub-pixel GP and the third sub-pixel BP may be arranged along the second direction DR2.

The first sub-pixel RP may include a first light emitting element emitting a first light, the second sub-pixel GP may include a second light emitting element emitting a second light, and the third sub-pixel BP may include a third light emitting element emitting a third light. Here, the first light may be light in a red wavelength band, the second light may be light in a green wavelength band, and the third light may be light in a blue wavelength band. The red wavelength band may be a wavelength band of approximately 600 nm to 750 nm, the green wavelength band may be a wavelength band of approximately 480 nm to 560 nm, and the blue wavelength band may be a wavelength band of approximately 370 nm to 460 nm, but embodiments of the present specification are not limited thereto.

Each of the first sub-pixel RP, the second sub-pixel GP, and the third sub-pixel BP may include an inorganic light emitting element including an inorganic semiconductor as a light emitting element that emits light. For example, the inorganic light emitting element may be a flip chip type micro light emitting diode (LED), but embodiments of the present specification are not limited thereto.

As illustrated in FIGS. 2 and 3, an area of the first sub-pixel RP, an area of the second sub-pixel GP, and an area of the third sub-pixel BP may be substantially the same, but embodiments of the present specification are not limited thereto. At least one of the area of the first sub-pixel RP, the area of the second sub-pixel GP, and the area of the third sub-pixel BP may be different from another one. Alternatively, any two of the area of the first sub-pixel RP, the area of the second sub-pixel GP, and the area of the third sub-pixel BP may be substantially the same, and the other one may be different from the two. Alternatively, the area of the first sub-pixel RP, the area of the second sub-pixel GP, and the area of the third sub-pixel BP may be different from each other.

Figure 4:
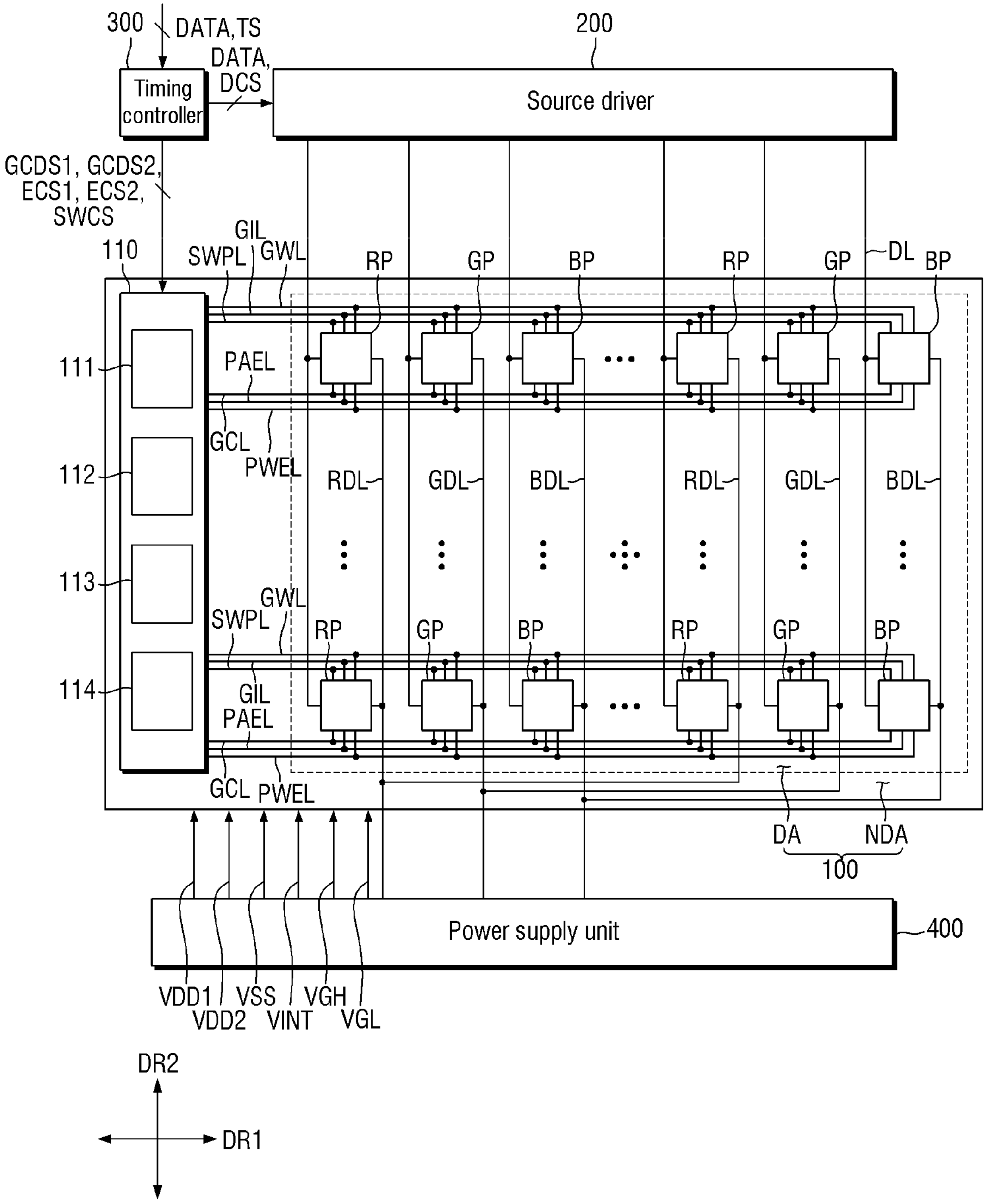
FIG. 4 is a block diagram illustrating the display device according to one or more embodiments.

FIG. 4 is a block diagram illustrating the display device according to one or more embodiments.

Referring to FIG. 4, the display device 10 includes a display panel 100, a scan driver 110, a source driver 200, a timing controller 300, and a power supply unit 400.

A display area DA of the display panel 100 may include sub-pixels RP, GP, and BP displaying an image, scan write lines GWL connected to the sub-pixels RP, GP, and BP, scan initialization lines GIL, scan control lines GCL, sweep signal lines SWPL, PWM light emitting lines PWEL, PAM light emitting lines PAEL, PWM data lines DL, first PAM data lines RDL, second PAM data lines GDL, and third PAM data lines BDL.

The scan write lines GWL, the scan initialization lines GIL, the scan control lines GCL, the sweep signal lines SWPL, the PWM light emitting lines PWEL, and the PAM light emitting lines PAEL may extend in the first direction DR1, and may be disposed in the second direction DR2 intersecting the first direction DR1. The PWM data lines DL, the first PAM data lines RDL, the second PAM data lines GDL, and the third PAM data lines BDL may extend in the second direction DR2 and may be disposed along the first direction DR1. The first PAM data lines RDL may be electrically connected to each other, the second PAM data lines GDL may be electrically connected to each other, and the third PAM data lines BDL may be electrically connected to each other.

Each of the sub-pixels RP, GP, and BP may be connected to any one of the scan write lines GWL, any one of the scan initialization lines GIL, any one of the scan control lines GCL, any one of the sweep signal lines SWPL, any one of the PWM light emitting lines PWEL, and any one of the PAM light emitting lines PAEL. In addition, each of the first sub-pixels RP may be connected to any one of the PWM data lines DL and the first PAM data lines RDL. Each of the second sub-pixels GP may be connected to any one of the PWM data lines DL and the second PAM data lines GDL. Each of the third sub-pixels BP may be connected to any one of the PWM data lines DL and the third PAM data lines BDL.

The scan driver 110 for applying signals to the scan write lines GWL, the scan initialization lines GIL, the scan control lines GCL, the sweep signal lines SWPL, the PWM light emitting lines PWEL, and the PAM light emitting lines PAEL may be disposed in a non-display area of the display panel 100. It is illustrated in FIG. 4 that the scan driver 110 is disposed at an edge on one side of the display panel 100, but the present disclosure is not limited thereto. The scan driver 110 may be disposed at edges on both sides of the display panel 100.

The scan driver 110 may include a first scan signal driver 111, a second scan signal driver 112, a sweep signal driver 113, and a light emitting signal driver 114.

The first scan signal driver 111 may receive a first scan driving control signal from the timing controller 300. The first scan signal driver 111 may output scan initialization signals to the scan initialization lines GIL and output scan write signals to the scan write lines GWL according to the first scan driving control signal. That is, the first scan signal driver 111 may output two scan signals, that is, the scan initialization signals and the scan write signals together.

The second scan signal driver 112 may receive a second scan driving control signal from the timing controller 300. The second scan signal driver 112 may output scan control signals to the scan control lines GCL according to the second scan driving control signal.

The sweep signal driver 113 may receive a first light emitting control signal and a sweep control signal from the timing controller 300. The sweep signal driver 113 may output PWM light emitting signals to the PWM light emitting lines PWEL and output sweep signals to the sweep signal lines SWPL according to the first light emitting control signal. That is, the sweep signal driver 113 may output the PWM light emitting signals and the sweep signals together.

The light emitting signal driver 114 may receive a second light emitting control signal from the timing controller 300. The light emitting signal driver 114 may output PAM light emitting signals to the PAM light emitting lines PAEL according to the second light emitting control signal.

The timing controller 300 receives digital video data DATA and timing signals TS. The timing controller 300 may generate a scan timing control signal for controlling an operation timing of the scan driver 110 according to the timing signals TS. The scan timing control signal may generate the first scan driving control signal, the second scan driving control signal, the first light emitting control signal, the second light emitting control signal, and the sweep control signal. In addition, the timing controller 300 may generate a source control signal for controlling an operation timing of the source driver 200.

The timing controller 300 outputs the first scan driving control signal, the second scan driving control signal, the first light emitting control signal, the second light emitting control signal, and the sweep control signal to the scan driver 110. The timing controller 300 may output the digital video data DATA and a PWM control signal DCS to the source driver 200.

The source driver 200 converts the digital video data DATA into analog PWM data voltages and outputs the analog PWM data voltages to the PWM data lines DL. Accordingly, the sub-pixels RP, GP, and BP may be selected by the scan write signals of the scan driver 110, and the PWM data voltages may be supplied to the selected sub-pixels RP, GP, and BP.

The power supply unit 400 may commonly output a first PAM data voltage to the first PAM data lines RDL, may commonly output a second PAM data voltage to the second PAM data lines GDL, and may commonly output a third PAM data voltage to the third PAM data lines BDL. In addition, the power supply unit 400 may generate a plurality of power voltages and output the plurality of power voltages to the display panel 100.

The power supply unit 400 may output a first power voltage VDD1, a second power voltage VDD2, a third power voltage VSS, an initialization voltage VINT, a gate-on voltage VGL, and a gate-off voltage VGH to the display panel 100. The first power voltage VDD1 and the second power voltage VDD2 may be high driving voltages for driving the light emitting element of each of the sub-pixels RP, GP, and BP. The third power voltage VSS may be a low driving voltage for driving a light emitting element of each of the sub-pixels RP, GP, and BP. The initialization voltage VINT and the gate-off voltage VGH may be applied to each of the sub-pixels RP, GP, and BP, and the gate-on voltage VGL and the gate-off voltage VGH may be applied to the scan driver 110.

Each of the source driver 200, the timing controller 300, and the power supply unit 400 may be formed as an integrated circuit. In addition, the source driver 200 may be formed as a plurality of integrated circuits.

Figure 5:
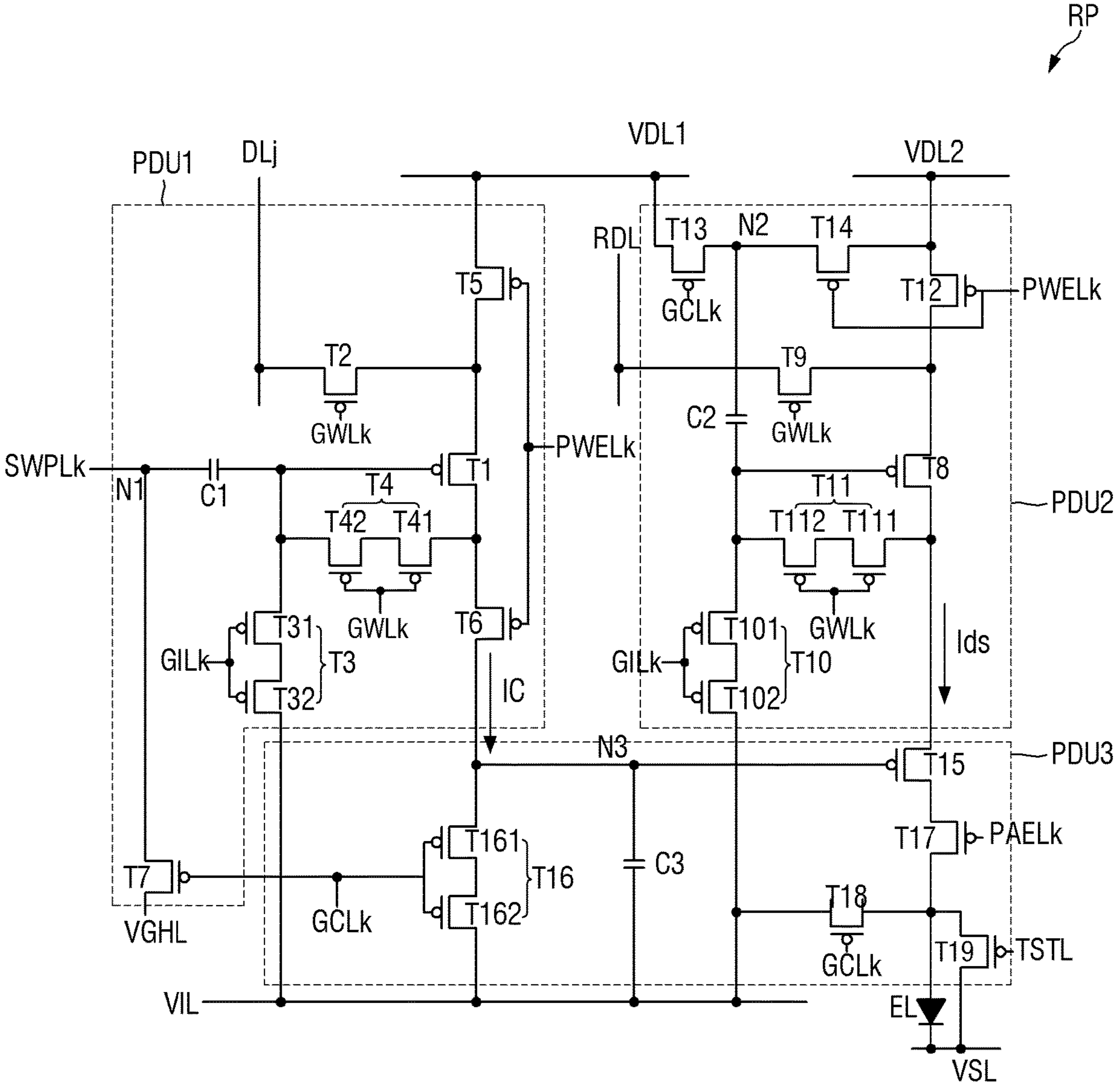
FIG. 5 is a circuit diagram illustrating a first sub-pixel according to one or more embodiments.

FIG. 5 is a circuit diagram illustrating a first sub-pixel according to one or more embodiments.

Referring to FIG. 5, the first sub-pixel RP according to one or more embodiments may be connected to a k-th (k is a positive integer) scan write line GWLk, a k-th scan initialization line GILk, a k-th scan control line GCLk, a k-th sweep signal line SWPLk, a k-th PWM light emitting line PWELk, and a k-th PAM light emitting line PAELk. In addition, the first sub-pixel RP may be connected to a j-th PWM data line DLj and the first PAM data line RDL. In addition, the first sub-pixel RP may be connected to a first power line VDL1 to which the first power voltage VDD1 is applied, a second power line VDL2 to which the second power voltage VDD2 is applied, a third power line VSL to which the third power voltage VSS is applied, an initialization voltage line VIL to which the initialization voltage VINT is applied, and a gate-off voltage line VGHL to which the gate-off voltage VGH is applied. For convenience of explanation, the j-th PWM data line DLj may be referred to as a first data line, and the first PAM data line RDL may be referred to as a second data line. In addition, the first power line VDL1 may be referred to as a first high driving voltage line, the second power line VDL2 may be referred to as a second high driving voltage line, and the third power line VSL may be referred to as a low driving voltage line.

The first sub-pixel RP may include a light emitting element EL, a first pixel driving unit PDU1, a second pixel driving unit PDU2, and a third pixel driving unit PDU3.

Figure 20:
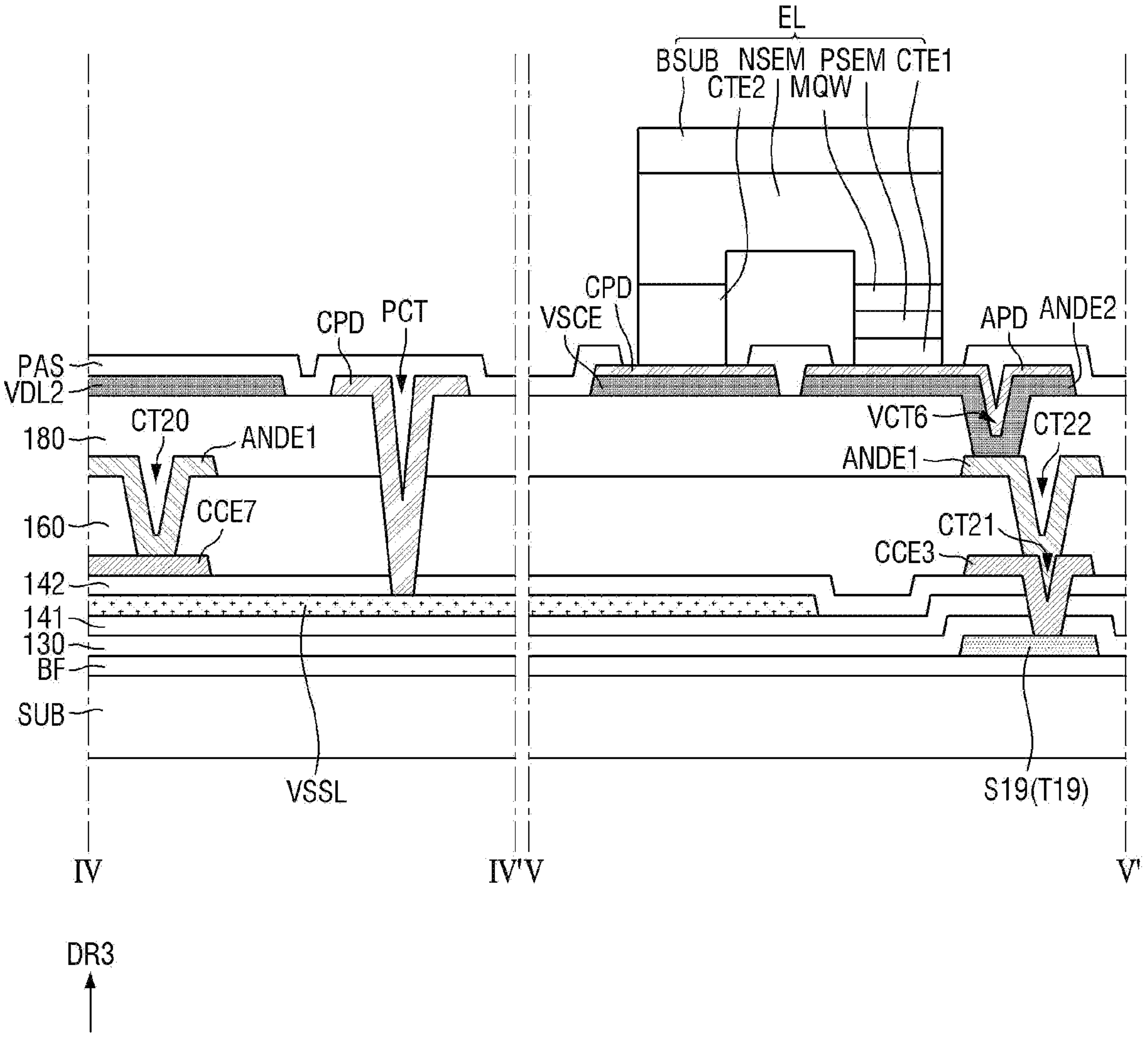
FIG. 20 is a cross-sectional view taken along the lines IV-IV' and V-V' of FIGS. 6 and 7.

The light emitting element EL emits light according to a driving current Ids generated by the second pixel driving unit PDU2. The light emitting element EL may be disposed between a seventeenth transistor T17 and the third power line VSL. A first electrode of the light emitting element EL may be connected to a second electrode of the seventeenth transistor T17, and a second electrode thereof may be connected to the third power line VSL. The first electrode of the light emitting element EL may be an anode electrode, and the second electrode thereof may be a cathode electrode. The light emitting element EL may be an inorganic light emitting element including the first electrode, the second electrode, and an inorganic semiconductor disposed between the first electrode and the second electrode. For example, the light emitting element EL may be a micro light emitting diode made of an inorganic semiconductor, but is not limited thereto. In FIG. 20, the first electrode of the light emitting element EL may be a p-type semiconductor PSEM, and the second electrode thereof may be an n-type semiconductor NSEM.

The first pixel driving unit PDU1 generates a control current Ic according to a j-th PWM data voltage of the j-th PWM data line DLj to control a voltage of a third node N3 of the third pixel driving unit PDU3. Because a pulse width of the driving current Ids flowing through the light emitting element EL may be adjusted by the control current Ic of the first pixel driving unit PDU1, the first pixel driving unit PDU1 may be a pulse width modulation unit (or PWM unit) that performs pulse width modulation of the driving current Ids flowing through the light emitting element EL.

The first pixel driving unit PDU1 may include first to seventh transistors T1 to T7 and a first capacitor C1.

The first transistor T1 controls a control current Ic flowing between a second electrode and a first electrode of the first transistor T1 according to a PWM data voltage applied to a gate electrode of the first transistor T1.

The second transistor T2 is turned on by a k-th scan write signal of a k-th scan write line GWLk to supply the PWM data voltage of the j-th PWM data line DLj to the first electrode of the first transistor T1. The gate electrode of the second transistor T2 may be connected to the k-th scan write line GWLk, a first electrode thereof may be connected to the j-th PWM data line DLj, and a second electrode thereof may be connected to the first electrode of the first transistor T1.

The third transistor T3 is turned on by a k-th scan initialization signal of the k-th scan initialization line GILk to connect the initialization voltage line VIL to the gate electrode of the first transistor T1. Accordingly, during a period in which the third transistor T3 is turned on, the gate electrode of the first transistor T1 may be discharged to the initialization voltage VINT of the initialization voltage line VIL. In this case, the gate-on voltage VGL of the k-th scan initialization signal may be different from the initialization voltage VINT of the initialization voltage line VIL. In particular, because a voltage difference between the gate-on voltage VGL and the initialization voltage VINT is greater than a threshold voltage of the third transistor T3, the third transistor T3 may be stably turned on even after the initialization voltage VINT is applied to the gate electrode of the first transistor T1. Therefore, when the third transistor T3 is turned on, the initialization voltage VINT may be stably applied to the gate electrode of the first transistor T1 regardless of the threshold voltage of the third transistor T3.

The third transistor T3 may include a plurality of transistors connected in series. For example, the third transistor T3 may include a first sub-transistor T31 and a second sub-transistor T32. Accordingly, it is possible to prevent the voltage of the gate electrode of the first transistor T1 from leaking through the third transistor T3. A gate electrode of the first sub-transistor T31 may be connected to the k-th scan initialization line GILk, a first electrode thereof may be connected to the gate electrode of the first transistor T1, and a second electrode thereof may be connected to a first electrode of the second sub-transistor T32. A gate electrode of the second sub-transistor T32 may be connected to the k-th scan initialization line GILk, a first electrode thereof may be connected to a second electrode of the first sub-transistor T31, and a second electrode thereof may be connected to the initialization voltage line VIL.

The fourth transistor T4 is turned on by the k-th scan write signal of the k-th scan write line GWLk to connect the gate electrode and the second electrode of the first transistor T1 to each other. Accordingly, during a period in which the fourth transistor T4 is turned on, the first transistor T1 may operate as a diode (e.g., the first transistor T1 is diode-connected).

The fourth transistor T4 may include a plurality of transistors connected in series. For example, the fourth transistor T4 may include a third sub-transistor T41 and a fourth sub-transistor T42. Accordingly, it is possible to prevent the voltage of the gate electrode of the first transistor T1 from leaking through the fourth transistor T4. A gate electrode of the third sub-transistor T41 may be connected to the k-th scan write line GWLk, a first electrode thereof may be connected to the second electrode of the first transistor T1, and a second electrode thereof may be connected to a first electrode of the fourth sub-transistor T42. A gate electrode of the fourth sub-transistor T42 may be connected to the k-th scan write line GWLk, a first electrode thereof may be connected to the second electrode of the third sub-transistor T41, and a second electrode thereof may be connected to the gate electrode of the first transistor T1.

The fifth transistor T5 is turned on by the k-th PWM light emitting signal of the k-th PWM light emitting line PWELk to connect the first electrode of the first transistor T1 to the first power line VDL1. A gate electrode of the fifth transistor T5 may be connected to the k-th PWM light emitting line PWELk, a first electrode thereof may be connected to the first power line VDL1, and a second electrode thereof may be connected to the first electrode of the first transistor T1.

A sixth transistor T6 is turned on by the k-th PWM light emitting signal of the k-th PWM light emitting line PWELk to connect the second electrode of the first transistor T1 to the third node N3 of the third pixel driving unit PDU3. A gate electrode of the sixth transistor T6 may be connected to the k-th PWM light emitting line PWELk, a first electrode thereof may be connected to the second electrode of the first transistor T1, and a second electrode thereof may be connected to the node N3 of the third pixel driving unit PDU3.

The seventh transistor T7 may be turned on by a k-th scan control signal of the k-th scan control line GCLk to supply the gate-off voltage VGH of the gate-off voltage line VGHL to a first node N1 connected to the k-th sweep signal line SWPLk. Accordingly, it is possible to prevent a voltage change of the gate electrode of the first transistor T1 from being reflected in the k-th sweep signal of the k-th sweep signal line SWPLk by the first capacitor C1 during a period in which the initialization voltage VINT is applied to the gate electrode of the first transistor T1 and a period in which the PWM data voltage of the j-th PWM data line DLj and a threshold voltage Vth1 of the first transistor T1 are programmed. A gate electrode of the seventh transistor T7 may be connected to the k-th scan control line GCLk, a first electrode thereof may be connected to the gate-off voltage line VGHL, and a second electrode thereof may be connected to the first node N1.

The first capacitor C1 may be disposed between the gate electrode of the first transistor T1 and the first node N1. One electrode of the first capacitor C1 may be connected to the gate electrode of the first transistor T1, and the other electrode thereof may be connected to the first node N1.

The first node N1 may be a contact point between the k-th sweep signal line SWPLk, the second electrode of the seventh transistor T7, and the other electrode of the first capacitor C1.

The second pixel driving unit PDU2 generates a driving current Ids applied to the light emitting element EL according to the first PAM data voltage of the first PAM data line RDL. The second pixel driving unit PDU2 may be a pulse amplitude modulation unit (or PAM unit) that performs pulse amplitude modulation. The second pixel driving unit PDU2 may be a constant current generation unit that generates a constant driving current Ids according to the first PAM data voltage.

In addition, the second pixel driving unit PDU2 of each of the first sub-pixels RP may receive the same first PAM data voltage regardless of luminance of the first sub-pixel RP to generate the same driving current Ids. Similarly, the second pixel driving unit PDU2 of each of the second sub-pixels GP may receive the same second PAM data voltage regardless of luminance of the second sub-pixel GP to generate the same driving current Ids. The third pixel driving unit PDU3 of each of the third sub-pixels BP may receive the same third PAM data voltage regardless of luminance of the third sub-pixel BP to generate the same driving current Ids.

The second pixel driving unit PDU2 may include eighth to fourteenth transistors T8 to T14 and a second capacitor C2.

The eighth transistor T8 controls the driving current Ids flowing to the light emitting element EL according to a voltage applied to a gate electrode thereof. The gate electrode of the eighth transistor T8 may be connected to a second capacitor C2, a first electrode of the eighth transistor T8 may be connected to a second electrode of the ninth transistor T9, and a second electrode of the eighth transistor T8 may be connected to a first electrode of a fifteenth transistor T15.

The ninth transistor T9 is turned on by the k-th scan write signal of the k-th scan write line GWLk to supply the first PAM data voltage of the first PAM data line RDL to a first electrode of the eighth transistor T8. The gate electrode of the ninth transistor T9 may be connected to the k-th scan write line GWLk, a first electrode thereof may be connected to the first PAM data line RDL, and a second electrode thereof may be connected to a first electrode of the eighth transistor T8.

The tenth transistor T10 is turned on by the k-th scan initialization signal of the k-th scan initialization line GILk to connect the initialization voltage line VIL to the gate electrode of the eighth transistor T8. Accordingly, during a period in which the tenth transistor T10 is turned on, the gate electrode of the eighth transistor T8 may be discharged to the initialization voltage VINT of the initialization voltage line VIL. In this case, the gate-on voltage VGL of the k-th scan initialization signal may be different from the initialization voltage VINT of the initialization voltage line VIL. In particular, because a voltage difference between the gate-on voltage VGL and the initialization voltage VINT is greater than a threshold voltage of the tenth transistor T10, the tenth transistor T10 may be stably turned on even after the initialization voltage VINT is applied to the gate electrode of the eighth transistor T8. Therefore, when the tenth transistor T10 is turned on, the initialization voltage VINT may be stably applied to the gate electrode of the eighth transistor T8 regardless of the threshold voltage of the tenth transistor T10.

The tenth transistor T10 may include a plurality of transistors connected in series. For example, the tenth transistor T10 may include a fifth sub-transistor T101 and a sixth sub-transistor T102. Accordingly, it is possible to prevent the voltage of the gate electrode of the eighth transistor T8 from leaking through the tenth transistor T10. A gate electrode of the fifth sub-transistor T101 may be connected to the k-th scan initialization line GILk, a first electrode thereof may be connected to the gate electrode of the eighth transistor T8, and a second electrode thereof may be connected to a first electrode of the sixth sub-transistor T102. A gate electrode of the sixth sub-transistor T102 may be connected to the k-th scan initialization line GILk, a first electrode thereof may be connected to a second electrode of the fifth sub-transistor T101, and a second electrode thereof may be connected to the initialization voltage line VIL.

The eleventh transistor T11 is turned on by the k-th scan write signal of the k-th scan write line GWLk to connect the gate electrode and the second electrode of the eighth transistor T8 to each other. Accordingly, during a period in which the eleventh transistor T11 is turned on, the eighth transistor T8 may operate as a diode (e.g., the eighth transistor T8 may be diode-connected).

The eleventh transistor T11 may include a plurality of transistors connected in series. For example, the eleventh transistor T11 may include a seventh sub-transistor T111 and an eighth sub-transistor T112. Accordingly, it is possible to prevent the voltage of the gate electrode of the eighth transistor T8 from leaking through the eleventh transistor T11. A gate electrode of the seventh sub-transistor T111 may be connected to the k-th scan write line GWLk, a first electrode thereof may be connected to the second electrode of the eighth transistor T8, and a second electrode thereof may be connected to a first electrode of the eighth sub-transistor T112. A gate electrode of the eighth sub-transistor T112 may be connected to the k-th scan write line GWLk, a first electrode thereof may be connected to the second electrode of the seventh sub-transistor T111, and a second electrode thereof may be connected to the gate electrode of the eighth transistor T8.

The twelfth transistor T12 is turned on by the k-th PWM light emitting signal of the k-th PWM light emitting line PWELk to connect the first electrode of the eighth transistor T8 to the second power line VDL2. A gate electrode of the twelfth transistor T12 may be connected to the k-th PWM light emitting line PWELk, a first electrode thereof may be connected to the second power line VDL2, and a second electrode thereof may be connected to the first electrode of the eighth transistor T8.

The thirteenth transistor T13 is turned on by the k-th scan control signal of the k-th scan control line GCLk to connect the first power line VDL1 to the second node N2. A gate electrode of the thirteenth transistor T13 may be connected to the k-th scan control line GCLk, a first electrode thereof may be connected to the first power line VDL1, and a second electrode thereof may be connected to the second node N2.

The fourteenth transistor T14 is turned on by the k-th PWM light emitting signal of the k-th PWM light emitting line PWELk to connect the second power line VDL2 to the second node N2. Accordingly, when the fourteenth transistor T14 is turned on, the second power voltage VDD2 of the second power line VDL2 may be supplied to the second node N2. A gate electrode of the fourteenth transistor T14 may be connected to the k-th PWM light emitting line PWELk, a first electrode thereof may be connected to the second power line VDL2, and a second electrode thereof may be connected to the second node N2.

The second capacitor C2 may be disposed between the gate electrode of the eighth transistor T8 and the second node N2. One electrode of the second capacitor C2 may be connected to the gate electrode of the eighth transistor T8, and the other electrode thereof may be connected to the second node N2.

The second node N2 may be a contact point between the second electrode of the thirteenth transistor T13, the second electrode of the fourteenth transistor T14, and the other electrode of the second capacitor C2.

The third pixel driving unit PDU3 adjusts a period during which the driving current Ids is applied to the light emitting element EL according to the voltage of the third node N3.

The third pixel driving unit PDU3 may include fifteenth to nineteenth transistors T15 to T19 and a third capacitor C3.

The fifteenth transistor T15 is turned on or turned off according to the voltage of the third node N3. When the fifteenth transistor T15 is turned on, the driving current Ids of the eighth transistor T8 may be supplied to the light emitting element EL, and when the fifteenth transistor T15 is turned off, the driving current Ids of the eighth transistor T8 may not be supplied to the light emitting element EL. Therefore, a turn-on period of the fifteenth transistor T15 may be substantially the same as the light emitting period of the light emitting element EL. A gate electrode of the fifteenth transistor T15 may be connected to the third node N3, a first electrode thereof may be connected to the second electrode of the eighth transistor T8, and a second electrode thereof may be connected to a first electrode of a seventeenth transistor T17.

The sixteenth transistor T16 is turned on by the k-th scan control signal of the k-th scan control line GCLk to connect the initialization voltage line VIL to the third node N3. Accordingly, during a period in which the sixteenth transistor T16 is turned on, the third node N3 may be discharged to the initialization voltage of the initialization voltage line VIL.

The sixteenth transistor T16 may include a plurality of transistors connected in series. For example, the sixteenth transistor T16 may include a ninth sub-transistor T161 and a tenth sub-transistor T162. Accordingly, it is possible to prevent the voltage of the third node N3 from leaking through the sixteenth transistor T16. A gate electrode of the ninth sub-transistor T161 may be connected to the k-th scan control line GCLk, a first electrode thereof may be connected to the third node N3, and a second electrode thereof may be connected to a first electrode of the tenth sub-transistor T162. A gate electrode of the tenth sub-transistor T162 may be connected to the k-th scan control line GCLk, a first electrode thereof may be connected to the second electrode of the ninth sub-transistor T161, and a second electrode thereof may be connected to the initialization voltage line VIL.

The seventeenth transistor T17 is turned on by the k-th PAM light emitting signal of the k-th PAM light emitting line PAELk to connect the second electrode of the fifteenth transistor T15 to the first electrode of the light emitting element EL. A gate electrode of the seventeenth transistor T17 may be connected to the k-th PAM light emitting line PAELk, a first electrode thereof may be connected to the second electrode of the fifteenth transistor T15, and a second electrode thereof may be connected to the first electrode of the light emitting element EL.

The eighteenth transistor T18 is turned on by the k-th scan control signal of the k-th scan control line GCLk to connect the initialization voltage line VIL to the first electrode of the light emitting element EL. Accordingly, during a period in which the eighteenth transistor T18 is turned on, the first electrode of the light emitting element EL may be discharged to the initialization voltage of the initialization voltage line VIL. A gate electrode of the eighteenth transistor T18 may be connected to the k-th scan control line GCLk, a first electrode thereof may be connected to the first electrode of the light emitting element EL, and a second electrode thereof may be connected to the initialization voltage line VIL.

The nineteenth transistor T19 is turned on by a test signal of a test signal line TSTL to connect the first electrode of the light emitting element EL to the third power line VSL. A gate electrode of the nineteenth transistor T19 may be connected to the test signal line TSTL, a first electrode thereof may be connected to the first electrode of the light emitting element EL, and a second electrode thereof may be connected to the third power line VSL.

The third capacitor C3 may be disposed between the third node N3 and the initialization voltage line VIL. One electrode of the third capacitor C3 may be connected to the third node N3, and the other electrode thereof may be connected to the initialization voltage line VIL.

The third node N3 may be a contact point between the second electrode of the sixth transistor T6, the gate electrode of the fifteenth transistor T15, the first electrode of the ninth sub-transistor T161, and one electrode of the third capacitor C3.

One of the first electrode and the second electrodes of each of the first to nineteenth transistors T1 to T19 may be a source electrode, and the other thereof may be a drain electrode. An active layer of each of the first to nineteenth transistors T1 to T19 may be formed of any one of polysilicon, amorphous silicon, and oxide semiconductor. When the active layer of each of the first to nineteenth transistors T1 to T19 is formed of polysilicon, the active layer may be formed by a low temperature polysilicon (LTPS) process.

In addition, it is illustrated in FIG. 5 that the first to nineteenth transistors T1 to T19 have been mainly described as being formed as a P-type MOSFET, but embodiments of the present specification are limited thereto. For example, each of the first to nineteenth transistors T1 to T19 may also be formed as an N-type MOSFET.

Alternatively, in order to increase a black expression ability of the light emitting element EL by blocking a leakage current, the first sub-transistor T31 and the second sub-transistor T32 of the third transistor T3, the third sub-transistor T41 and the fourth sub-transistor T42 of the fourth transistor T4, a fifth sub-transistor T101 and a sixth sub-transistor T102 of the tenth transistor T10, and the seventh sub-transistor T111 and the eighth sub-transistor T112 of the eleventh transistor T11 in the first sub-pixel RP may be formed as the N-type MOSFET. In this case, the gate electrode of the third sub-transistor T41 and the gate electrode of the fourth sub-transistor T42 of the fourth transistor T4, and the gate electrode of the seventh sub-transistor T111 and the gate electrode of the eighth sub-transistor T112 of the eleventh transistor T11 may be connected to a k-th scan control signal GCLk. The k-th scan initialization signal GILk and the k-th scan control signal GCLk may have pulses generated by the gate-off voltage VGH. In addition, the active layers of the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be formed of an oxide semiconductor, and the remaining transistors may be formed of polysilicon.

Alternatively, one of the first sub-transistor T31 and the second sub-transistor T32 of the third transistor T3 may be formed as an N-type MOSFET and the other thereof may be formed as a P-type MOSFET. In this case, among the first sub-transistor T31 and the second sub-transistor T32 of the third transistor T3, the transistor formed as the N-type MOSFET may be formed of an oxide semiconductor, and the transistor formed as the P-type MOSFET may be formed of polysilicon.

Alternatively, one of the third sub-transistor T41 and the fourth sub-transistor T42 of the fourth transistor T4 may be formed as an N-type MOSFET and the other thereof may be formed as a P-type MOSFET. In this case, from among the third sub-transistor T41 and the fourth sub-transistor T42 of the fourth transistor T4, the transistor formed as the N-type MOSFET may be formed of an oxide semiconductor, and the transistor formed as the P-type MOSFET may be formed of polysilicon.

Alternatively, one of the fifth sub-transistor T101 and the sixth sub-transistor T102 of the tenth transistor T10 may be formed as an N-type MOSFET and the other thereof may be formed as a P-type MOSFET. In this case, from among the fifth sub-transistor T101 and the sixth sub-transistor T102 of the tenth transistor T10, the transistor formed as the N-type MOSFET may be formed of an oxide semiconductor, and the transistor formed as the P-type MOSFET may be formed of polysilicon.

Alternatively, one of the seventh sub-transistor T111 and the eighth sub-transistor T112 of the eleventh transistor T11 may be formed as an N-type MOSFET and the other thereof may be formed as a P-type MOSFET. In this case, from among the seventh sub-transistor T111 and the eighth sub-transistor T112 of the eleventh transistor T11, the transistor formed as the N-type MOSFET may be formed of an oxide semiconductor, and the transistor formed as the P-type MOSFET may be formed of polysilicon.

In one or more embodiments, the second sub-pixel GP and the third sub-pixel BP according to one or more embodiments may be substantially the same as the first sub-pixel RP described with reference to FIG. 2. Therefore, a description of the second sub-pixel GP and the third sub-pixel BP according to one or more embodiments will be omitted.

Figure 6:
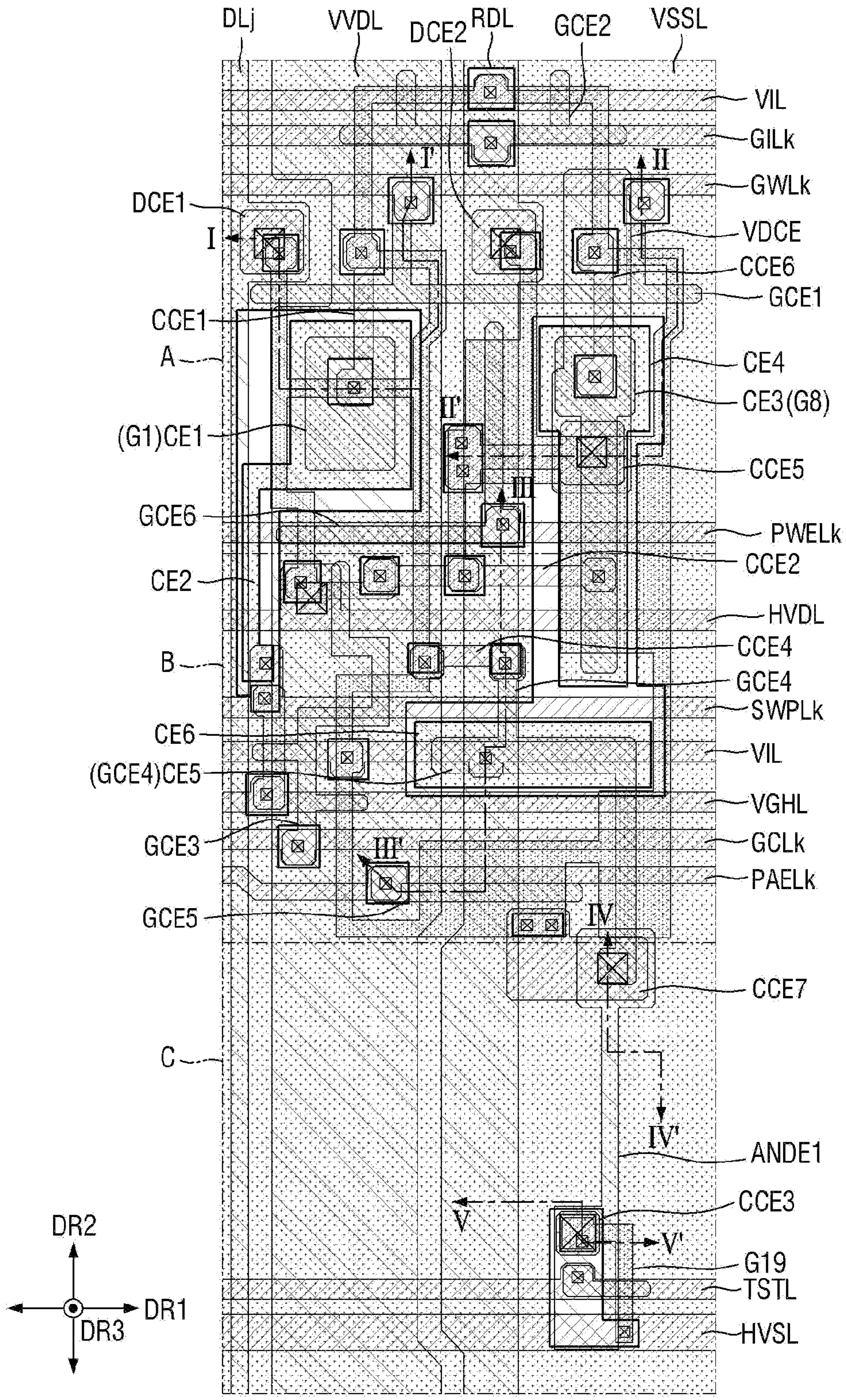
FIG. 6 is a layout view illustrating an active layer, a first gate metal layer, a second gate metal layer, a first source metal layer, and a second source metal layer of the first sub-pixel according to one or more embodiments.
Figure 7:
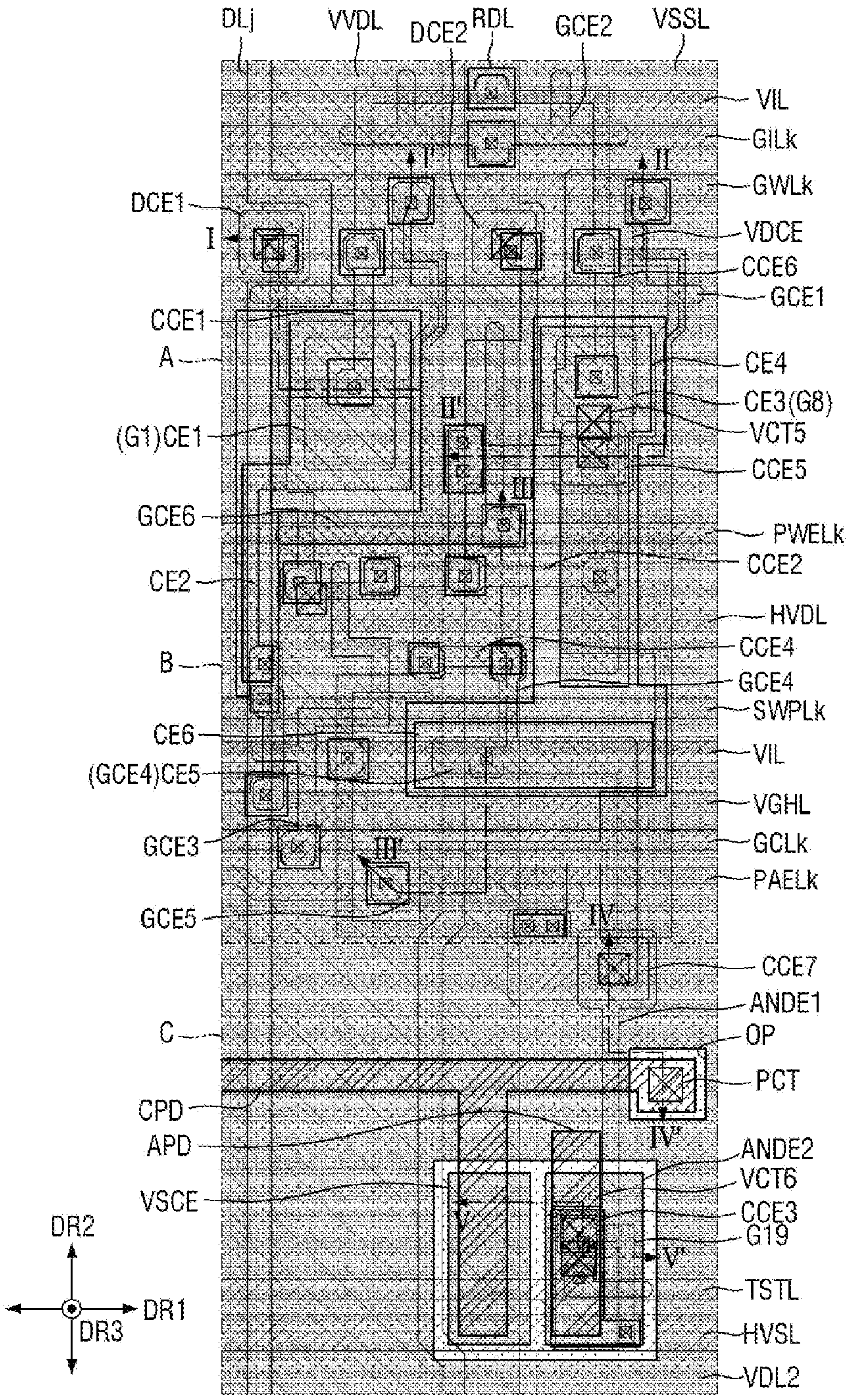
FIG. 7 is a layout view illustrating a third source metal layer and pad electrodes of FIG. 6.
Figure 8:
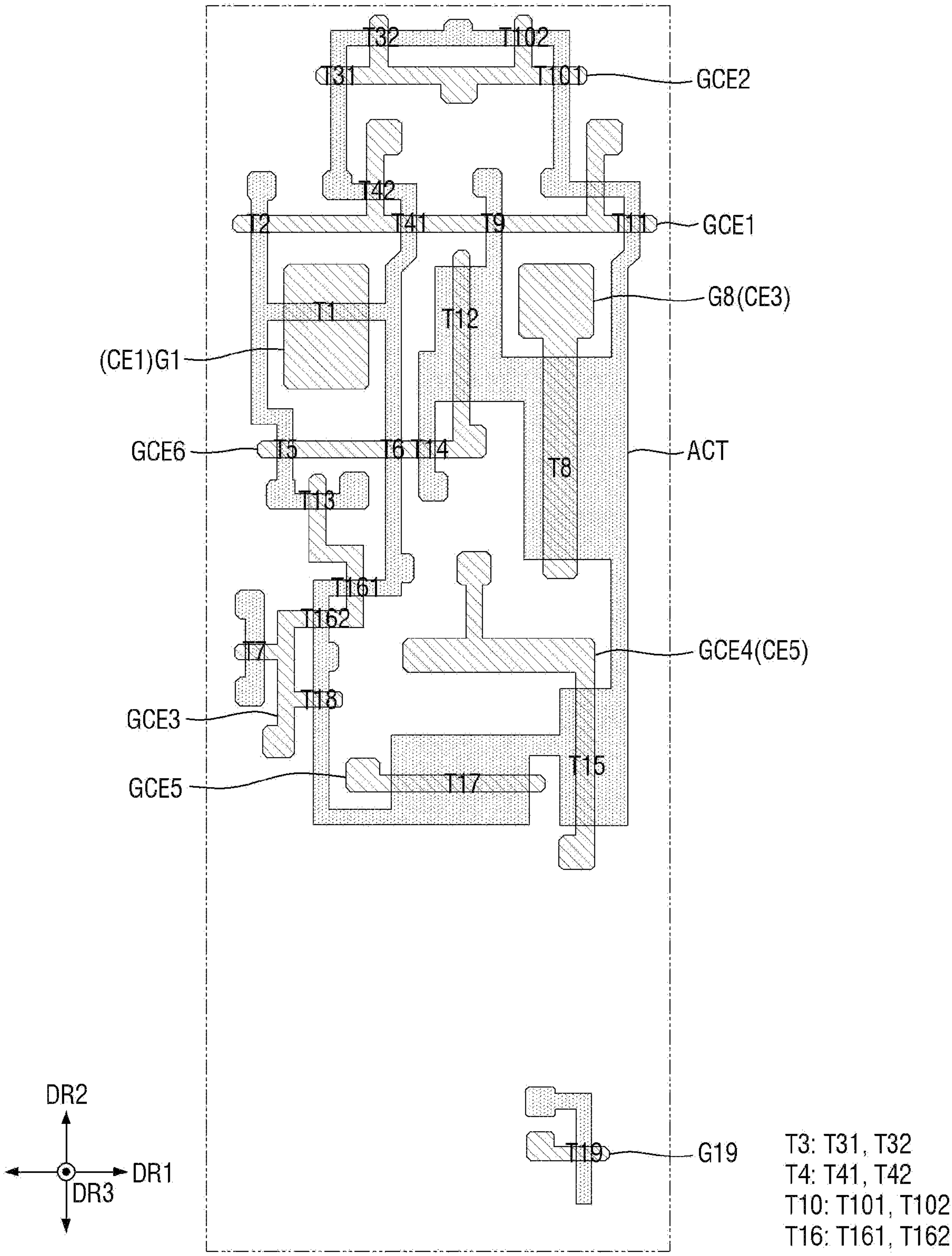
FIG. 8 is a layout view illustrating the active layer and the first gate metal layer of FIG. 6.
Figure 9A:
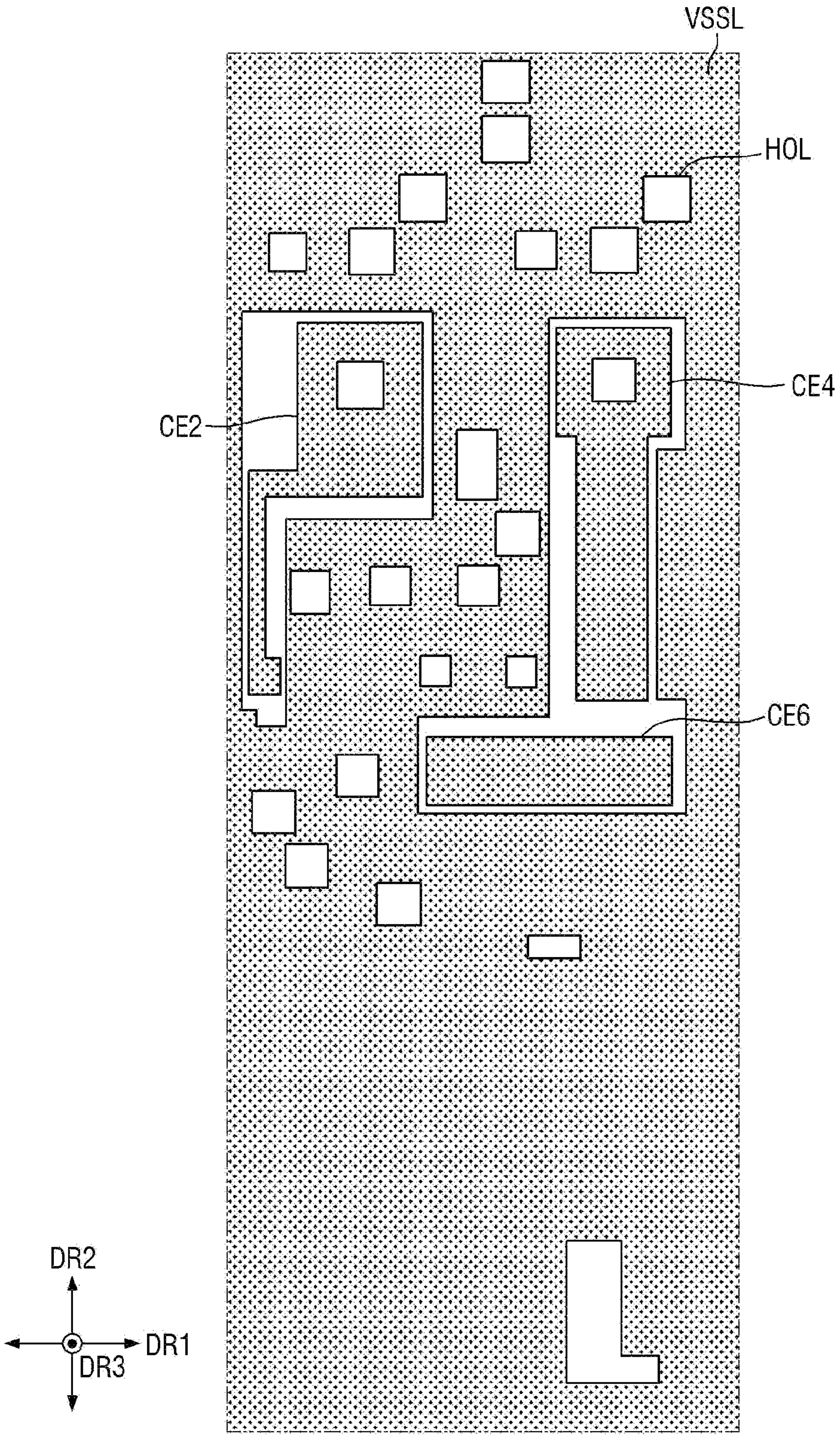
FIG. 9A is a layout view illustrating the second gate metal layer of FIG. 6.
Figure 9B:
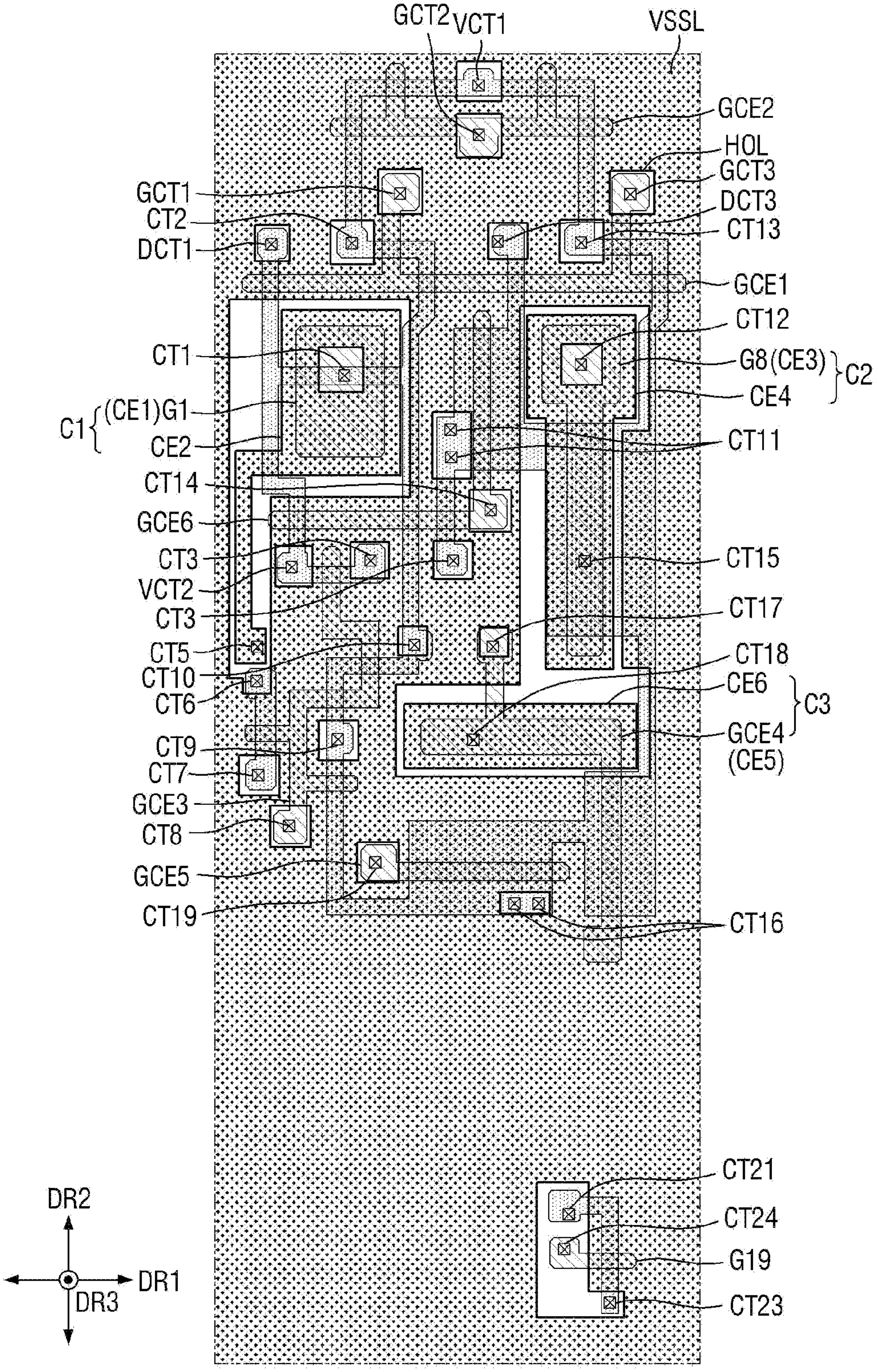
FIG. 9B is a layout view illustrating the active layer, the first gate metal layer, and the second gate metal layer of FIG. 6.
Figure 10:
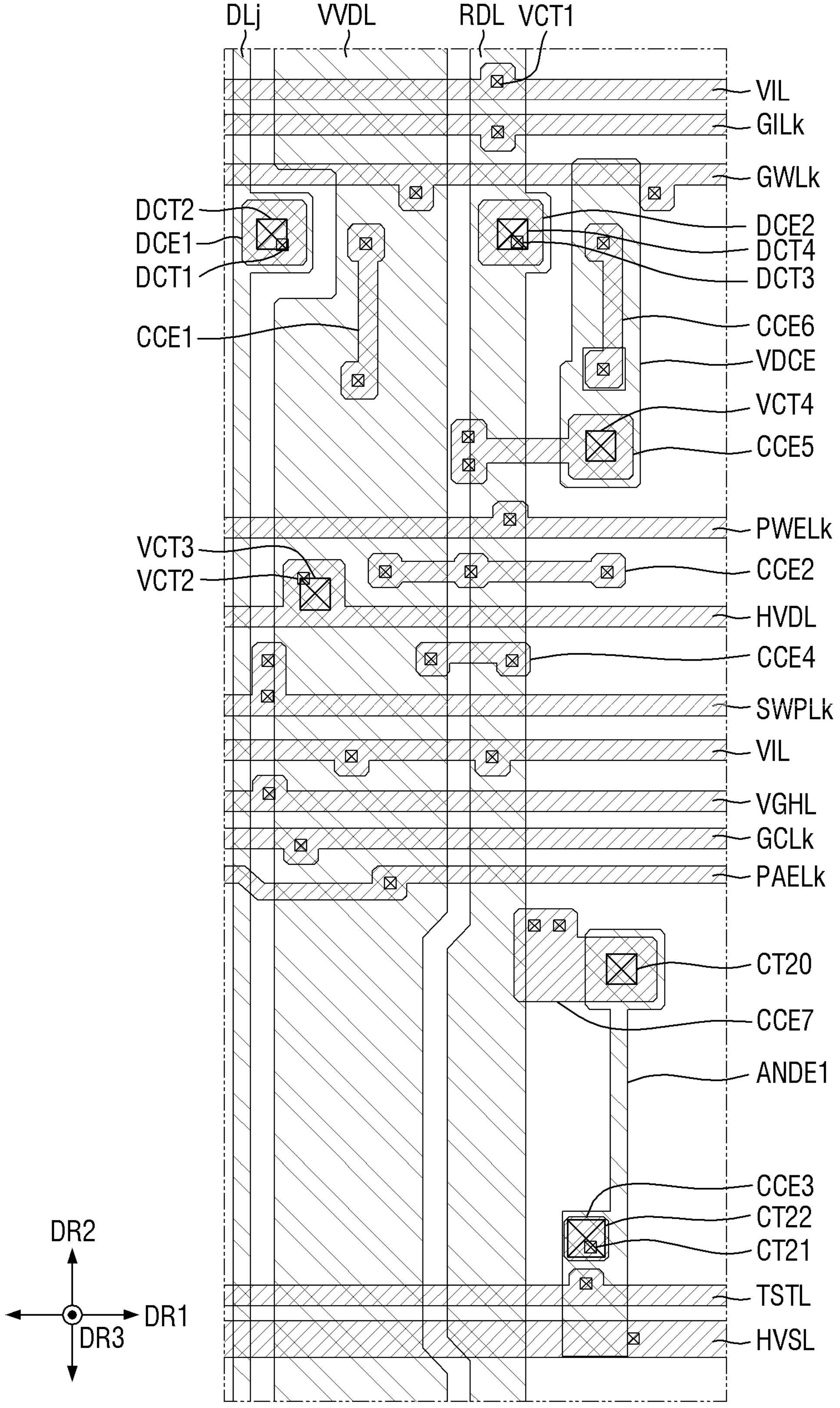
FIG. 10 is a layout view illustrating a first source metal layer and the second source metal layer of FIG. 6.
Figure 11:
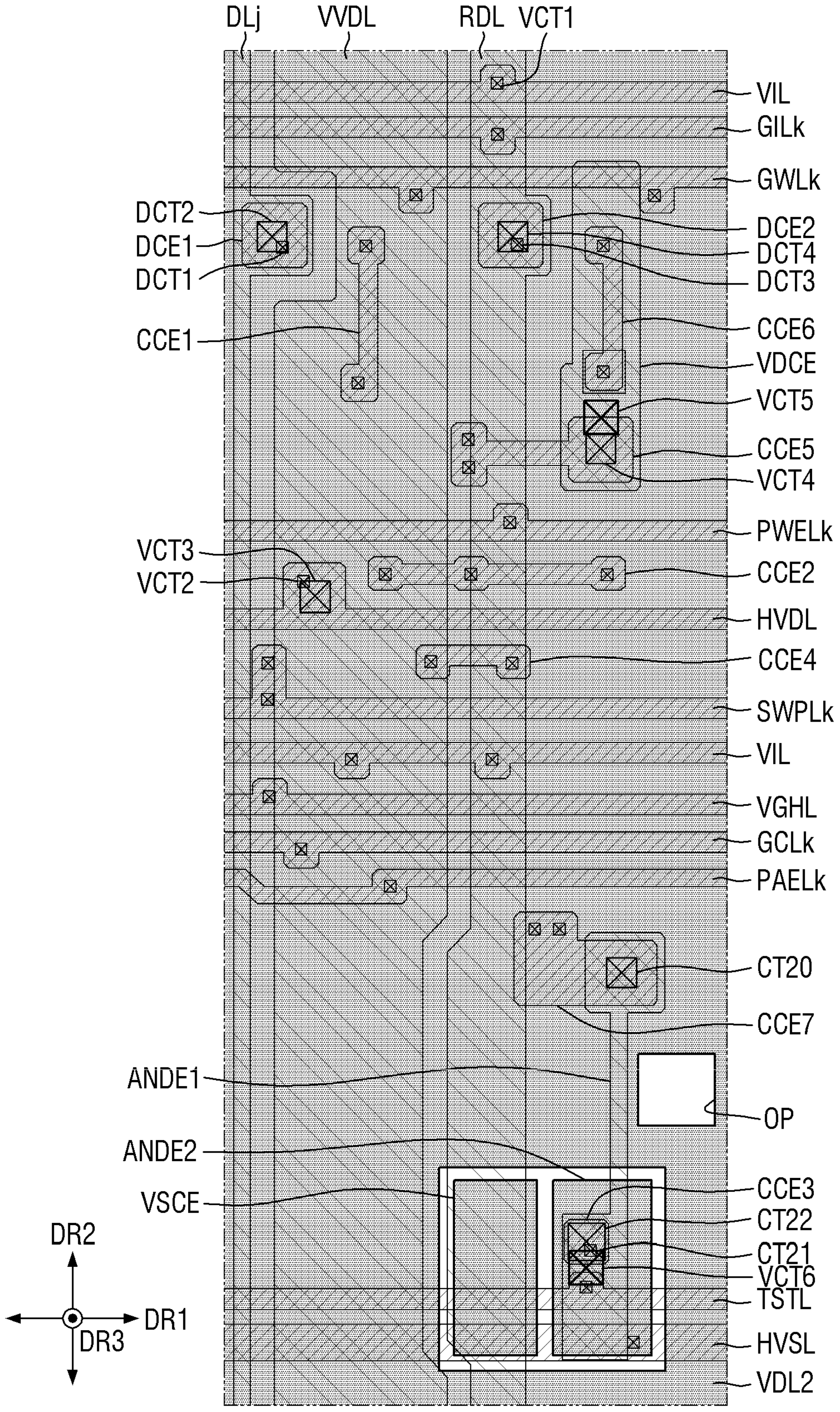
FIG. 11 is a layout view illustrating the first source metal layer, the second source metal layer, and the third source metal layer of FIG. 6.

FIG. 6 is a layout view illustrating an active layer, a first gate metal layer, a second gate metal layer, a first source metal layer, and a second source metal layer of the first sub-pixel according to one or more embodiments. FIG. 7 is a layout view illustrating a third source metal layer and pad electrodes of FIG. 6. FIG. 8 is a layout view illustrating the active layer and the first gate metal layer of FIG. 6. FIG. 9A is a layout view illustrating the second gate metal layer of FIG. 6. FIG. 9B is a layout view illustrating the active layer, the first gate metal layer, and the second gate metal layer of FIG. 6. FIG. 10 is a layout view illustrating a first source metal layer and the second source metal layer of FIG. 6. FIG. 11 is a layout view illustrating the first source metal layer, the second source metal layer, and the third source metal layer of FIG. 6.

Referring to FIGS. 6 to 11, the first sub-pixel RP may include an active layer ACT, a first gate metal layer, a second gate metal layer, a first source metal layer, a second source metal layer, a third source metal layer, an anode pad electrode APD, and a cathode pad electrode CPD.

Referring to FIGS. 6, 8, 9A, and 9B, the active layer ACT may include channels CH1 to CH19, source electrodes S1 to S19, and drain electrodes D1 to D19 of the first to nineteenth transistors T1 to T19. A detailed description of the channel, the source electrode, and the drain electrode of each transistor will be described with reference to FIGS. 12 to 16.

The first gate metal layer disposed on the active layer ACT may include gate electrodes G1 to G19 of the first to nineteenth transistors T1 to T19, a first capacitor electrode CE1, a third capacitor electrode CE3, a fifth capacitor electrode CE5, first to fifth gate connection electrodes GCE1 to GCE5. The first gate electrode G1 of the first transistor T1 may be integrally formed with the first capacitor electrode CE1. The eighth gate electrode G8 of the eighth transistor T8 may be integrally formed with the third capacitor electrode CE3. The fourth gate connection electrode GCE4 may be integrally formed with the fifth capacitor electrode CE5.

The second gate metal layer disposed on the first gate metal layer may include a second capacitor electrode CE2, a fourth capacitor electrode CE4, a sixth capacitor electrode CE6, and a third power line VSSL. The second capacitor electrode CE2 may overlap the first capacitor electrode CE1 in the third direction DR3 to form a first capacitor C1, the fourth capacitor electrode CE4 may overlap the third capacitor electrode CE3 in the third direction DR3 to form a second capacitor C2, and the sixth capacitor electrode CE6 may overlap the fifth capacitor electrode CE5 in the third direction DR3 to form a third capacitor C3. In the present specification, the first capacitor electrode CE1, the third capacitor electrode CE3, and the fifth capacitor electrode CE5 may be referred to as lower capacitor electrodes, and the second capacitor electrode CE2, the fourth capacitor electrode CE4, and the sixth capacitor electrode CE6 may be referred to as upper capacitor electrodes.

The third power line VSSL may be disposed to be spaced from the second capacitor electrode CE2, the fourth capacitor electrode CE4, and the sixth capacitor electrode CE6. The third power line VSSL may be formed as a single plate surrounding the second capacitor electrode CE2, the fourth capacitor electrode CE4, and the sixth capacitor electrode CE6. The third power line VSSL may not overlap the first capacitor electrode CE1, the third capacitor electrode CE3, and the fifth capacitor electrode CE5. The third power line VSSL may overlap the first to third gate connection electrodes GCE1, GCE2, and GCE3 and the fifth and sixth gate connection electrodes GCE5 and GCE6. The third power line VSSL may not overlap the first gate electrode G1 and the eighth gate electrode G8, and may overlap the gate electrodes of the second to seventh transistors T2 to T7 and the gate electrodes of the ninth to nineteenth transistors T9 to T19.

The third power line VSSL may include a plurality of holes HOL exposing a portion of the active layer ACT or a portion of the first gate metal layer. The hole HOL may be an area in which contact holes connecting the active layer ACT and the first source metal layer are positioned or an area in which contact holes connecting the first gate metal layer and the first source metal layer are positioned. For example, the third power line VSSL may include a hole HOL exposing a second source electrode ('S2' in FIG. 12) of the second transistor T2, and a first data connection electrode ('DCE1' in FIG. 12) may be connected to the second source electrode S2 through a first data contact hole DCT1 in the hole HOL. As another example, the third power line VSSL may include a hole HOL exposing the first gate connection electrode GCE1, and the k-th scan write line GWLk may be connected to the first gate connection electrode GCE1 through the first gate contact hole GCT1 in the hole HOL. As illustrated in FIG. 9B, a hole may be formed in each of the areas in which second to eleventh, thirteenth, fourteenth, sixteenth, seventeenth, nineteenth, twenty-first, twenty-third, and twenty-fourth contact holes CT2 to CT11, CT13, CT14, CT16, CT17, CT19, CT21, CT23, and CT24, first and third data contact holes DCT1 and DCT3, first to third gate contact holes GCT1, GCT2, and GCT3, and a second power contact hole VCT2 are positioned. In one or more embodiments, as illustrated in FIG. 9B, a hole may be formed in the area in which a first power contact hole VCT1 is positioned.

In the present specification, the third power line VSSL may be referred to as a low driving voltage line similarly to the third power line VSL of FIG. 5. As will be described later, the third power line VSSL may be connected to a cathode pad electrode ('CPD' in FIG. 20) through a pad contact hole ('PCT' in FIG. 20), and may be applied with a third power voltage ('VSS' in FIG. 4).

Referring to FIGS. 6, 10, and 11, the first source metal layer disposed on the second gate metal layer may include initialization voltage lines VIL, a k-th scan initialization line GILk, a k-th scan write line GWLk, a k-th PWM light emitting line PWELk, a first horizontal power line HVDL, a gate-off voltage line VGHL, a k-th sweep signal line SWPLk, a k-th scan control line GCLk, a k-th PAM light emitting line PAELk, a test signal line TSTL, and a third horizontal power line HVSL that extend in the first direction DR1. The initialization voltage lines VIL, the k-th scan initialization line GILk, the k-th scan write line GWLk, the k-th PWM light emitting line PWELk, the first horizontal power line HVDL, the gate-off voltage line VGHL, the k-th sweep signal line SWPLk, the k-th scan control line GCLk, the k-th PAM light emitting line PAELk, the test signal line TSTL, and the third horizontal power line HVSL may be disposed to be spaced from each other in the second direction DR2. In addition, the first source metal layer may further include first and second data connection electrodes DCE1 and DCE2, and first to seventh connection electrodes CCE1 to CCE7. The first data connection electrode DCE1 may be connected to a j-th data line DLj, and the second data connection electrode DCE2 may be connected to the first PAM data line RDL.

The second source metal layer disposed on the first source metal layer may include the j-th data line DLj, the first vertical power line VVDL, and the first PAM data line RDL that extend in the second direction DR2. In addition, in one or more embodiments, the second PAM data line GDL and the third PAM data line BDL of FIG. 4 may extend in the second direction DR2. The j-th data line DLj, the first vertical power line VVDL, the first PAM data line RDL, the second PAM data line GDL, and the third PAM data line BDL may be disposed to be spaced from each other in the first direction DR1. In addition, the second source metal layer may further include a first anode connection electrode ANDE1 and a second power connection electrode VDCE. The first anode connection electrode ANDE1 may be connected to a p-type semiconductor PSEM of the light emitting element EL through a second anode connection electrode ANDE2 and an anode pad electrode APD (see FIG. 20). The second power connection electrode VDCE may be connected to the second power line VDL2 (see FIG. 18).

Referring to FIGS. 7 and 11, the third source metal layer disposed on the second source metal layer may include the second power line VDL2, a cathode connection electrode VSCE, and the second anode connection electrode ANDE2. The cathode connection electrode VSCE may be connected to the n-type semiconductor NSEM of the light emitting element EL through the cathode pad electrode CPD, and the second anode connection electrode ANDE2 may connect the first anode connection electrode ANDE1 and the anode pad electrode APD (see FIG. 20). In one or more embodiments, the cathode connection electrode VSCE may be omitted.

The second power line VDL2 may be disposed to be spaced from the cathode connection electrode VSCE and the second anode connection electrode ANDE2, and may be formed as a single plate surrounding the cathode connection electrode VSCE and the second anode connection electrode ANDE2. The second power line VDL2 may include an opening OP exposing a portion of the third power line VSSL of the second gate metal layer. The cathode pad electrode CPD may be connected to the third power line VSSL through the pad contact hole PCT in the opening OP (see FIG. 20). The opening OP may overlap the third power line VSSL and may not overlap the electrodes and wirings of the second source metal layer.

In the present specification, the first horizontal power line HVDL and the first vertical power line VVDL may be lines to which the first power voltage ('VDD1' in FIG. 4) is applied, the second power line VDL2 may be a line to which the second power voltage ('VDD2' in FIG. 4) is applied, and the third power line VSSL and the third horizontal power line HVSL may be lines to which the third power voltage ('VSS' in FIG. 4) is applied.

Figure 12:
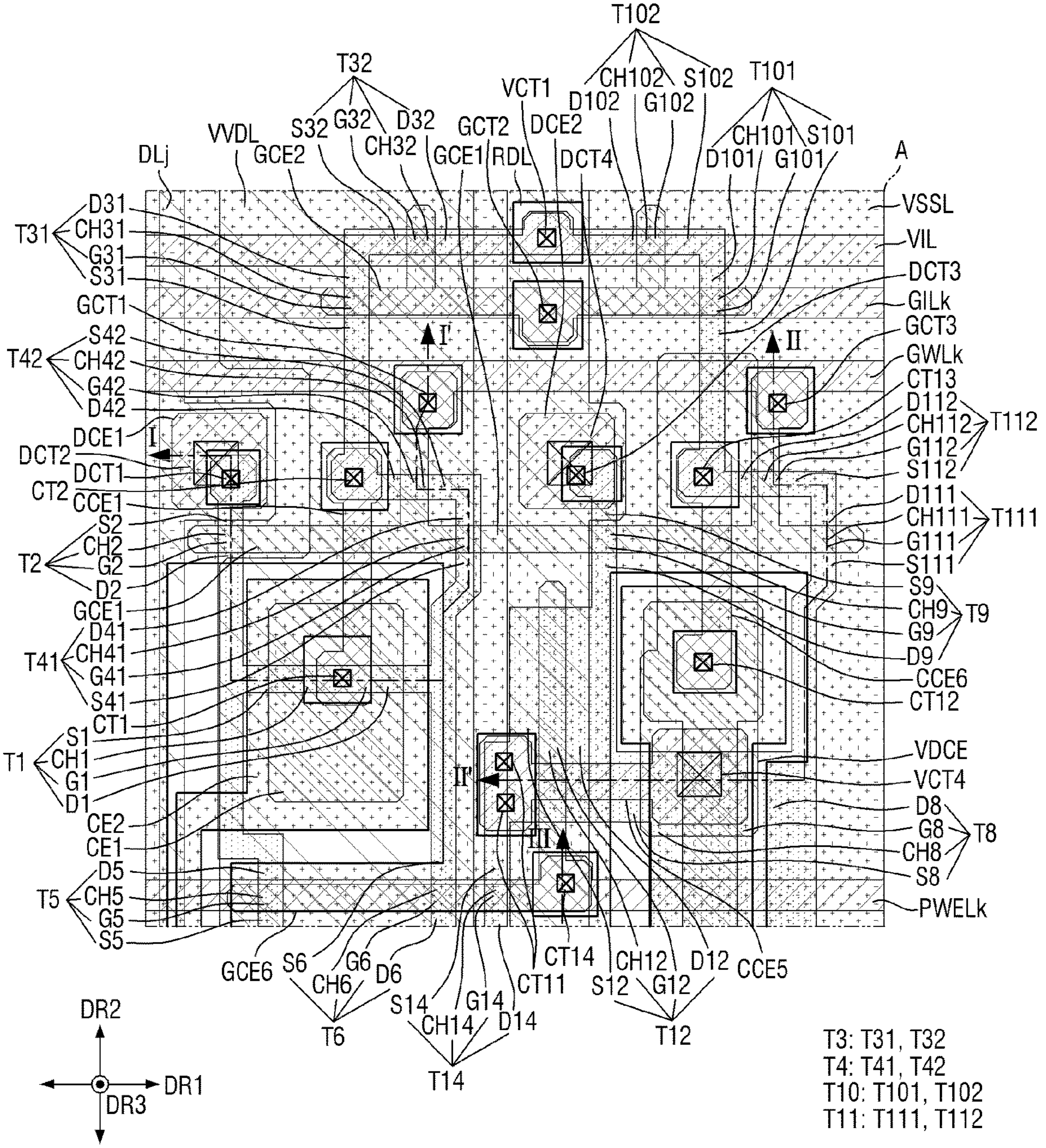
FIGS. 12 and 13 are enlarged layout views illustrating in detail an area A of FIGS. 6 and 7.
Figure 13:
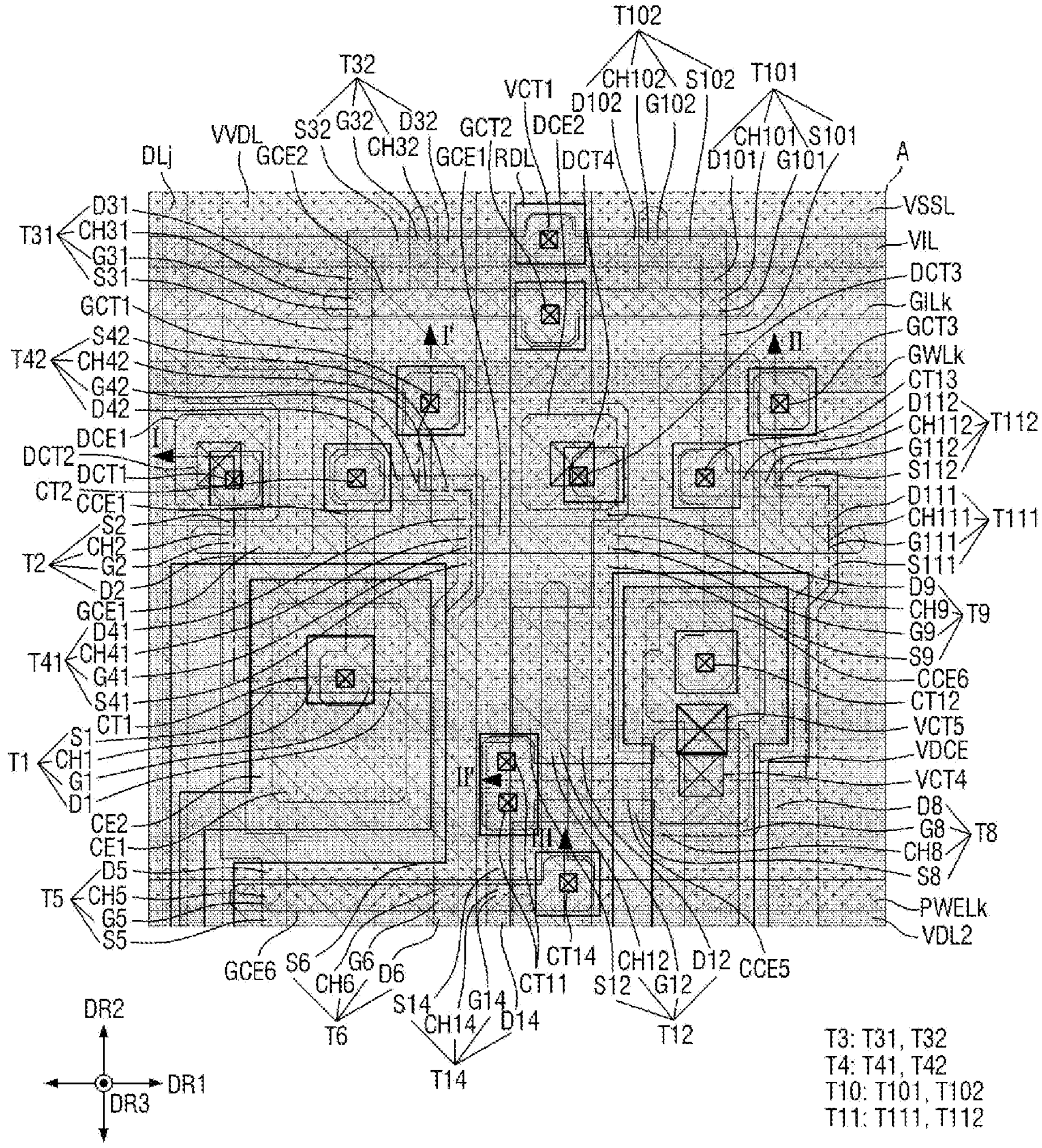
Figure 14:
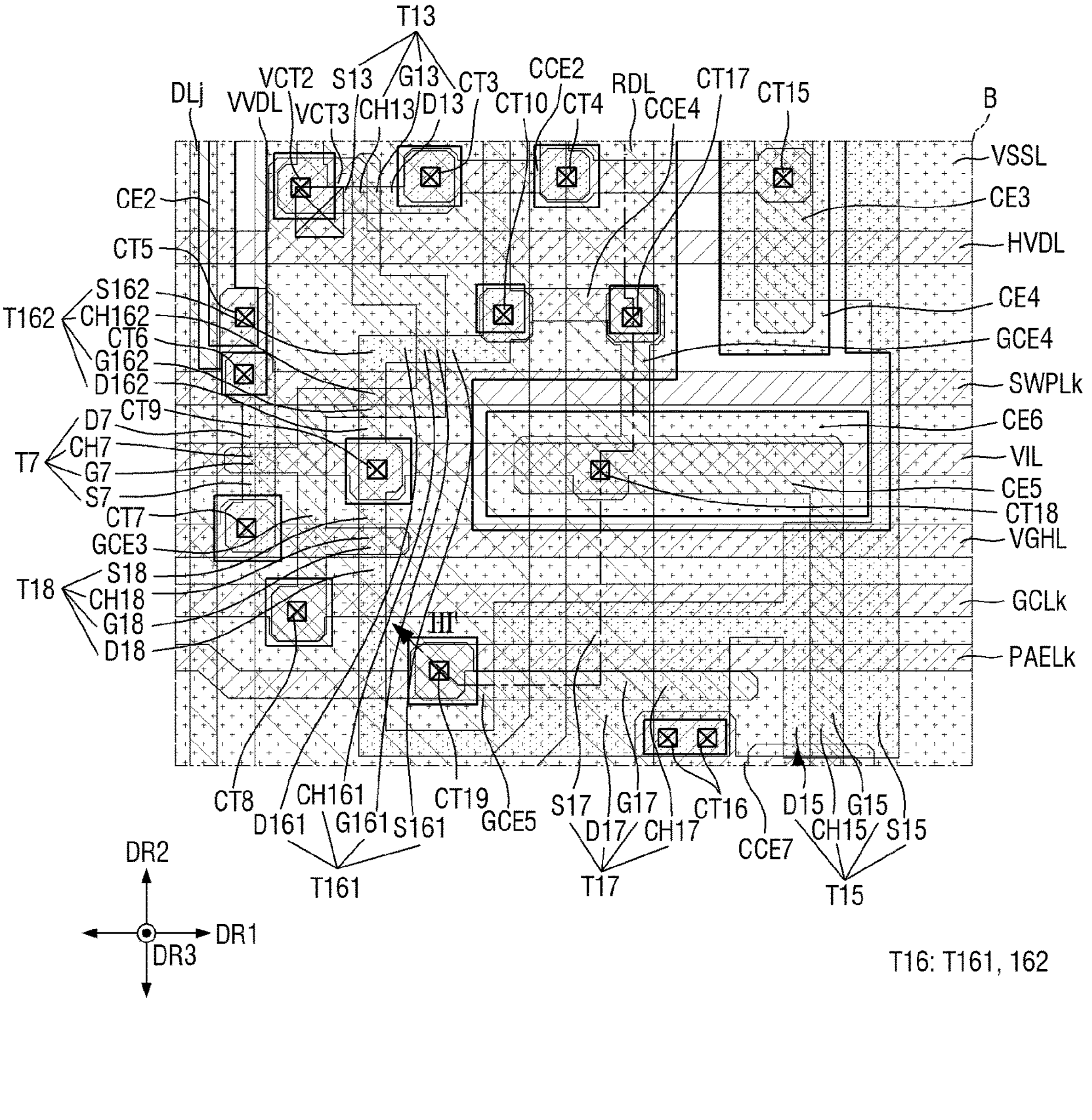
FIG. 14 is an enlarged layout view illustrating in detail an area B of FIG. 6.
Figure 15:
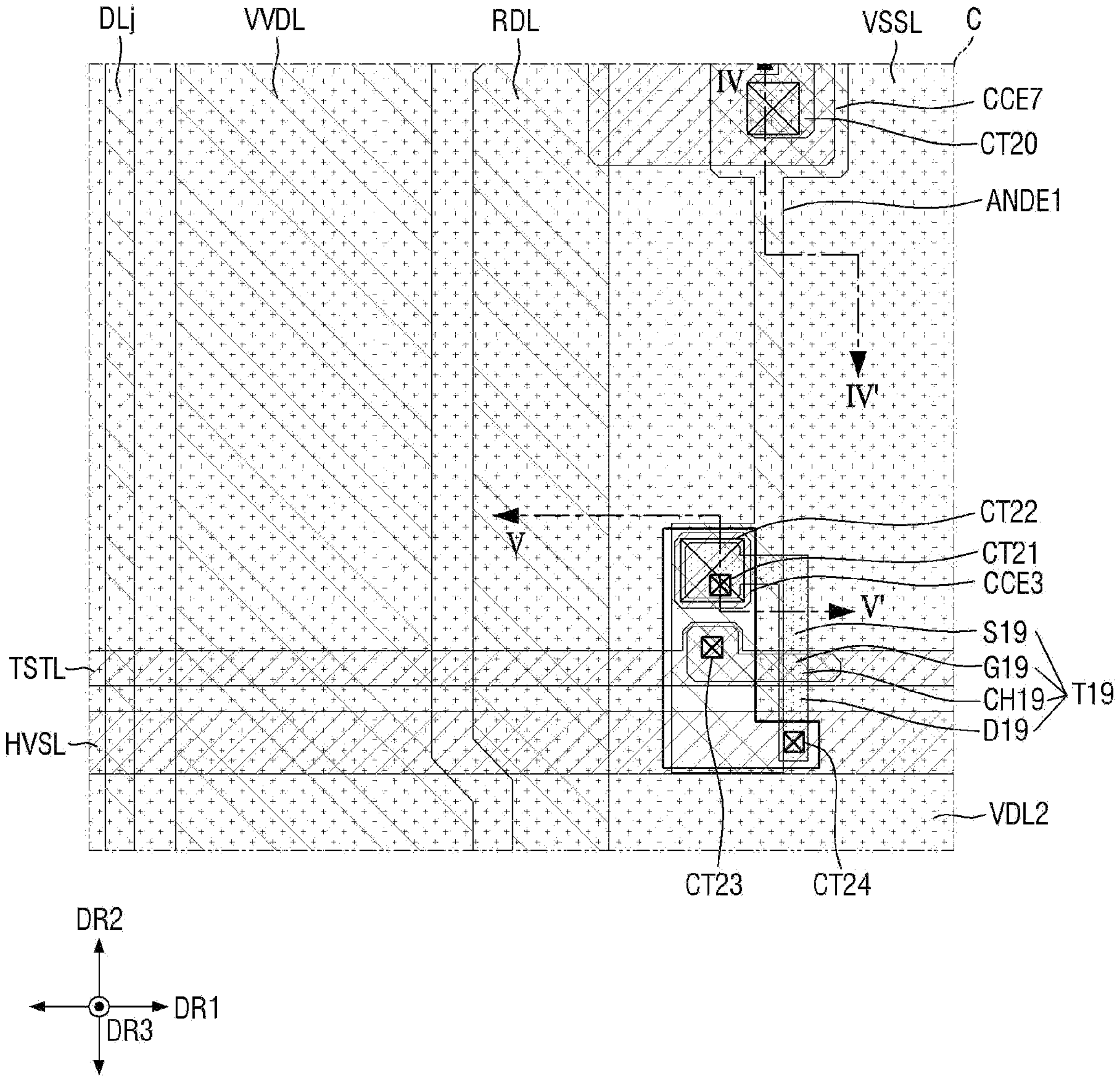
FIGS. 15 and 16 are enlarged layout views illustrating in detail an area C of FIGS. 6 and 7.
Figure 16:
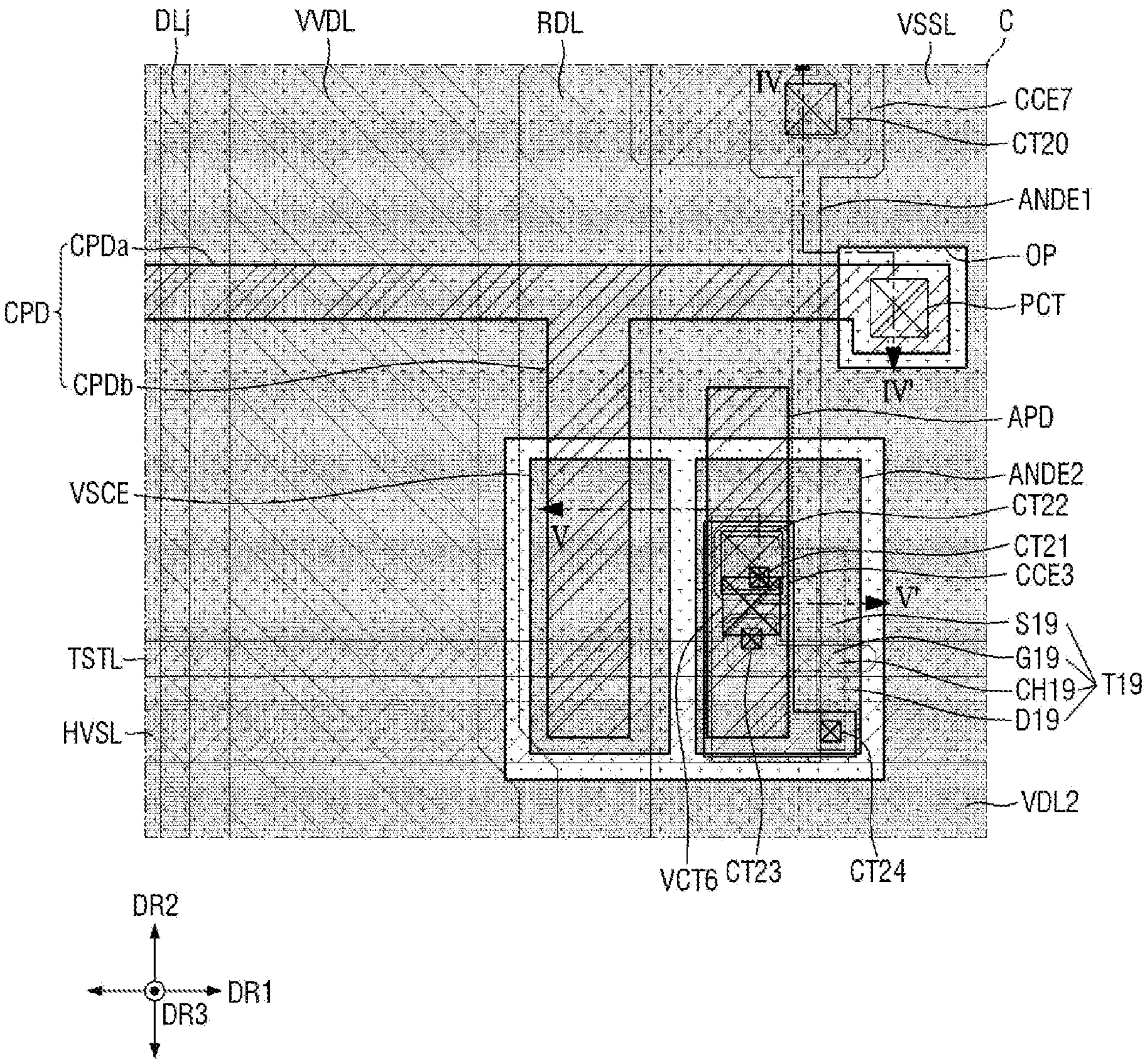

FIGS. 12 and 13 are enlarged layout views illustrating in detail an area A of FIGS. 6 and 7. FIG. 14 is an enlarged layout view illustrating in detail an area B of FIG. 6. FIGS. 15 and 16 are enlarged layout views illustrating in detail an area C of FIGS. 6 and 7.

In FIG. 12, the active layer, the first gate metal layer, the second gate metal layer, the first source metal layer, and the second source metal layer of FIG. 6 are illustrated, and in FIG. 13, the second power line VDL2 of the third source metal layer and a fifth power contact hole VCT5 are further illustrated in addition to FIG. 12. In FIG. 14, the active layer, the first gate metal layer, the second gate metal layer, the first source metal layer, and the second source metal layer of FIG. 6 are illustrated. In FIG. 15, the active layer, the first gate metal layer, the second gate metal layer, the first source metal layer, and the second source metal layer are illustrated, and in FIG. 16, the second power line VDL2 of the third source metal layer, the cathode connection electrode VSCE, the second anode connection electrode ANDE2, and the pad electrodes are further illustrated in addition to FIG. 15.

Referring to FIGS. 12 to 16, the first sub-pixel RP includes the first to nineteenth transistors T1 to T19, the first to sixth capacitor electrodes CE1 to CE6, the first to fifth gate connection electrodes GCE1 to GCE5, the first and second data connection electrodes DCE1 and DCE2, the first to seventh connection electrodes CCE1 to CCE7, the first anode connection electrode ANDE1, the second power connection electrode VDCE, the second anode connection electrode ANDE2, the cathode connection electrode VSCE. The first sub-pixel RP further includes the cathode pad electrode CPD overlapping the cathode connection electrode VSCE, the anode pad electrode APD overlapping the second anode connection electrode ANDE2, and the light emitting element EL.

The first transistor T1 includes a first channel CH1, a first gate electrode G1, a first source electrode S1, and a first drain electrode D1. The first channel CH1 may extend in the first direction DR1. The first channel CH1 may overlap the first gate electrode G1 in the third direction DR3. The first gate electrode G1 may be connected to the first connection electrode CCE1 through a first contact hole CT1. The first gate electrode G1 may be integrally formed with the first capacitor electrode CE1. The first gate electrode G1 may overlap the second capacitor electrode CE2 in the third direction DR3. The first source electrode S1 may be disposed on one side of the first channel CH1, and the first drain electrode D1 may be disposed on the other side of the first channel CH1. The first source electrode S1 may be connected to a second drain electrode D2 and a fifth drain electrode D5. The first drain electrode D1 may be connected to a third sub-source electrode S41 and a sixth source electrode S6. The first source electrode S1 and the first drain electrode D1 may not overlap the first gate electrode G1 in the third direction DR3. The first source electrode S1 and the first drain electrode D1 may overlap the second capacitor electrode CE2 in the third direction DR3.

The second transistor T2 includes a second channel CH2, a second gate electrode G2, a second source electrode S2, and a second drain electrode D2. The second channel CH2 may overlap the second gate electrode G2 in the third direction DR3. The second gate electrode G2 may be integrally formed with the first gate connection electrode GCE1. The second source electrode S2 may be disposed on one side of the second channel CH2, and the second drain electrode D2 may be disposed on the other side of the second channel CH2. The second source electrode S2 may be connected to the first data connection electrode DCE1 through the first data contact hole DCT1. The second drain electrode D2 may be connected to the first source electrode S1. The second source electrode S2 and the second drain electrode D2 may not overlap the second gate electrode G2 in the third direction DR3. The second drain electrode D2 may extend in the second direction DR2. The second drain electrode D2 may be connected to the first source electrode S1.

The first sub-transistor T31 of the third transistor T3 includes a first sub-channel CH31, a first sub-gate electrode G31, a first sub-source electrode S31, and a first sub-drain electrode D31. The first sub-channel CH31 may overlap the first sub-gate electrode G31 in the third direction DR3. The first sub-gate electrode G31 may be integrally formed with the second gate connection electrode GCE2. The first sub-source electrode S31 may be disposed on one side of the first sub-channel CH31, and the first sub-drain electrode D31 may be disposed on the other side of the first sub-channel CH31. The first sub-source electrode S31 may be connected to a fourth sub-drain electrode D42, and the first sub-drain electrode D31 may be connected to a second sub-source electrode S32. The first sub-source electrode S31 and the first sub-drain electrode D31 may not overlap the first sub-gate electrode G31. The first sub-source electrode S31 may overlap the k-th scan write line GWLk in the third direction DR3. The first sub-drain electrode D31 may overlap the initialization voltage line VIL in the third direction DR3.

The second sub-transistor T32 of the third transistor T3 includes a second sub-channel CH32, a second sub-gate electrode G32, a second sub-source electrode S32, and a second sub-drain electrode D32. The second sub-channel CH32 may overlap the second sub-gate electrode G32 in the third direction DR3. The second sub-gate electrode G32 may be integrally formed with the second gate connection electrode GCE2. The second sub-source electrode S32 may be disposed on one side of the second sub-channel CH32, and the second sub-drain electrode D32 may be disposed on the other side of the second sub-channel CH32. The second sub-source electrode S32 may be connected to the first sub-drain electrode D31, and the second sub-drain electrode D32 may be connected to the initialization voltage line VIL through a first power contact hole VCT1. The second sub-source electrode S32 and the second sub-drain electrode D32 may not overlap the second sub-gate electrode G32. The second sub-source electrode S32 and the second sub-drain electrode D32 may overlap the initialization voltage line VIL in the third direction DR3.

The third sub-transistor T41 of the fourth transistor T4 includes a third sub-channel CH41, a third sub-gate electrode G41, a third sub-source electrode S41, and a third sub-drain electrode D41. The third sub-channel CH41 may overlap the third sub-gate electrode G41 in the third direction DR3. The third sub-gate electrode G41 may be integrally formed with the first gate connection electrode GCE1. The third sub-source electrode S41 may be disposed on one side of the third sub-channel CH41, and the third sub-drain electrode D41 may be disposed on the other side of the third sub-channel CH41. The third sub-source electrode S41 may be connected to the first drain electrode D1, and the third sub-drain electrode D41 may be connected to the fourth sub-source electrode S42. The third sub-source electrode S41 and the third sub-drain electrode D41 may not overlap the third sub-gate electrode G41.

The fourth sub-transistor T42 of the fourth transistor T4 includes a fourth sub-channel CH42, a fourth sub-gate electrode G42, a fourth sub-source electrode S42, and a fourth sub-drain electrode D42. The fourth sub-channel CH42 may overlap the fourth sub-gate electrode G42 in the third direction DR3. The fourth sub-gate electrode G42 may be integrally formed with the first gate connection electrode GCE1. The fourth sub-source electrode S42 may be disposed on one side of the fourth sub-channel CH42, and the fourth sub-drain electrode D42 may be disposed on the other side of the fourth sub-channel CH42. The fourth sub-source electrode S42 may be connected to the third sub-drain electrode D41, and the fourth sub-drain electrode D42 may be connected to the first sub-source electrode S31. The fourth sub-source electrode S42 and the fourth sub-drain electrode D42 may not overlap the fourth sub-gate electrode G42.

The fifth transistor T5 includes a fifth channel CH5, a fifth gate electrode G5, a fifth source electrode S5, and a fifth drain electrode D5. The fifth channel CH5 may overlap the fifth gate electrode G5 in the third direction DR3. The fifth gate electrode G5 may be integrally formed with a sixth gate connection electrode GCE6. The fifth source electrode S5 may be disposed on one side of the fifth channel CH5, and the fifth drain electrode D5 may be disposed on the other side of the fifth channel CH5. The fifth source electrode S5 may be connected to the first horizontal power line HVDL through the second power contact hole VCT2. The fifth drain electrode D5 may be connected to the first source electrode S1. The fifth source electrode S5 and the fifth drain electrode D5 may not overlap the fifth gate electrode G5 in the third direction DR3. The fifth drain electrode D5 may overlap an extension portion of the second capacitor electrode CE2 in the third direction DR3.

The sixth transistor T6 includes a sixth channel CH6, a sixth gate electrode G6, a sixth source electrode S6, and a sixth drain electrode D6. The sixth channel CH6 may overlap the sixth gate electrode G6 in the third direction DR3. The sixth gate electrode G6 may be integrally formed with the sixth gate connection electrode GCE6. The sixth source electrode S6 may be disposed on one side of the sixth channel CH6, and the sixth drain electrode D6 may be disposed on the other side of the sixth channel CH6. The sixth source electrode S6 may be connected to the first drain electrode D1. The sixth drain electrode D6 may be connected to the fourth connection electrode CCE4 through a tenth contact hole CT10. The sixth source electrode S6 and the sixth drain electrode D6 may not overlap the sixth gate electrode G6 in the third direction DR3. The sixth drain electrode D6 may overlap the second connection electrode CCE2 and the first horizontal power line HVDL in the third direction DR3.

The seventh transistor T7 includes a seventh channel CH7, a seventh gate electrode G7, a seventh source electrode S7, and a seventh drain electrode D7. The seventh channel CH7 may overlap the seventh gate electrode G7 in the third direction DR3. The seventh gate electrode G7 may be integrally formed with the third gate connection electrode GCE3. The seventh gate electrode G7 may overlap the initialization voltage line VIL in the third direction DR3. The seventh source electrode S7 may be disposed on one side of the seventh channel CH7, and the seventh drain electrode D7 may be disposed on the other side of the seventh channel CH7. The seventh source electrode S7 may be connected to the gate-off voltage line VGHL a seventh contact hole CT7. The seventh drain electrode D7 may be connected to the k-th sweep signal line SWPLk through a sixth contact hole CT6. The seventh source electrode S7 and the seventh drain electrode D7 may not overlap the seventh gate electrode G7 in the third direction DR3.

The eighth transistor T8 includes an eighth channel CH8, an eighth gate electrode G8, an eighth source electrode S8, and an eighth drain electrode D8. The eighth channel CH8 may overlap the eighth gate electrode G8 in the third direction DR3. The eighth gate electrode G8 may extend in the second direction DR2. The eighth gate electrode G8 may be integrally formed with the third capacitor electrode CE3. The eighth source electrode S8 may be disposed on one side of the eighth channel CH8, and the eighth drain electrode D8 may be disposed on the other side of the eighth channel CH8. The eighth source electrode S8 may be connected to a ninth drain electrode D9 and a twelfth drain electrode D12. The eighth drain electrode D8 may be connected to the seventh sub-source electrode S111. The eighth source electrode S8 and the eighth drain electrode D8 may not overlap the eighth gate electrode G8 in the third direction DR3.

The ninth transistor T9 includes a ninth channel CH9, a ninth gate electrode G9, a ninth source electrode S9, and a ninth drain electrode D9. The ninth channel CH9 may overlap the ninth gate electrode G9 in the third direction DR3. The ninth gate electrode G9 may extend in the second direction DR2. The ninth gate electrode G9 may be integrally formed with the first gate connection electrode GCE1. The ninth source electrode S9 may be disposed on one side of the ninth channel CH9, and the ninth drain electrode D9 may be disposed on the other side of the ninth channel CH9. The ninth source electrode S9 may be connected to the second data connection electrode DCE2 through the third data contact hole DCT3. The ninth drain electrode D9 may be connected to the eighth source electrode S8. The ninth source electrode S9 and the ninth drain electrode D9 may not overlap the ninth gate electrode G9 in the third direction DR3.

The fifth sub-transistor T101 of the tenth transistor T10 includes a fifth sub-channel CH101, a fifth sub-gate electrode G101, a fifth sub-source electrode S101, and a fifth sub-drain electrode D101. The fifth sub-channel CH101 may overlap the fifth sub-gate electrode G101 in the third direction DR3. The fifth sub-gate electrode G101 may be integrally formed with the second gate connection electrode GCE2. The fifth sub-source electrode S101 may be disposed on one side of the fifth sub-channel CH101, and the fifth sub-drain electrode D101 may be disposed on the other side of the fifth sub-channel CH101. The fifth sub-source electrode S101 may be connected to the eighth sub-drain electrode D112, and the fifth sub-drain electrode D101 may be connected to the sixth sub-source electrode S102. The fifth sub-source electrode S101 and the fifth sub-drain electrode D101 may not overlap the fifth sub-gate electrode G101. The fifth sub-source electrode S101 may overlap the k-th scan write line GWLk in the third direction DR3. The fifth sub-drain electrode D101 may overlap the initialization voltage line VIL in the third direction DR3.

The sixth sub-transistor T102 of the tenth transistor T10 includes a sixth sub-channel CH102, a sixth sub-gate electrode G102, a sixth sub-source electrode S102, and a sixth sub-drain electrode D102. The sixth sub-channel CH102 may overlap the sixth sub-gate electrode G102 in the third direction DR3. The sixth sub-gate electrode G102 may be integrally formed with the second gate connection electrode GCE2. The sixth sub-source electrode S102 may be disposed on one side of the sixth sub-channel CH102, and the sixth sub-drain electrode D102 may be disposed on the other side of the sixth sub-channel CH102. The sixth sub-source electrode S102 may be connected to the fifth sub-drain electrode D101, and the sixth sub-drain electrode D102 may be connected to the initialization voltage line VIL through the first power contact hole VCT1. The sixth sub-source electrode S102 and the sixth sub-drain electrode D102 may not overlap the sixth sub-gate electrode G102. The sixth sub-source electrode S102 and the sixth sub-drain electrode D102 may overlap the initialization voltage line VIL in the third direction DR3.

The seventh sub-transistor T111 of the eleventh transistor T11 includes a seventh sub-channel CH111, a seventh sub-gate electrode G111, a seventh sub-source electrode S111, and a seventh sub-drain electrode D111. The seventh sub-channel CH111 may overlap the seventh sub-gate electrode G111 in the third direction DR3. The seventh sub-gate electrode G111 may be integrally formed with the first gate connection electrode GCE1. The seventh sub-source electrode S111 may be disposed on one side of the seventh sub-channel CH111, and the seventh sub-drain electrode D111 may be disposed on the other side of the seventh sub-channel CH111. The seventh sub-source electrode S111 may be connected to the eighth drain electrode D8, and the seventh sub-drain electrode D111 may be connected to the eighth sub-source electrode S112. The seventh sub-source electrode S111 and the seventh sub-drain electrode D111 may not overlap the seventh sub-gate electrode G111.

The eighth sub-transistor T112 of the eleventh transistor T11 includes an eighth sub-channel CH112, an eighth sub-gate electrode G112, an eighth sub-source electrode S112, and an eighth sub-drain electrode D112. The eighth sub-channel CH112 may overlap the eighth sub-gate electrode G112 in the third direction DR3. The eighth sub-gate electrode G112 may be integrally formed with the first gate connection electrode GCE1. The eighth sub-source electrode S112 may be disposed on one side of the eighth sub-channel CH112, and the eighth sub-drain electrode D112 may be disposed on the other side of the eighth sub-channel CH112. The eighth sub-source electrode S112 may be connected to the seventh sub-drain electrode D111, and the eighth sub-drain electrode D112 may be connected to the fifth sub-source electrode S101. The eighth sub-source electrode S112 and the eighth sub-drain electrode D112 may not overlap the eighth sub-gate electrode G112.

The twelfth transistor T12 includes a twelfth channel CH12, a twelfth gate electrode G12, a twelfth source electrode S12, and a twelfth drain electrode D12. The twelfth channel CH12 may overlap the twelfth gate electrode G12 in the third direction DR3. The twelfth gate electrode G12 may be integrally formed with the sixth gate connection electrode GCE6. The twelfth source electrode S12 may be disposed on one side of the twelfth channel CH12, and the twelfth drain electrode D12 may be disposed on the other side of the twelfth channel CH12. The twelfth source electrode S12 may be connected to the fifth connection electrode CCE5 through the eleventh contact holes CT11. The twelfth source electrode S12 and the twelfth drain electrode D12 may not overlap the twelfth gate electrode G12 in the third direction DR3.

The thirteenth transistor T13 includes a thirteenth channel CH13, a thirteenth gate electrode G13, a thirteenth source electrode S13, and a thirteenth drain electrode D13. The thirteenth channel CH13 may overlap the thirteenth gate electrode G13 in the third direction DR3. The thirteenth gate electrode G13 may be integrally formed with the third gate connection electrode GCE3. The thirteenth source electrode S13 may be disposed on one side of the thirteenth channel CH13, and the thirteenth drain electrode D13 may be disposed on the other side of the thirteenth channel CH13. The thirteenth source electrode S13 may be connected to the first horizontal power line HVDL through the second power contact hole VCT2. The thirteenth drain electrode D13 may be connected to the second connection electrode CCE2 through the third contact hole CT3. The thirteenth source electrode S13 and the thirteenth drain electrode D13 may not overlap the thirteenth gate electrode G13 in the third direction DR3.

The fourteenth transistor T14 includes a fourteenth channel CH14, a fourteenth gate electrode G14, a fourteenth source electrode S14, and a fourteenth drain electrode D14. The fourteenth channel CH14 may overlap the fourteenth gate electrode G14 in the third direction DR3. The fourteenth gate electrode G14 may be integrally formed with the sixth gate connection electrode GCE6. The fourteenth source electrode S14 may be disposed on one side of the fourteenth channel CH14, and the fourteenth drain electrode D14 may be disposed on the other side of the fourteenth channel CH14. The fourteenth source electrode S14 may be connected to the fifth connection electrode CCE5 through the eleventh contact holes CT11. The fourteenth drain electrode D14 may be connected to the second connection electrode CCE2 through the fourth contact hole CT4. The fourteenth source electrode S14 and the fourteenth drain electrode D14 may not overlap the fourteenth gate electrode G14 in the third direction DR3.

The fifteenth transistor T15 includes a fifteenth channel CH15, a fifteenth gate electrode G15, a fifteenth source electrode S15, and a fifteenth drain electrode D15. The fifteenth channel CH15 may overlap the fifteenth gate electrode G15 in the third direction DR3. The fifteenth gate electrode G15 may be integrally formed with the fifth capacitor electrode CE5. The fifteenth source electrode S15 may be disposed on one side of the fifteenth channel CH15, and the fifteenth drain electrode D15 may be disposed on the other side of the fifteenth channel CH15. The fifteenth source electrode S15 may be connected to the eighth drain electrode D8. The fifteenth drain electrode D15 may be connected to a seventeenth source electrode S17. The fifteenth source electrode S15 and the fifteenth drain electrode D15 may not overlap the fifteenth gate electrode G15 in the third direction DR3.

The ninth sub-transistor T161 of the sixteenth transistor T16 includes a ninth sub-channel CH161, a ninth sub-gate electrode G161, a ninth sub-source electrode S161, and a ninth sub-drain electrode D161. The ninth sub-channel CH161 may overlap the ninth sub-gate electrode G161 in the third direction DR3. The ninth sub-gate electrode G161 may be integrally formed with the third gate connection electrode GCE3. The ninth sub-source electrode S161 may be disposed on one side of the ninth sub-channel CH161, and the ninth sub-drain electrode D161 may be disposed on the other side of the ninth sub-channel CH161. The ninth sub-source electrode S161 may be connected to the fourth connection electrode CCE4 through the tenth contact hole CT10, and the ninth sub-drain electrode D161 may be connected to the tenth sub-source electrode S162. The ninth sub-source electrode S161 and the ninth sub-drain electrode D161 may not overlap the ninth sub-gate electrode G161.

The tenth sub-transistor T162 of the sixteenth transistor T16 includes a tenth sub-channel CH162, a tenth sub-gate electrode G162, a tenth sub-source electrode S162, and a tenth sub-drain electrode D162. The tenth sub-channel CH162 may overlap the tenth sub-gate electrode G162 in the third direction DR3. The tenth sub-gate electrode G162 may be integrally formed with the third gate connection electrode GCE3. The tenth sub-source electrode S162 may be disposed on one side of the tenth sub-channel CH162, and the tenth sub-drain electrode D162 may be disposed on the other side of the tenth sub-channel CH162. The tenth sub-source electrode S162 may be connected to the ninth sub-drain electrode D161, and the tenth sub-drain electrode D162 may be connected to the initialization voltage line VIL through the ninth contact hole CT9. The tenth sub-source electrode S162 and the tenth sub-drain electrode D162 may not overlap the tenth sub-gate electrode G162.

The seventeenth transistor T17 includes a seventeenth channel CH17, a seventeenth gate electrode G17, a seventeenth source electrode S17, and a seventeenth drain electrode D17. The seventeenth channel CH17 may overlap the seventeenth gate electrode G17 in the third direction DR3. The seventeenth gate electrode G17 may be integrally formed with the fifth gate connection electrode GCE5. The seventeenth source electrode S17 may be disposed on one side of the seventeenth channel CH17, and the seventeenth drain electrode D17 may be disposed on the other side of the seventeenth channel CH17. The seventeenth source electrode S17 may be connected to the fifteenth drain electrode D15. The seventeenth drain electrode D17 may be connected to the seventh connection electrode CCE7 through the sixteenth contact holes CT16. The seventeenth source electrode S17 and the seventeenth drain electrode D17 may not overlap the seventeenth gate electrode G17 in the third direction DR3.

The eighteenth transistor T18 includes an eighteenth channel CH18, an eighteenth gate electrode G18, an eighteenth source electrode S18, and an eighteenth drain electrode D18. The eighteenth channel CH18 may overlap the eighteenth gate electrode G18 in the third direction DR3. The eighteenth gate electrode G18 may be integrally formed with the third gate connection electrode GCE3. The eighteenth source electrode S18 may be disposed on one side of the eighteenth channel CH18, and the eighteenth drain electrode D18 may be disposed on the other side of the eighteenth channel CH18. The eighteenth source electrode S18 may be connected to the initialization voltage line VIL through the ninth contact hole CT9. The eighteenth drain electrode D18 may be connected to the seventh connection electrode CCE7 through the sixteenth contact holes CT16. The eighteenth source electrode S18 and the eighteenth drain electrode D18 may not overlap the eighteenth gate electrode G18 in the third direction DR3.

The nineteenth transistor T19 includes a nineteenth channel CH19, a nineteenth gate electrode G19, a nineteenth source electrode S19, and a nineteenth drain electrode D19. The nineteenth channel CH19 may overlap the nineteenth gate electrode G19 in the third direction DR3. The nineteenth source electrode S19 may be connected to the test signal line TSTL through the twenty-third contact hole CT23. The nineteenth source electrode S19 may be disposed on one side of the nineteenth channel CH19, and the nineteenth drain electrode D19 may be disposed on the other side of the nineteenth channel CH19. The nineteenth source electrode S19 may be connected to the third connection electrode CCE3 through the twenty-first contact holes CT21. The nineteenth drain electrode D19 may be connected to the third horizontal power line HVSL through the twenty-fourth contact hole CT24. The nineteenth source electrode S19 and the nineteenth drain electrode D19 may not overlap the nineteenth gate electrode G19 in the third direction DR3.

The first capacitor electrode CE1 may be integrally formed with the first gate electrode G1. The second capacitor electrode CE2 may overlap the first capacitor electrode CE1 in the third direction DR3. The first capacitor electrode CE1 may be one electrode of the first capacitor C1, and the second capacitor electrode CE2 may be the other electrode of the first capacitor C1.

The second capacitor electrode CE2 may include a hole exposing the first gate electrode G1, and the first connection electrode CCE1 may be connected to the first gate electrode G1 through the first contact hole CT1 in the hole.

The second capacitor electrode CE2 may include an extension portion extending in the second direction DR2. The extension portion of the second capacitor electrode CE2 may cross the k-th PWM light emitting line PWELk and the first horizontal power line HVDL. The extension portion of the second capacitor electrode CE2 may be connected to the k-th sweep signal line SWPLk through the fifth contact hole CT5.

The third capacitor electrode CE3 may be integrally formed with the eighth gate electrode G8. The fourth capacitor electrode CE4 may overlap the third capacitor electrode CE3 in the third direction DR3. The third capacitor electrode CE3 may be one electrode of the second capacitor C2, and the fourth capacitor electrode CE4 may be the other electrode of the second capacitor C2.

The fourth capacitor electrode CE4 may include a hole exposing the eighth gate electrode G8, and the sixth connection electrode CCE6 may be connected to the eighth gate electrode G8 through a twelfth contact hole CT12 in the hole.

The fifth capacitor electrode CE5 may be integrally formed with the fourth gate connection electrode GCE4 and the fifteenth gate electrode G15. The sixth capacitor electrode CE6 may overlap the fifth capacitor electrode CE5 in the third direction DR3. The fifth capacitor electrode CE5 may be one electrode of the third capacitor C3, and the sixth capacitor electrode CE6 may be the other electrode of the third capacitor C3. The sixth capacitor electrode CE6 may be connected to the initialization voltage line VIL through the eighteenth contact hole CT18.

The first gate connection electrode GCE1 may be connected to the k-th scan write line GWLk through the first gate contact hole GCT1 and the third gate contact hole GCT3. The second gate connection electrode GCE2 may be connected to the k-th scan initialization line GILk through the second gate contact hole GCT2. The third gate connection electrode GCE3 may be connected to the k-th scan control line GCLk through the eighth contact hole CT8. The fourth gate connection electrode GCE4 may be connected to the fourth connection electrode CCE4 through the seventeenth contact hole CT17. The fifth gate connection electrode GCE5 may be connected to the k-th PAM light emitting line PAELk through the nineteenth contact hole CT19. The sixth gate connection electrode GCE6 may be connected to the k-th PWM light emitting line PWELk through the fourteenth contact hole CT14. The first gate connection electrode GCE1, the second gate connection electrode CCE2, the third gate connection electrode GCE3, the fifth gate connection electrode GCE5, and the sixth gate connection electrode GCE6 may each overlap the third power line VSSL in the third direction DR3.

The first data connection electrode DCE1 may be connected to the second source electrode S2 through the first data contact hole DCT1 and may be connected to the j-th data line DLj through the second data contact hole DCT2. The first data connection electrode DCE1 may connect the second source electrode S2 and the j-th data line DLj to each other.

The second data connection electrode DCE2 may be connected to the ninth source electrode S9 through the third data contact hole DCT3, and may be connected to the first PAM data line RDL through the fourth data contact hole DCT4. The second data connection electrode DCE2 may connect the ninth source electrode S9 and the first PAM data line RDL to each other.

The first connection electrode CCE1 may extend in the second direction DR2. The first connection electrode CCE1 may be connected to the first gate electrode G1 through the first contact hole CT1, and may be connected to the first sub-source electrode S31 and the fourth sub-drain electrode D42 through the second contact hole CT2.

The second connection electrode CCE2 may extend in the first direction DR1. The second connection electrode CCE2 may be connected to the thirteenth drain electrode D13 through the third contact hole CT3, may be connected to the fourteenth drain electrode D14 through the fourth contact hole CT4, and may be connected to the fourth capacitor electrode CE4 through a fifteenth contact hole CT15.

The third connection electrode CCE3 may be connected to the nineteenth source electrode S19 through the twenty-first contact hole CT21, and may be connected to the first anode connection electrode ANDE1 through the twenty-second contact hole CT22.

The fourth connection electrode CCE4 may extend in the first direction DR1. The fourth connection electrode CCE4 may be connected to the sixth drain electrode D6 and the ninth sub-source electrode S161 through the tenth contact hole CT10, and may be connected to the fourth gate connection electrode CCE4 through the seventeenth contact hole CT17.

The fifth connection electrode CCE5 may extend in the first direction DR1. The fifth connection electrode CCE5 may be connected to the twelfth source electrode S12 and the fourteenth source electrode S14 through the eleventh contact holes CT11, and may be connected to the second power connection electrode VDCE through a fourth power contact hole VCT4.

The sixth connection electrode CCE6 may extend in the second direction DR2. The sixth connection electrode CCE6 may be connected to the third capacitor electrode CE3 through the twelfth contact hole CT12, and may be connected to the fifth sub-source electrode S101 and the eighth sub-drain electrode D112 through the thirteenth contact hole CT13.

The seventh connection electrode CCE7 may be connected to the seventeenth drain electrode D17 and the eighteenth drain electrode D18 through the sixteenth contact holes CT16. The seventh connection electrode CCE7 may be connected to the first anode connection electrode ANDE1 through a twentieth contact hole CT20.

The first anode connection electrode ANDE1 may extend in the second direction DR2. The first anode connection electrode ANDE1 may be connected to the seventh connection electrode CCE7 through the twentieth contact hole CT20, and may be connected to the third connection electrode CCE3 through the twenty-second contact hole CT22. The first anode connection electrode ANDE1 may be connected to the second anode connection electrode ANDE2 through a sixth power contact hole VCT6.

The second power connection electrode VDCE may extend in the second direction DR2. The second power connection electrode VDCE is connected to the fifth connection electrode CCE5 through the fourth power contact hole VCT4, and may be connected to the second power line VDL2 through the fifth power contact hole VCT5.

The second anode connection electrode ANDE2 may extend in the second direction DR2. The second anode connection electrode ANDE2 may be connected to the first anode connection electrode ANDE1 through the sixth power contact hole VCT6. The second anode connection electrode ANDE2 may overlap the anode pad electrode APD.

The cathode connection electrode VSCE may extend in the second direction DR2 and may be adjacent to the second anode connection electrode ANDE2. The cathode connection electrode VSCE may overlap the cathode pad electrode CPD. A size of the cathode connection electrode VSCE may be smaller or larger than a size of the second anode connection electrode ANDE2. Here, the 'size' may be a length or an area in the second direction DR2.

The anode pad electrode APD may extend in the second direction DR2 and may overlap the second anode connection electrode ANDE2 in the third direction DR3. The anode pad electrode APD may be in contact with the second anode connection electrode ANDE2.

The cathode pad electrode CPD may include a stem portion CPDa extending in the first direction DR1 and a branch portion CPDb branching from the stem portion CPDa and extending in the second direction DR2. The stem portion CPDa of the cathode pad electrode CPD may be connected to the third power line VSSL through the pad contact hole PCT. A portion of the stem portion CPDa and the pad contact hole PCT may be disposed in the opening OP of the third power line VSSL. The branch portion CPDb may overlap the cathode connection electrode VSCE in the third direction DR3. As another example, when the cathode connection electrode VSCE is omitted, the branch portion CPDb may be in contact with a second planarization layer ('180' of FIG. 21).

The anode pad electrode APD and the branch portion CPDb of the cathode pad electrode CPD may be adjacent to each other in the first direction DR1. For example, the anode pad electrode APD may be disposed on the left side of the branch portion CPDb. The anode pad electrode APD is not limited thereto, and may also be disposed on the right side of the branch portion CPDb. A length of the anode pad electrode APD in the second direction DR2 may be shorter than a length of the branch portion CPDb of the cathode pad electrode CPD in the second direction DR2.

The anode pad electrode APD may be connected to the first electrode of the light emitting element EL, and the cathode pad electrode CPD may be connected to the second electrode of the light emitting element EL.

In one or more embodiments, the cathode pad electrode CPD may extend in the first direction DR1 to be disposed not only in the first sub-pixel RP, but also in the second sub-pixel GP and the third sub-pixel BP adjacent to the first sub-pixel RP in the first direction DR1. The stem portion CPDa of the cathode pad electrode CPD may extend in the first direction DR1 across the plurality of sub-pixels RP, GP, and BP, and each of the plurality of branch portions CPDb branched from the stem portion CPDa may be disposed in each of the plurality of sub-pixels RP, GP, and BP.

Figure 17:
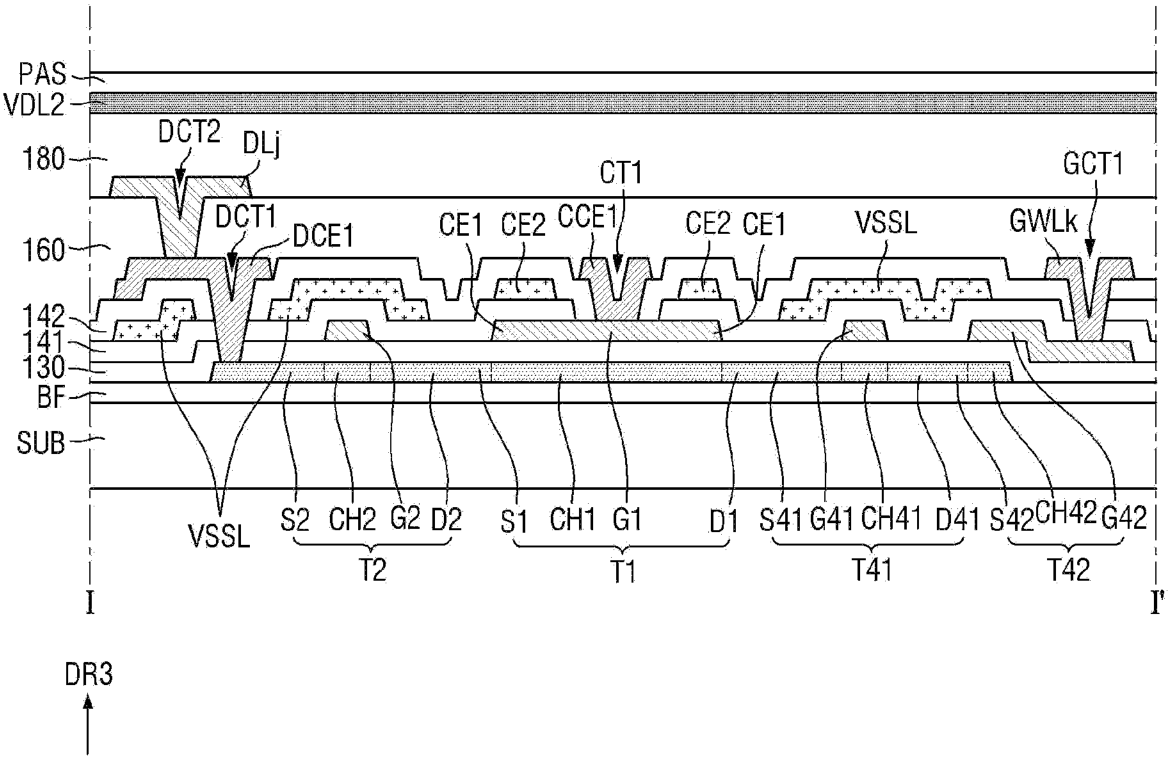
FIG. 17 is a cross-sectional view taken along the line I-I' of FIGS. 6 and 7.
Figure 18:
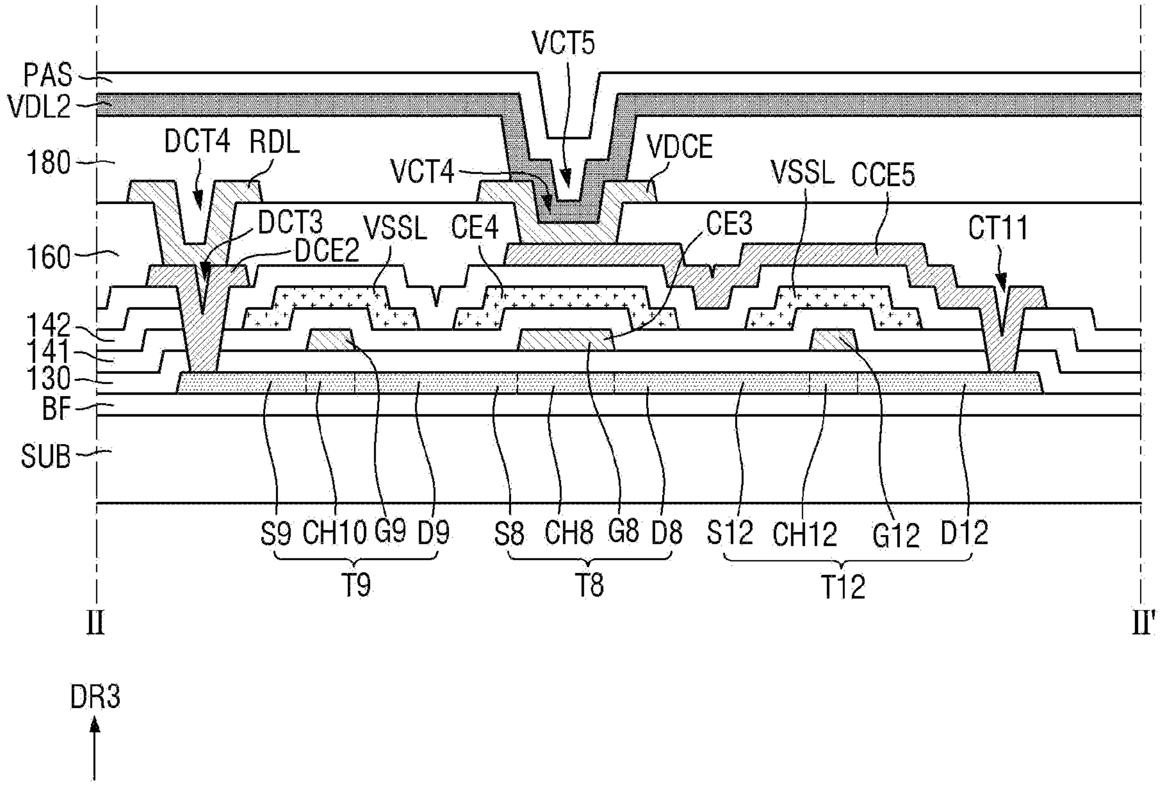
FIG. 18 is a cross-sectional view taken along the line II-II' of FIGS. 6 and 7.
Figure 19:
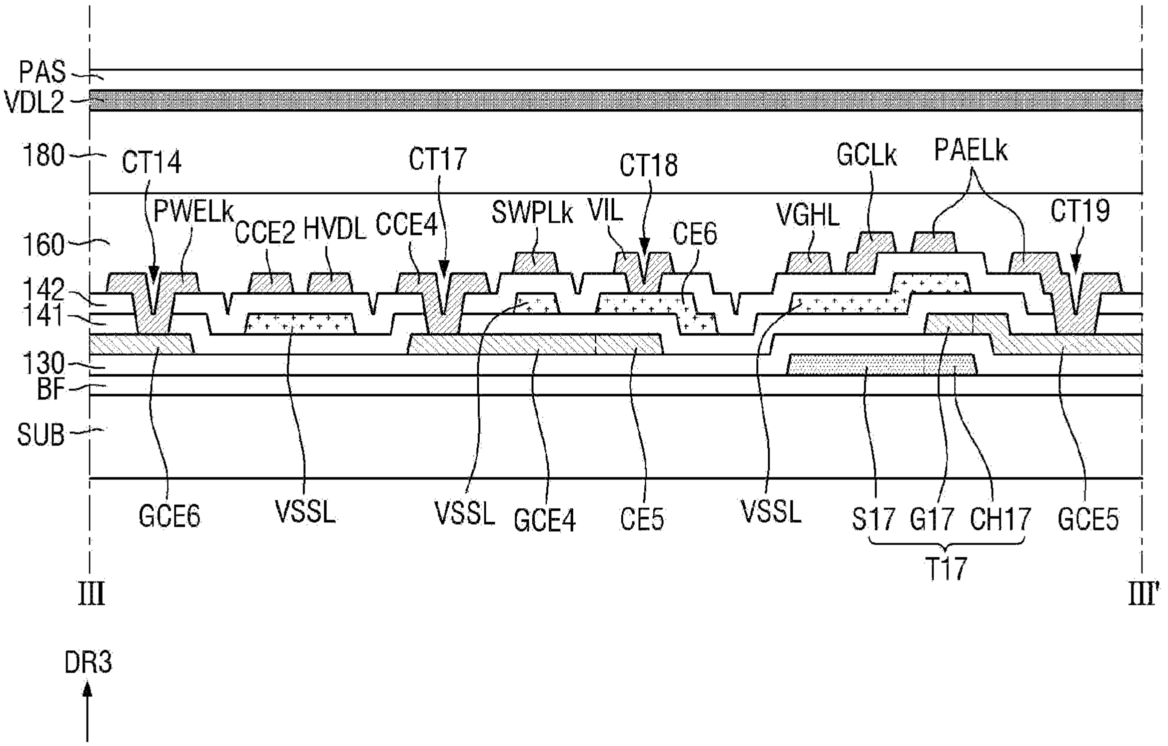
FIG. 19 is a cross-sectional view taken along the line III-III' of FIGS. 6 and 7.

FIG. 17 is a cross-sectional view taken along the line I-I' of FIGS. 6 and 7. FIG. 18 is a cross-sectional view taken along the line II-II' of FIGS. 6 and 7. FIG. 19 is a cross-sectional view taken along the line III-III' of FIGS. 6 and 7. FIG. 20 is a cross-sectional view taken along the lines IV-IV' and V-V' of FIGS. 6 and 7.

Referring to FIGS. 17 to 20, a buffer layer BF may be disposed on a substrate SUB. The substrate SUB may be made of an insulating material such as glass or a polymer resin. For example, when the substrate SUB is made of a polymer resin, the substrate SUB may include polyimide. The substrate SUB may be a flexible substrate that may be bent, folded, rolled, or the like.

The buffer layer BF is a layer for protecting transistors of a thin film transistor layer TFTL and an active layer of the light emitting element EL from moisture permeating through the substrate SUB, which is vulnerable to moisture permeation. The buffer layer BF may be formed of a plurality of inorganic layers that are alternately stacked. For example, the buffer layer BF may be formed of multiple layers in which one or more inorganic layers of a silicon nitride layer, a silicon oxynitride layer, a silicon oxide layer, a titanium oxide layer, and an aluminum oxide layer are alternately stacked.

An active layer may be disposed on the buffer layer BF. The active layer includes the first to nineteenth channels CH1 to CH19, the first to nineteenth source electrodes S1 to S19, and the first to nineteenth drain electrodes D1 to D19 of the first to nineteenth transistors T1 to T19. The active layer may include polycrystalline silicon, single crystal silicon, low-temperature polycrystalline silicon, amorphous silicon, or an oxide semiconductor. The first to nineteenth source electrodes S1 to S19 and the first to nineteenth drain electrodes D1 to D19 may be areas having conductivity by doping a silicon semiconductor or an oxide semiconductor with ions or impurities. In one or more embodiments, a light blocking layer may be omitted between the buffer layer BF and the active layer. In other words, the buffer layer BF may be in direct contact with the first to nineteenth channels CH1 to CH19, the first to nineteenth source electrodes S1 to S19, and the first to nineteenth drain electrodes D1 to D19 of the active layer.

The first to nineteenth channels CH1 to CH19 may respectively overlap the first to nineteenth gate electrodes G1 to G19 in the third direction DR3. The first to nineteenth source electrodes S1 to S19 and the first to nineteenth drain electrodes D1 to D19 may not overlap the first to nineteenth gate electrodes G1 to G19 in the third direction DR3.

A gate insulating layer 130 may be disposed on the active layer. The gate insulating layer 130 may be formed of an inorganic layer, for example, a silicon nitride layer, a silicon oxynitride layer, a silicon oxide layer, a titanium oxide layer, or an aluminum oxide layer. The gate insulating layer 130 may be referred to as a first insulating layer.

A first gate metal layer may be disposed on the gate insulating layer 130. For example, the first gate metal layer may include the second gate electrode G2, the first gate electrode G1, the third sub-gate electrode G41, the fourth sub-gate electrode G42, and the first capacitor electrode CE1 in FIG. 17, may include the ninth gate electrode G9, the eighth gate electrode G8, the twelfth gate electrode G12, and the third capacitor electrode CE3 in FIG. 18, and may include the seventeenth gate electrode G17, the fifth capacitor electrode CE5, and the fourth to sixth gate connection electrodes GCE4, GCE5, and GCE6 in FIG. 19. The gate metal layer may be formed of a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first interlayer insulating layer 141 may be disposed on the first gate metal layer. The first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may be referred to as a second insulating layer.

A second gate metal layer may be disposed on the first interlayer insulating layer 141. For example, the second gate metal layer may include the second capacitor electrode CE2 (see FIG. 17), the fourth capacitor electrode CE4 (see FIG. 18), the sixth capacitor electrode CE6 (see FIG. 19), and the third power line VSSL (see FIGS. 17 to 20). The second gate metal layer may be formed of a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The second capacitor electrode CE2 may overlap the first capacitor electrode CE1 in the third direction DR3, the fourth capacitor electrode CE4 may overlap the third capacitor electrode CE3 in the third direction DR3, and the sixth capacitor electrode CE6 may overlap the fifth capacitor electrode CE5 in the third direction DR3. Because the first interlayer insulating layer 141 has a suitable dielectric constant (e.g., a predetermined dielectric constant), the first capacitor C1 may be formed by the first capacitor electrode CE1, the second capacitor electrode CE2, and the first interlayer insulating layer 141 disposed between the first capacitor electrode CE1 and the second capacitor electrode CE2. In addition, the second capacitor C2 may be formed by the third capacitor electrode CE3, the fourth capacitor electrode CE4, and the first interlayer insulating layer 141 disposed between the third capacitor electrode CE3 and the fourth capacitor electrode CE4. The third capacitor C3 may be formed by the fifth capacitor electrode CE5, the sixth capacitor electrode CE6, and the first interlayer insulating layer 141 disposed between the fifth capacitor electrode CE5 and the sixth capacitor electrode CE6.

In the drawings, the third power line VSSL may overlap the second gate electrode G2, the third sub-gate electrode G41, the fourth sub-gate electrode G42, the ninth gate electrode G9, the twelfth gate electrode G12, and the seventeenth gate electrode G17. In one or more embodiments, the third power line VSSL may overlap the second to seventh gate electrodes G2 to G7 and the ninth to nineteenth gate electrodes G9 to G19. The third power line VSSL may not overlap the first gate electrode G1 and the eighth gate electrode G8.

A first source metal layer may be disposed on a second interlayer insulating layer 142. The first source metal layer may include the initialization voltage lines VIL, the k-th scan initialization line GILk, the k-th scan write line GWLk, the k-th PWM light emitting line PWELk, the first horizontal power line HVDL, the gate-off voltage line VGHL, the k-th sweep signal line SWPLk, the k-th scan control line GCLk, the k-th PAM light emitting line PAELk, the test signal line TSTL, and the third horizontal power line HVSL. In addition, the first source metal layer may include the first and second data connection electrodes DCE1 and DCE2, and the first to seventh connection electrodes CCE1 to CCE7. The first source metal layer may be formed of a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The k-th scan write line GWLk may be connected to the fourth sub-gate electrode G42 and the first gate connection electrode GCE1 through the first gate contact hole GCT1 and the third gate contact hole GCT3 penetrating through the first interlayer insulating layer 141 and the second interlayer insulating layer 142 (see FIG. 17). The first gate contact hole GCT1 may be disposed in the hole ('HOL' in FIG. 9B) of the third power line VSSL.

The k-th scan initialization line GILk may be connected to the second gate connection electrode GCE2 through the second gate contact hole GCT2 penetrating through the first interlayer insulating layer 141 and the second interlayer insulating layer 142. The second gate contact hole GCT2 may be disposed in the hole HOL of the third power line VSSL.

The k-th scan control line GCLk may be connected to the third gate connection electrode GCE3 through the eighth contact hole CT8 penetrating through the first interlayer insulating layer 141 and the second interlayer insulating layer 142. The eighth contact hole CT8 may be disposed in the hole HOL of the third power line VSSL.

The k-th PAM light emitting line PAELk may be connected to the fifth gate connection electrode GCE5 through the nineteenth contact hole CT19 penetrating through the first interlayer insulating layer 141 and the second interlayer insulating layer 142 (see FIG. 19). The nineteenth contact hole CT19 may be disposed in the hole HOL of the third power line VSSL.

The k-th PWM light emitting line PWELk may be connected to the sixth gate connection electrode GCE6 through the fourteenth contact hole CT14 penetrating through the first interlayer insulating layer 141 and the second interlayer insulating layer 142 (see FIG. 19). The fourteenth contact hole CT14 may be disposed in the hole HOL of the third power line VSSL.

The initialization voltage line VIL may be connected to the second sub-drain electrode D32 and the sixth sub-drain electrode D102 through the first power contact hole VCT1 penetrating through the gate insulating layer 130, the first interlayer insulating layer 141, and the second interlayer insulating layer 142. The first power contact hole VCT1 may be disposed in the hole HOL of the third power line VSSL.

In addition, the initialization voltage line VIL may be connected to the tenth sub-drain electrode D162 and the eighteenth source electrode S18 through the ninth contact hole CT9 penetrating through the gate insulating layer 130, the first interlayer insulating layer 141, and the second interlayer insulating layer 142. The ninth contact hole CT9 may be disposed in the hole HOL of the third power line VSSL. The initialization voltage line VIL may be connected to the sixth capacitor electrode CE6 through the eighteenth contact hole CT18 penetrating through the second interlayer insulating layer 142 (see FIG. 19).

The first horizontal power line HVDL may be connected to the fifth source electrode S5 and the thirteenth source electrode S13 through the second power contact hole VCT2 penetrating through the gate insulating layer 130, the first interlayer insulating layer 141, and the second interlayer insulating layer 142. The second power contact hole VCT2 may be disposed in the hole HOL of the third power line VSSL.

The gate-off voltage line VGHL may be connected to the seventh source electrode S7 through the seventh contact hole CT7 penetrating through the gate insulating layer 130, the first interlayer insulating layer 141, and the second interlayer insulating layer 142. The seventh contact hole CT7 may be disposed in the hole HOL of the third power line VSSL.

The test signal line TSTL may be connected to the nineteenth gate electrode G19 through the twenty-third contact hole CT23 penetrating through the first interlayer insulating layer 141 and the second interlayer insulating layer 142. The third horizontal power line HVSL may be connected to the nineteenth drain electrode D19 through the twenty-fourth contact hole CT24 penetrating through the gate insulating layer 130, the first interlayer insulating layer 141, and the second interlayer insulating layer 142. The twenty-third contact hole CT23 and the twenty-fourth contact hole CT24 may be disposed in the hole HOL of the third power line VSSL.

In FIG. 17, the first data connection electrode DCE1 may be connected to the second source electrode S2 through the first data contact hole DCT1 penetrating through the gate insulating layer 130, the first interlayer insulating layer 141, and the second interlayer insulating layer 142. The first data contact hole DCT1 may be disposed in the hole HOL of the third power line VSSL. The first connection electrode CCE1 may be connected to the first gate electrode G1 through the first contact hole CT1 penetrating through the first interlayer insulating layer 141 and the second interlayer insulating layer 142. The k-th scan write line GWLk may be connected to the fourth sub-gate electrode G42 through the first gate contact hole GCT1 penetrating through the first interlayer insulating layer 141 and the second interlayer insulating layer 142. The first gate contact hole GCT1 may be disposed in the hole HOL of the third power line VSSL.

In FIG. 18, the second data connection electrode DCE2 may be connected to the ninth source electrode S9 through the third data contact hole DCT3 penetrating through the gate insulating layer 130, the first interlayer insulating layer 141, and the second interlayer insulating layer 142. The third data contact hole DCT3 may be disposed in the hole HOL of the third power line VSSL. The fifth connection electrode CCE5 may be connected to the twelfth drain electrode D12 through the eleventh contact hole CT11 penetrating through the first interlayer insulating layer 141 and the second interlayer insulating layer 142. The eleventh contact hole CT11 may be disposed in the hole HOL of the third power line VSSL.

In FIG. 19, the fourteenth contact hole CT14, the seventeenth contact hole CT17, the eighteenth contact hole CT18, and the nineteenth contact hole CT19 are illustrated, and the description thereof has been provided above and thus is omitted.

In FIG. 20, the third connection electrode CCE3 may be connected to the nineteenth source electrode S19 through the twenty-first contact hole CT21 penetrating through the gate insulating layer 130, the first interlayer insulating layer 141, and the second interlayer insulating layer 142. The twenty-first contact hole CT21 may be disposed in the hole HOL of the third power line VSSL.

A first planarization layer 160 may be disposed on the first source metal layer. The first planarization layer 160 may be formed of an organic layer made of an acryl resin, an epoxy resin, a phenolic resin, a polyamide resin, a polyimide resin, or the like. The first planarization layer 160 may be referred to as a fourth insulating layer.

The second source metal layer may be disposed on the first planarization layer 160. The second source metal layer may include the j-th data line DLj, the first vertical power line VVDL, and the first PAM data line RDL. In addition, the second source metal layer may include the first anode connection electrode ANDE1 and the second power connection electrode VDCE. The second source metal layer may be formed of a single layer or multiple layers made of any one of molybdenum (Mo), aluminum (Al), chromium (Cr), gold (Au), titanium (Ti), nickel (Ni), neodymium (Nd), and copper (Cu), or alloys thereof.

Referring to FIG. 17, the j-th data line DLj may be connected to the first data connection electrode DCE1 through the second data contact hole DCT2 penetrating through the first planarization layer 160. The j-th data line DLj may be connected to the second source electrode S2 through the first data connection electrode DCE1.

Referring to FIG. 18, the first PAM data line RDL may be connected to the second data connection electrode DCE2 through the fourth data contact hole DCT4 penetrating through the first planarization layer 160. The first PAM data line RDL may be connected to the ninth source electrode S9 through the second data connection electrode DCE2.

The first vertical power line VVDL may be connected to the first horizontal power line HVDL through the third power contact hole VCT3 penetrating through the first planarization layer 160. The third power contact hole VCT3 may overlap the second power contact hole VCT2 in the third direction DR3 (see FIG. 14).

Referring to FIGS. 16 and 20, the first anode connection electrode ANDE1 may be connected to the seventh connection electrode CCE7 through the twentieth contact hole CT20 penetrating through the first planarization layer 160, and may be connected to the third connection electrode CCE3 through the twenty-second contact hole CT22 penetrating through the first planarization layer 160. The first anode connection electrode ANDE1 may be connected to the seventeenth drain electrode D17 and the eighteenth drain electrode D18 through the seventh connection electrode CCE7, and may be connected to the nineteenth source electrode S19 through the third connection electrode CCE3.

Referring to FIG. 18, the second power connection electrode VDCE may be connected to the fifth connection electrode CCE5 through the fourth power contact hole VCT4 penetrating through the first planarization layer 160. The second power connection electrode VDCE may be connected to the twelfth source electrode S12 through the fifth connection electrode CCE5.

A second planarization layer 180 may be disposed on the second source metal layer. The second planarization layer 180 may be formed of an organic layer made of an acryl resin, an epoxy resin, a phenolic resin, a polyamide resin, a polyimide resin, or the like. The second planarization layer 180 may be referred to as a fifth insulating layer.

The third source metal layer may be disposed on the second planarization layer 180. The third source metal layer may include a second power line VDL2, a second anode connection electrode ANDE2, and a cathode connection electrode VSCE. The third source metal layer may be formed of a single layer or multiple layers made of any one of molybdenum (Mo), aluminum (Al), chromium (Cr), gold (Au), titanium (Ti), nickel (Ni), neodymium (Nd), and copper (Cu), or alloys thereof.

Referring to FIG. 18, the second power line VDL2 may be connected to the second power connection electrode VDCE through the fifth power contact hole VCT5 penetrating through the second planarization layer 180. Accordingly, the second power voltage ('VDD2' in FIG. 4) of the second power line VDL2 may be applied to the twelfth source electrode S12 of the twelfth transistor T12 through the second power connection electrode VDCE and the fifth connection electrode CCE5.

Referring to FIG. 20, the second anode connection electrode ANDE2 may be connected to the first anode connection electrode ANDE1 through the sixth power contact hole VCT6 penetrating through the second planarization layer 180. The second anode connection electrode ANDE2 may overlap the anode pad electrode APD in the third direction DR3 and may be in direct contact therewith. Accordingly, the driving current Ids of the eighth transistor T8 flowing through the seventeenth drain electrode D17, the seventh connection electrode CCE7, the first anode connection electrode ANDE1, and the second anode connection electrode ANDE2 may be transmitted to the p-type semiconductor PSEM through a first contact electrode CTE1 of the light emitting element EL.

Referring to FIG. 20, the cathode connection electrode VSCE may be disposed on the second planarization layer 180. The cathode connection electrode VSCE may overlap the cathode pad electrode CPD in the third direction DR3 and may be in direct contact therewith.

Pad electrodes may be disposed on the third source metal layer. The pad electrodes may include the anode pad electrode APD and the cathode pad electrode CPD. The pad electrodes may be formed of a transparent metal layer. For example, the pad electrodes may be formed of a transparent conductive material (TCO), such as ITO or IZO, that may transmit light.

The anode pad electrode APD may be disposed on the second anode connection electrode ANDE2.

The cathode pad electrode CPD may be disposed on the cathode connection electrode VSCE. The cathode pad electrode CPD may be connected to the third power line VSSL through the pad contact hole PCT penetrating through the second interlayer insulating layer 142, the first planarization layer 160, and the second planarization layer 180. In one or more embodiments, the pad contact hole PCT may be disposed in the opening OP of the second power line VDL2. The pad contact hole PCT may not overlap the second power line VDL2. In FIG. 16, the pad contact hole PCT and the opening OP are illustrated as being positioned at a right edge of the first sub-pixel RP, but the present disclosure is not limited thereto. The pad contact hole PCT and the opening OP may be appropriately formed in an empty space in which the first source metal layer and the second source metal layer of the first sub-pixel RP are not disposed. In one or more embodiments, during the manufacturing process, the pad contact hole PCT may be formed through a general etching process. The etching process may include a dry etching method or a wet etching method. As another example, the pad contact hole PCT may be formed through a laser drilling process. An area of the pad contact hole PCT may be reduced or minimized through the laser drilling process. For example, the pad contact hole PCT may have the area of 18 μm×18 μm or more.

In one or more embodiments, the cathode pad electrode CPD and the third power line VSSL are illustrated as being directly connected to each other, but the present disclosure is not limited thereto. In one or more embodiments, the cathode pad electrode CPD and the third power line VSSL may also be indirectly connected to each other through a plurality of connection electrodes. For example, the cathode pad electrode CPD may be connected to the third power line VSSL through the connection electrode of the third source metal layer, the connection electrode of the second source metal layer, and the connection electrode of the first source metal layer. In this case, because the pad contact hole PCT is formed to penetrate through the second planarization layer 180, the area of the pad contact hole PCT may be reduced or minimized.

A passivation layer PAS may be disposed on the third source metal layer and the pad electrodes. The passivation layer PAS may be formed of a silicon nitride layer, a silicon oxynitride layer, a silicon oxide layer, a titanium oxide layer, or an aluminum oxide layer. The passivation layer PAS may expose a portion of top surfaces of the anode pad electrode APD and the cathode pad electrode CPD without covering a portion of top surfaces thereof.

In one or more embodiments, an inorganic insulating layer may be further included between the planarization layer and the metal layer. For example, an inorganic insulating layer may be disposed between the first planarization layer 160 and the second source metal layer and between the second planarization layer 180 and the third source metal layer. The inorganic insulating layer may be formed of, for example, a silicon nitride layer, a silicon oxynitride layer, a silicon oxide layer, a titanium oxide layer, or an aluminum oxide layer.

Referring to FIG. 20, the light emitting element EL may be disposed on the anode pad electrode APD and the cathode pad electrode CPD that are not covered by the passivation layer PAS. It is illustrated that the light emitting element EL is a flip-chip type micro LED in which the first contact electrode CTE1 faces the anode pad electrode APD and a second contact electrode CTE2 faces the cathode pad electrode CPD. The light emitting element EL may include an inorganic material such as GaN. A length of the light emitting element EL in the horizontal direction and a length thereof in the third direction DR3 may be several to several hundreds of micrometers (μm), respectively.

The light emitting element EL may be formed by being grown on a semiconductor substrate such as a silicon wafer. The light emitting element EL may be directly transferred onto the anode pad electrode APD and the cathode pad electrode CPD of the substrate SUB from the silicon wafer. Alternatively, the light emitting element EL may be transferred onto the anode pad electrode APD and the cathode pad electrode CPD through an electrostatic method using an electrostatic head or a stamp method using an elastic polymer material such as PDMS or silicon as a transfer substrate.

The light emitting element EL may be a light emitting structure including a base substrate BSUB, an n-type semiconductor NSEM, an active layer MQW, a p-type semiconductor PSEM, a first contact electrode CTE1, and a second contact electrode CTE2.

The base substrate BSUB may be a sapphire substrate, but one or more embodiments of the present specification are not limited thereto.

The n-type semiconductor NSEM may be disposed on one surface of the base substrate BSUB. For example, the n-type semiconductor NSEM may be disposed on a lower surface of the base substrate BSUB. The n-type semiconductor NSEM may be formed of GaN doped with an n-type conductive dopant such as Si, Ge, Sn, or Se.

The active layer MQW may be disposed on a portion of one surface of the n-type semiconductor NSEM. The active layer MQW may form a bond of an electron-hole pair according to an electrical signal through an electron of the n-type semiconductor NSEM and a hole of the p-type semiconductor PSEM, and may emit light. The active layer MQW may include a material having a single or multiple quantum well structure. When the active layer MQW includes the material having the multiple quantum well structure, the active layer MQW may also have a structure in which a plurality of well layers and barrier layers are alternately stacked. In this case, the well layer may be formed of InGaN, and the barrier layer may be formed of GaN or AlGaN, but the present disclosure is not limited thereto. Alternatively, the active layer MQW may also have a structure in which semiconductor materials having large band gap energy and semiconductor materials having small band gap energy are alternately stacked, and may also include other Group III to Group V semiconductor materials depending on a wavelength band of emitted light.

The p-type semiconductor PSEM may be disposed on one surface of the active layer MQW. The p-type semiconductor PSEM may be formed of GaN doped with a p-type conductive dopant such as Mg, Zn, Ca, or Ba.

The first contact electrode CTE1 may be disposed on the p-type semiconductor PSEM, and the second contact electrode CTE2 may be disposed on another portion of one surface of the n-type semiconductor NSEM. Another portion of one surface of the n-type semiconductor NSEM on which the second contact electrode CTE2 is disposed may be disposed to be spaced from a portion of one surface of the n-type semiconductor NSEM on which the active layer MQW is disposed.

The first contact electrode CTE1 and the anode pad electrode APD may be bonded to each other through a conductive adhesive member such as an anisotropic conductive film (ACF) or an anisotropic conductive paste (ACP). Alternatively, the first contact electrode CTE1 and the anode pad electrode APD may be bonded to each other through a soldering process.

The second contact electrode CTE2 and the cathode pad electrode CPD may be bonded to each other through a conductive adhesive member such as an anisotropic conductive film (ACF) or an anisotropic conductive paste (ACP). Alternatively, the second contact electrode CTE2 and the cathode pad electrode CPD may be bonded to each other through a soldering process.

In addition, a third planarization layer for planarizing a step caused by the light emitting element EL may be disposed. A fourth planarization layer may be disposed to surround side surface(s) of the light emitting element EL, and may expose a top surface of the light emitting element EL without covering the top surface of the light emitting element EL.

In the display device 10 according to the present embodiment, by designing the third power supply line VSSL to which a low driving voltage is applied in the second gate metal layer, a mask process for forming an additional conductive layer on the third source metal layer may be omitted. The second gate metal layer may further include the third power supply line VSSL at a position spaced from the second capacitor electrode CE2, the fourth capacitor electrode CE4, and the sixth capacitor electrode CE6. That is, by patterning the third power line VSSL in an area in which an upper capacitor electrode is not disposed on the second gate metal layer, a process for disposing a separate low driving voltage line on the third source metal layer and the third planarization layer may be omitted. Accordingly, because the two mask processes may be omitted, the manufacturing process of the display device 10 may be simplified, and manufacturing costs may be reduced due to a decrease in the number of masks.

In one or more embodiments, when the second gate metal layer further includes the third power line VSSL, a decrease in resistance of the signal lines may be reduced or minimized by reducing an area occupied by each sub-pixel to about 3% and increasing a thickness of each metal layer by 120 Å.

In one or more embodiments, by replacing the mask forming an alignment key with the active layer ACT, the light blocking layer disposed between the buffer layer BF and the gate insulating layer 130 may be omitted. When the light blocking layer is omitted, one mask process may be additionally omitted. In this case, a light leakage phenomenon emitted from the display device 10 may be controlled through the first gate metal layer.

Figure 21:
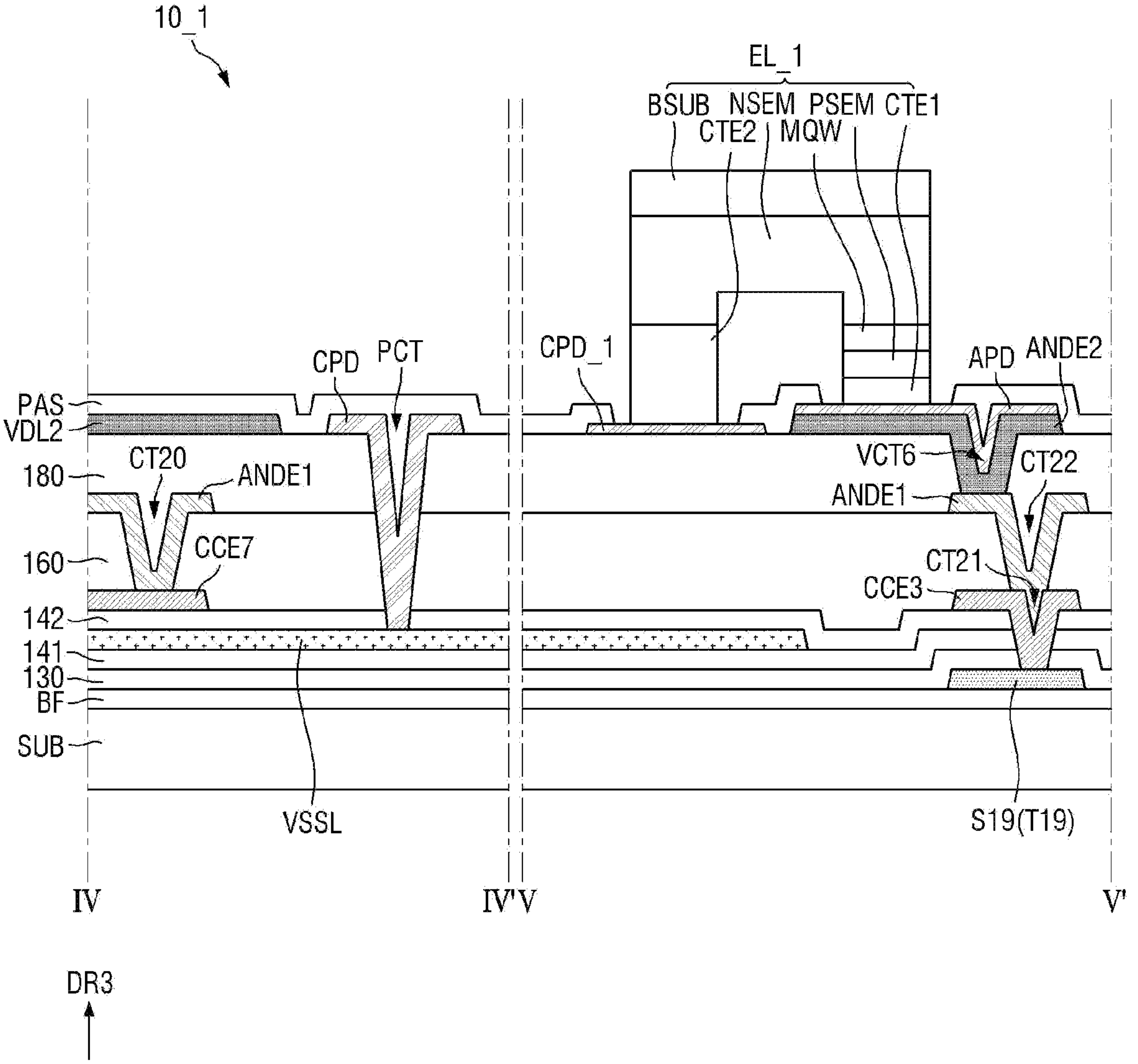
FIG. 21 is another example of the cross-sectional view taken along the lines IV-IV' and V-V' of FIGS. 6 and 7.

FIG. 21 is another example of the cross-sectional view taken along the lines IV-IV' and V-V' of FIGS. 6 and 7.

In a display device 10_1 according to the present embodiment, the cathode connection electrode VSCE may be omitted. In this case, a cathode pad electrode CPD_1 may be in direct contact with the second planarization layer 180. A branch portion of the cathode pad electrode CPD_1 may be in contact with the second planarization layer 180. In addition, a height of the cathode pad electrode CPD_1 from the second planarization layer 180 in the third direction DR3 may be lower than a height of the anode pad electrode APD from the second planarization layer 180 in the third direction DR3. Descriptions of other reference numerals are the same as in the previous embodiment, and thus will be omitted.

Figure 22:
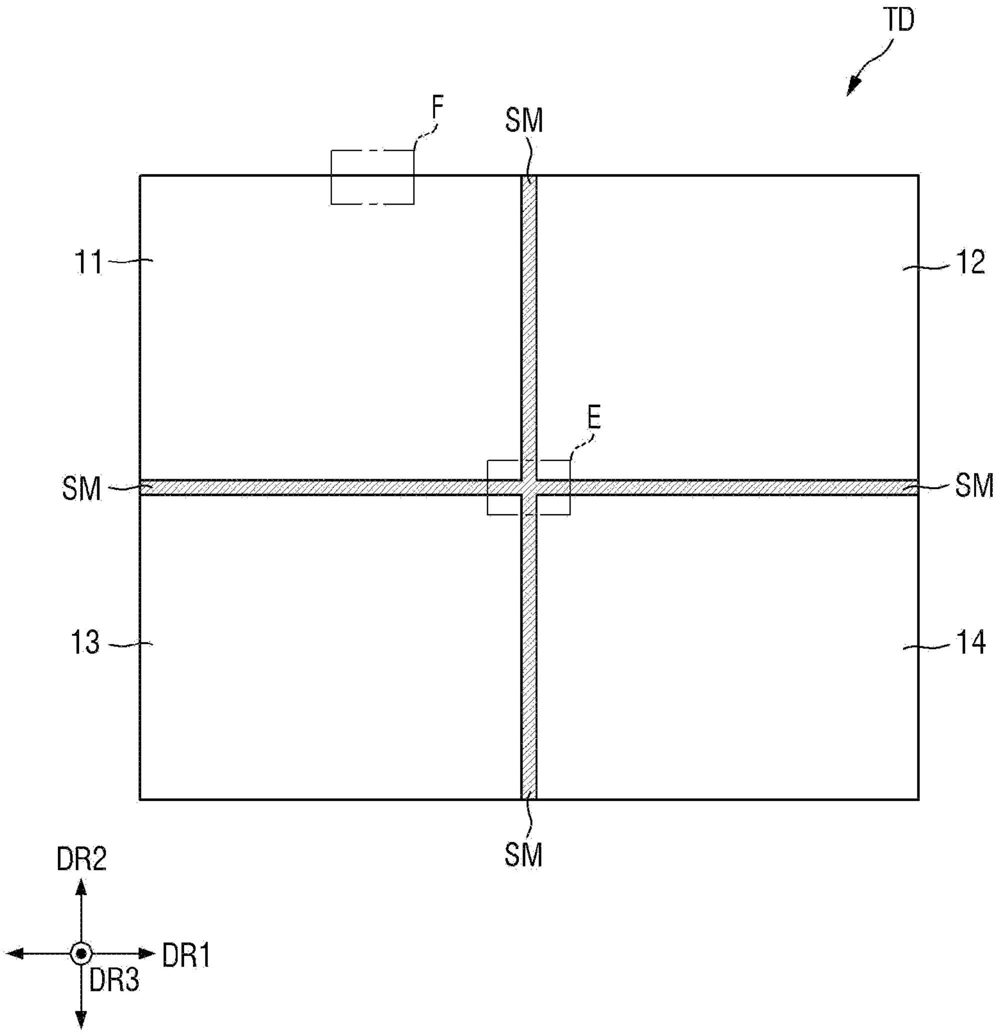
FIG. 22 is a perspective view illustrating a tiled display device including a plurality of display devices according to one or more embodiments.

FIG. 22 is a perspective view illustrating a tiled display device including a plurality of display devices according to one or more embodiments.

Referring to FIG. 22, a tiled display device TD may include a plurality of display devices 11, 12, 13, and 14, and a joint SM. For example, the tiled display device TD may include a first display device 11, a second display device 12, a third display device 13, and a fourth display device 14.

The plurality of display devices 11, 12, 13, and 14 may be arranged in a grid shape. The plurality of display devices 11, 12, 13, and 14 may be arranged in a matrix form in M (M is a positive integer) number of rows and N (N is a positive integer) number of columns. For example, the first display device 11 and the second display device 12 may be adjacent to each other in the first direction DR1. The first display device 11 and the third display device 13 may be adjacent to each other in the second direction DR2. The third display device 13 and the fourth display device 14 may be adjacent to each other in the first direction DR1. The second display device 12 and the fourth display device 14 may be adjacent to each other in the second direction DR2.

However, the number and arrangement of the plurality of display devices 11, 12, 13, and 14 in the tiled display device TD are not limited to those illustrated in FIG. 22. The number and arrangement of the display devices 11, 12, 13, and 14 in the tiled display device TD may be determined according to a size of the display device 10 and a shape of the tiled display device TD.

The plurality of display devices 11, 12, 13, and 14 may have the same size, but are not limited thereto. For example, the plurality of display devices 11, 12, 13, and 14 may have different sizes.

Each of the plurality of display devices 11, 12, 13, and 14 may have a rectangular shape including long sides and short sides. The plurality of display devices 11, 12, 13, and 14 may be disposed with long sides or short sides connected to each other. Some or all of the plurality of display devices 11, 12, 13, and 14 may be disposed at an edge of the tiled display device TD and form one side of the tiled display device TD. At least one display device of the plurality of display devices 11, 12, 13, and 14 may be disposed at at least one corner of the tiled display device TD, and may form two adjacent sides of the tiled display device TD. At least one display device of the plurality of display devices 11, 12, 13, and 14 may be surrounded by other display devices.

Each of the plurality of display devices 11, 12, 13, and 14 may be substantially the same as the display device 10 described with reference to FIG. 1. Therefore, a description of each of the plurality of display devices 11, 12, 13, and 14 will be omitted.

The joint SM may include a coupling member or an adhesive member. In this case, the plurality of display devices 11, 12, 13, and 14 may be connected to each other through the coupling member or then adhesive member of the joint SM. The joint SM may be disposed between the first display device 11 and the second display device 12, between the first display device 11 and the third display device 13, and between the second display device 12 and the fourth display device 14, and between the third display device 13 and the fourth display device 14.

Figure 23:
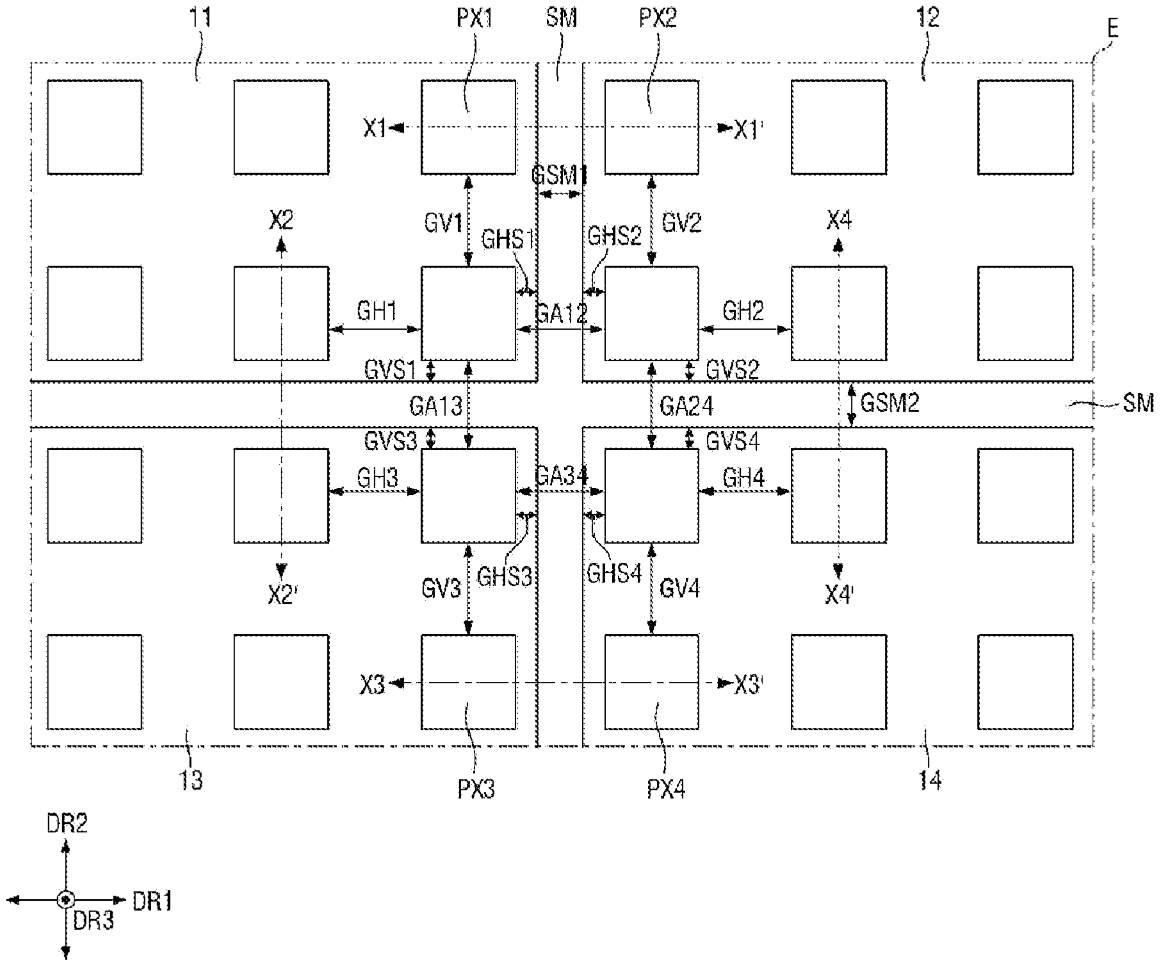
FIG. 23 is an enlarged layout view illustrating in detail an area E of FIG. 22.

FIG. 23 is an enlarged layout view illustrating in detail area E of FIG. 22.

Referring to FIG. 23, the joint SM may have a planar shape of a cross or a plus sign at a central region of the tiled display device TD in which the first display device 11, the second display device 12, the third display device 13, and the fourth display device 14 are adjacent to each other. The joint SM may be disposed between the first display device 11 and the second display device 12, between the first display device 11 and the third display device 13, and between the second display device 12 and the fourth display device 14, and between the third display device 13 and the fourth display device 14.

The first display device 11 may include first pixels PX1 arranged in a matrix form in the first direction DR1 and the second direction DR2 to display an image. The second display device 12 may include second pixels PX2 arranged in a matrix form in the first direction DR1 and the second direction DR2 to display an image. The third display device 13 may include third pixels PX3 arranged in a matrix form in the first direction DR1 and the second direction DR2 to display an image. The fourth display device 14 may include fourth pixels PX4 arranged in a matrix form in the first direction DR1 and the second direction DR2 to display an image.

A minimum distance between the first pixels PX1 adjacent to each other in the first direction DR1 may be defined as a first horizontal separation distance GH1, and a minimum distance between the second pixels PX2 adjacent to each other in the first direction DR1 may be defined as a second horizontal separation distance GH2. The first horizontal separation distance GH1 and the second horizontal separation distance GH2 may be substantially the same.

The joint SM may be disposed between the first pixel PX1 and the second pixel PX2 adjacent to each other in the first direction DR1. A minimum distance GA12 between the first pixel PX1 and the second pixel PX2 adjacent to each other in the first direction DR1 may be a sum of a minimum distance GHS1 between the first pixel PX1 and the joint SM in the first direction DR1, a minimum distance GHS2 between the second pixel PX2 and the joint SM in the first direction DR1, and a width GSM1 of the joint SM in the first direction DR1.

The minimum distance GA12 between the first pixel PX1 and the second pixel PX2 adjacent to each other in the first direction DR1, the first horizontal separation distance GH1, and the second horizontal separation distance GH2 may be substantially the same. To this end, the minimum distance GHS1 between the first pixel PX1 and the joint SM in the first direction DR1 may be smaller than the first horizontal separation distance GH1, and the minimum distance GHS2 between the second pixel PX2 and the joint SM in the first direction DR1 may be smaller than the second horizontal separation distance GH2. In addition, the width GSM1 of the joint SM in the first direction DR1 may be smaller than the first horizontal separation distance GH1 or the second horizontal separation distance GH2.

A minimum distance between the third pixels PX3 adjacent to each other in the first direction DR1 may be defined as a third horizontal separation distance GH3, and a minimum distance between the fourth pixels PX4 adjacent to each other in the first direction DR1 may be defined as a fourth horizontal separation distance GH4. The third horizontal separation distance GH3 and the fourth horizontal separation distance GH4 may be substantially the same.

The joint SM may be disposed between the third pixel PX3 and the fourth pixel PX4 adjacent to each other in the first direction DR1. A minimum distance GA34 between the third pixel PX3 and the fourth pixel PX4 adjacent to each other in the first direction DR1 may be a sum of a minimum distance GHS3 between the third pixel PX3 and the joint SM in the first direction DR1, a minimum distance GHS4 between the fourth pixel PX4 and the joint SM in the first direction DR1, and the width GSM1 of the joint SM in the first direction DR1.

The minimum distance GA34 between the third pixel PX3 and the fourth pixel PX4 adjacent to each other in the first direction DR1, the third horizontal separation distance GH3, and the fourth horizontal separation distance GH4 may be substantially the same. To this end, the minimum distance GHS3 between the third pixel PX3 and the joint SM in the first direction DR1 may be smaller than the third horizontal separation distance GH3, and the minimum distance GHS4 between the fourth pixel PX4 and the joint SM in the first direction DR1 may be smaller than the fourth horizontal separation distance GH4. In addition, the width GSM1 of the joint SM in the first direction DR1 may be smaller than the third horizontal separation distance GH3 or the fourth horizontal separation distance GH4.

A minimum distance between the first pixels PX1 adjacent to each other in the second direction DR2 may be defined as a first vertical separation distance GV1, and a minimum distance between the third pixels PX3 adjacent to each other in the second direction DR2 may be defined as a third vertical separation distance GV3. The first vertical separation distance GV1 and the third vertical separation distance GV3 may be substantially the same.

The joint SM may be disposed between the first pixel PX1 and the third pixel PX3 adjacent to each other in the second direction DR2. A minimum distance GA13 between the first pixel PX1 and the third pixel PX3 adjacent to each other in the second direction DR2 may be a sum of a minimum distance GVS1 between the first pixel PX1 and the joint SM in the second direction DR2, a minimum distance GVS3 between the third pixel PX3 and the joint SM in the second direction DR2, and a width GSM2 of the joint SM in the second direction DR2.

The minimum distance GA13 between the first pixel PX1 and the third pixel PX3 adjacent to each other in the second direction DR2, the first vertical separation distance GV1, and the third vertical separation distance GV3 may be substantially the same. To this end, the minimum distance GVS1 between the first pixel PX1 and the joint SM in the second direction DR2 may be smaller than the first vertical separation distance GV1, and the minimum distance GVS3 between the third pixel PX3 and the joint SM in the second direction DR2 may be smaller than the third vertical separation distance GV3. In addition, the width GSM2 of the joint SM in the second direction DR2 may be smaller than the first vertical separation distance GV1 or the third vertical separation distance GV3.

A minimum distance between the second pixels PX2 adjacent to each other in the second direction DR2 may be defined as a second vertical separation distance GV2, and a minimum distance between the fourth pixels PX4 adjacent to each other in the second direction DR2 may be defined as a fourth vertical separation distance GV4. The second vertical separation distance GV2 and the fourth vertical separation distance GV4 may be substantially the same.

The joint SM may be disposed between the second pixel PX2 and the fourth pixel PX4 adjacent to each other in the second direction DR2. A minimum distance GA24 between the second pixel PX2 and the fourth pixel PX4 adjacent to each other in the second direction DR2 may be a sum of a minimum distance GVS2 between the second pixel PX2 and the joint SM in the second direction DR2, a minimum distance GVS4 between the fourth pixel PX4 and the joint SM in the second direction DR2, and the width GSM2 of the joint SM in the second direction DR2.

The minimum distance GA24 between the second pixel PX2 and the fourth pixel PX4 adjacent to each other in the second direction DR2, the second vertical separation distance GV2, and the fourth vertical separation distance GV4 may be substantially the same. To this end, the minimum distance GVS2 between the second pixel PX2 and the joint SM in the second direction DR2 may be smaller than the second vertical separation distance GV2, and the minimum distance GVS4 between the fourth pixel PX4 and the joint SM in the second direction DR2 may be smaller than the fourth vertical separation distance GV4. In addition, the width GSM2 of the joint SM in the second direction DR2 may be smaller than the second vertical separation distance GV2 or the fourth vertical separation distance GV4.

As illustrated in FIG. 23, in order to prevent the joint SM from being recognized between the images displayed by the plurality of display devices 11, 12, 13, and 14, the minimum distance between the pixels of the display devices adjacent to each other may be substantially the same as the minimum distance between the pixels of each of the display devices.

Figure 24:
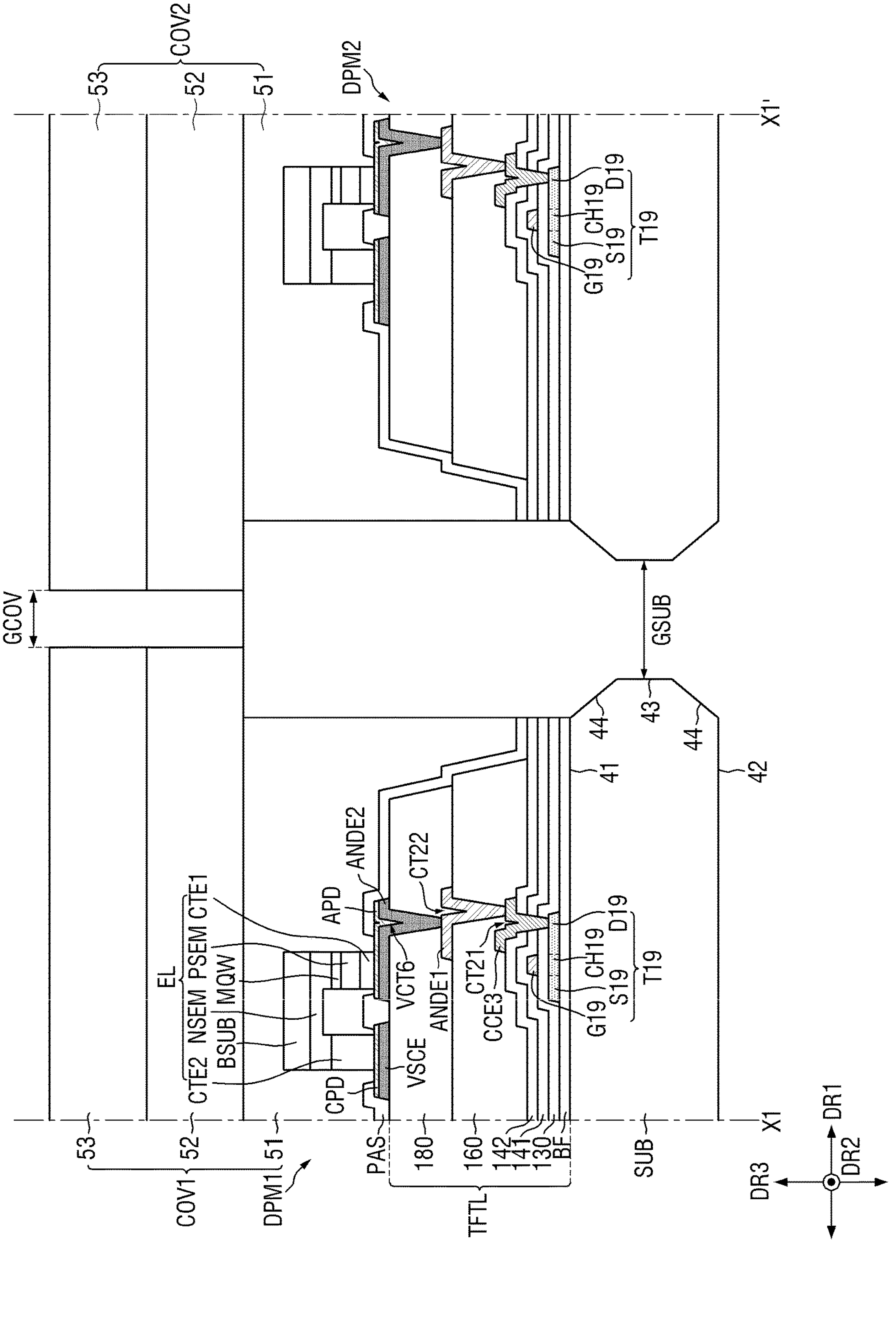
FIG. 24 is a cross-sectional view illustrating an example of a tiled display device taken along the line X1-X1' of FIG. 23.

FIG. 24 is a cross-sectional view illustrating an example of a tiled display device taken along the line X1-X1' of FIG. 23.

Referring to FIG. 24, the first display device 11 includes a first display module DPM1 and a first front cover COV1. The second display device 12 includes a second display module DPM2 and a second front cover COV2.

Each of the first display module DPM1 and the second display module DPM2 includes a substrate SUB, a thin film transistor layer TFTL, and a plurality of light emitting elements EL. The thin film transistor layer TFTL and the plurality of light emitting elements EL have already been described in detail with reference to FIG. 20. In FIG. 24, the description overlapping the embodiment of FIG. 20 will be omitted.

The substrate SUB may include a first surface 41 on which the thin film transistor layer TFTL is disposed, a second surface 42 opposite the first surface 41, and a first side surface 43 disposed between the first surface 41 and the second surface 42. The first surface 41 may be a front surface or a top surface of the substrate SUB, and the second surface 42 may be a back surface or a bottom surface of the substrate SUB.

In addition, the substrate SUB may further include a chamfer surface 44 disposed between the first surface 41 and the first side surface 43 and between the second surface 42 and the first side surface 43. The thin film transistor layer TFTL and the light emitting element layer may not be disposed on the chamfer surface 44. The chamfer surface 44 may prevent the substrate SUB of the first display device 11 from being damaged by collision with the substrate of the second display device 12.

The chamfer surface 44 may also be disposed between the first surface 41 and each of the other side surfaces other than the first side surface 43 and between the second surface 42 and each of the other side surfaces other than the first side surface 43. For example, when the first display device 11 and the second display device 12 have a rectangular planar shape as illustrated in FIG. 23, the substrate SUB may be disposed between the first surface 41 and each of a second side surface, a third side surface, and a fourth side surface, and between the second surface 42 and each of the second side surface, the third side surface, and the fourth side surface.

The first front cover COV1 may be disposed on the chamfer surface 44 of the substrate SUB. That is, the first front cover COV1 may protrude more than the substrate SUB in the first direction DR1 and the second direction DR2. Therefore, a distance GSUB between the substrate SUB of the first display device 11 and the substrate SUB of the second display device 12 may be greater than a distance GCOV between the first front cover COV1 and the second front cover COV2.

Each of the first front cover COV1 and the second front cover COV2 may include an adhesive member 51, a light transmittance adjusting layer 52 disposed on the adhesive member 51, and an anti-glare layer 53 disposed on the light transmittance adjusting layer 52.

The adhesive member 51 of the first front cover COV1 serves to attach the first display module DPM1 to the first front cover COV1. The adhesive member 51 of the second front cover COV2 serves to attach the second display module DPM2 to the second front cover COV2. The adhesive member 51 may be a transparent adhesive member capable of transmitting light. For example, the adhesive member 51 may be an optically clear adhesive film or an optically clear resin.

The anti-glare layer 53 may be designed to diffusely reflect external light in order to prevent deterioration in image visibility caused by external light being reflected as it is. Accordingly, a contrast ratio of the images displayed by the first display device 11 and the second display device 12 may be increased due to the anti-glare layer 53.

The light transmittance adjusting layer 52 may be designed to reduce transmittance of external light or light reflected from the first display module DPM1 and the second display module DPM2. Accordingly, a gap GSUB between the substrate SUB of the first display module DPM1 and the substrate SUB of the second display module DPM2 may be prevented from being visually recognized from the outside.

The anti-glare layer 53 may be implemented as a polarizing plate, and the light transmittance adjusting layer 52 may be implemented as a phase delay layer, but one or more embodiments of the present specification are not limited thereto.

In one or more embodiments, because examples of the tiled display device taken along the lines X2-X2', X3-X3', and X4-X4' of FIG. 23 are substantially the same as the example of the tiled display device taken along the line X1-X1' described with reference to FIG. 24, a description thereof will be omitted.

Figure 25:
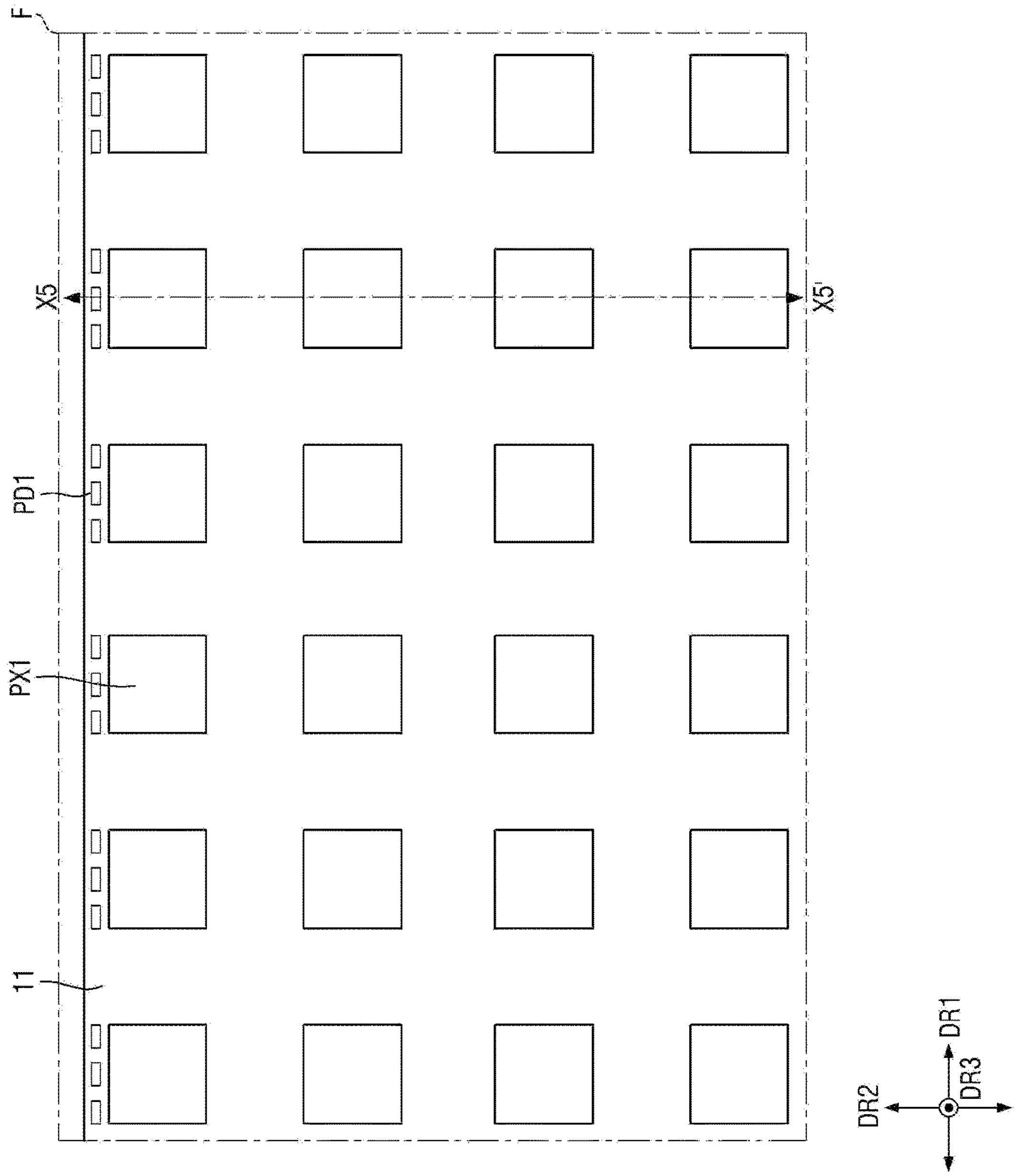
FIG. 25 is an enlarged layout view illustrating in detail an area F of FIG. 22.
Figure 26:
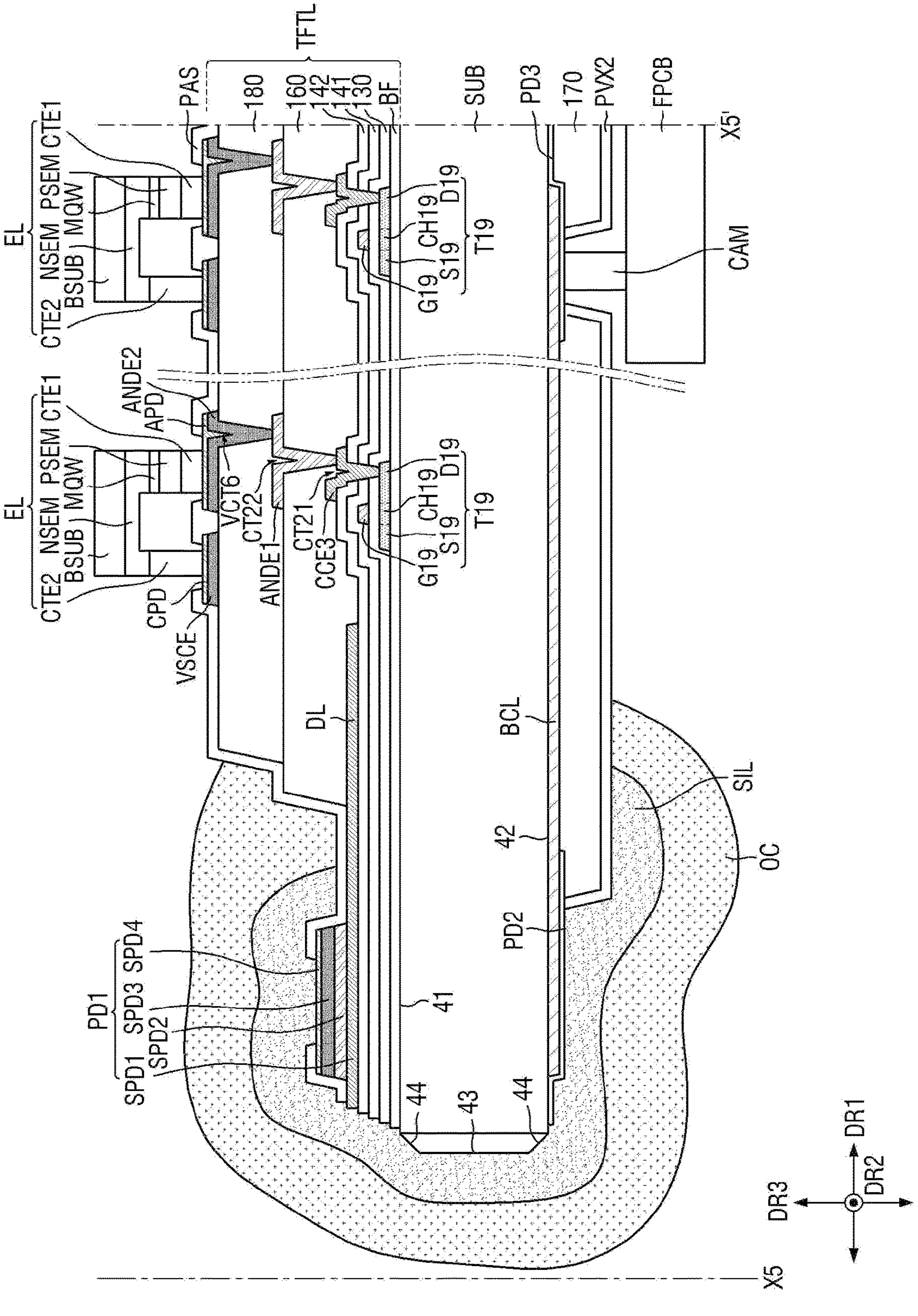
FIG. 26 is a cross-sectional view illustrating an example of a tiled display device taken along the line X5-X5' of FIG. 25.

FIG. 25 is an enlarged layout view illustrating in detail area F of FIG. 22. FIG. 26 is a cross-sectional view illustrating an example of a tiled display device taken along the line X5-X5' of FIG. 25. In FIG. 26, a description overlapping the embodiments of FIGS. 17 to 21 will be omitted.

FIG. 25 illustrates first pads PD1 disposed on an upper side of the first display device 11 and the second sub-pixels GP of the first pixel PX1.

Referring to FIG. 25, the first pads PD1 may be disposed on an upper edge of the first display device 11. When the data lines DL of the first display device 11 extend in the second direction DR2, the first pads PD1 may be disposed on upper and lower edges of the first display device 11. Alternatively, when the data lines DL of the first display device 11 extend in the first direction DR1, the first pads PD1 may be disposed on left and right edges of the first display device 11.

Each of the first pads PD1 may be connected to the data line DL. In addition, each of the first pads PD1 may be connected to a side connection line SIL. The side connection line SIL may be disposed on one side and a bottom surface (or a back surface) of the substrate SUB. The side connection line SIL may be connected to a bottom connection line BCL on the bottom surface of the substrate SUB.

The first pads PD1 may be disposed on the second interlayer insulating layer 142. The first pads PD1 may be exposed without being covered by the first planarization layer 160 and the second planarization layer 180.

The first pad PD1 may include first to fourth sub-pads SPD1, SPD2, SPD3, and SPD4. The second sub-pad SPD2 may be disposed on the first sub-pad SPD1, and the third sub-pad SPD3 may be disposed on the second sub-pad SPD2. The fourth sub-pad SPD4 may be disposed on the third sub-pad SPD3. It is illustrated that the first sub-pad SPD1 is included in a first source metal layer, the second sub-pad SPD2 is included in a second source metal layer, the third sub-pad SPD3 is included in a third source metal layer, and the fourth sub-pad SPD4 is included in a pad electrode layer including a transparent metal material TCO, but embodiments of the present specification are not limited thereto.

The bottom connection line BCL may be disposed on the bottom surface of the substrate SUB. The bottom connection line BCL may be a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second pad PD2 may be disposed at one end of the bottom connection line BCL, and a third pad PD3 may be disposed on the other end of the bottom connection line BCL. The second pad PD2 and the third pad PD3 may be formed of a transparent conductive oxide such as indium tin oxide (ITO) and indium zinc oxide (IZO).

A third planarization layer 170 may be disposed on the back surface of the bottom connection line BCL and the substrate SUB. The third planarization layer 170 may be formed of an organic layer made of an acryl resin, an epoxy resin, a phenolic resin, a polyamide resin, a polyimide resin, or the like.

A second passivation layer PVX2 may be disposed on the third planarization layer 170. The second passivation layer PVX2 may be formed as an inorganic layer, for example, a silicon nitride layer, a silicon oxynitride layer, a silicon oxide layer, a titanium oxide layer, or an aluminum oxide layer.

The side connection line SIL may be disposed on the first surface 41, the second surface 42, the first side surface 43, and the first chamfer surfaces 44 of the substrate SUB. The side connection line SIL may be disposed on the first pad PD1 disposed on an edge of the first surface 41 of the substrate SUB and may be connected to the first pad PD1. The side connection line SIL may be disposed on the second pad PD2 disposed on an edge of the second surface 42 of the substrate SUB and may be connected to the second pad PD2. The side connection line SIL may be in contact with the first chamfer surfaces 44 and the first side surface 43 of the substrate SUB.

An overcoat layer OC may be disposed on the first surface 41, the first chamfer surfaces 44, the first side surface 43, and the second surface 42 of the substrate SUB. The overcoat layer OC may be disposed to cover the side connection line SIL. The overcoat layer OC may be formed of an organic layer made of an acryl resin, an epoxy resin, a phenolic resin, a polyamide resin, a polyimide resin, or the like.

A circuit board FPCB may be disposed on the back surface of the substrate SUB. The circuit board FPCB may be connected to the third pad PD3 exposed without being covered by the third planarization layer 170 and the second passivation layer PVX2 using a conductive adhesive member CAM. The circuit board FPCB may be connected to the third pad PD3 through the conductive adhesive member CAM. The conductive adhesive member CAM may be an anisotropic conductive film or an anisotropic conductive paste.

Figure 27:
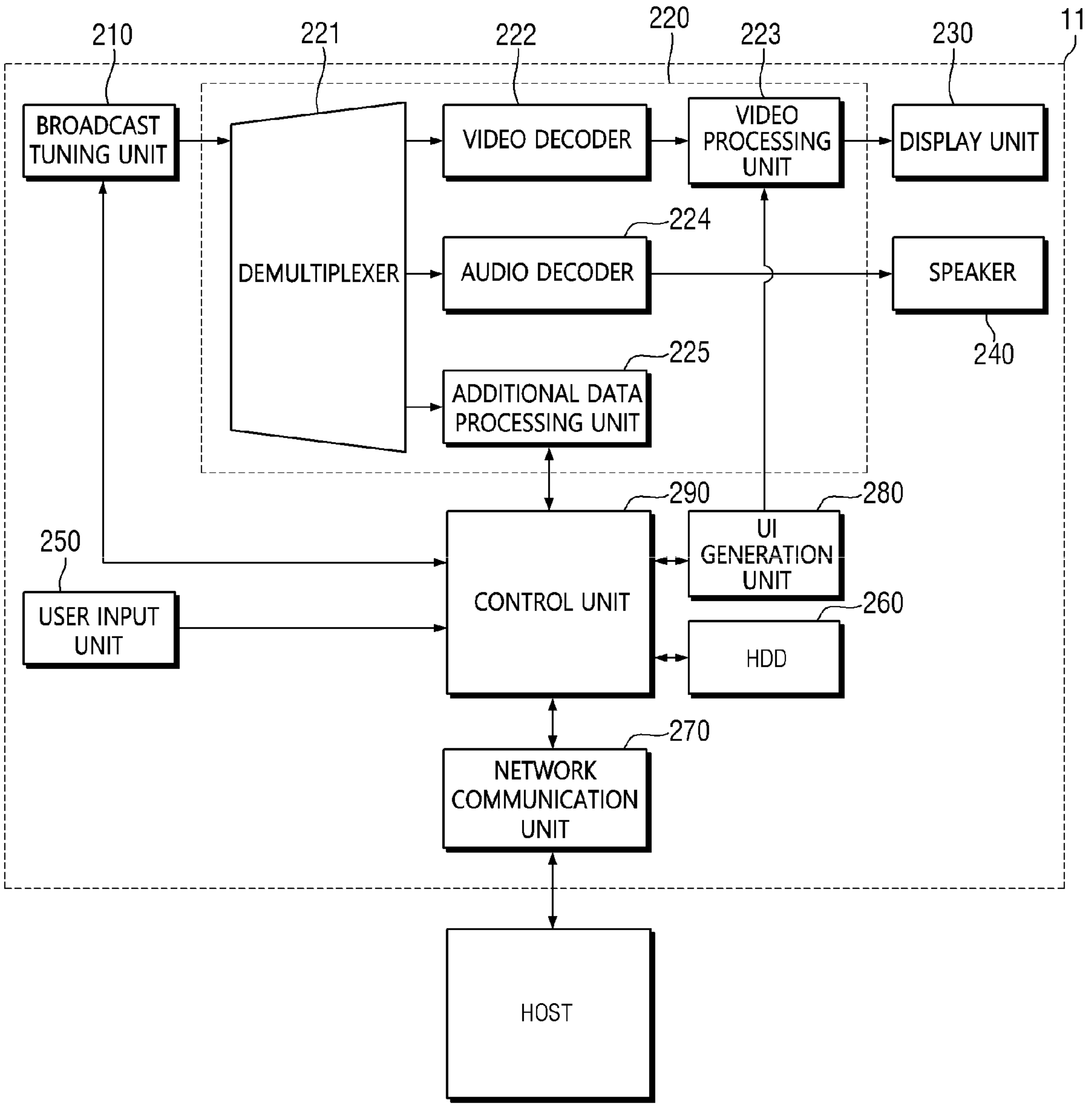
FIG. 27 is a block diagram illustrating a tiled display device according to one or more embodiments.

FIG. 27 is a block diagram illustrating a tiled display device according to one or more embodiments.

FIG. 27 illustrates a first display device 11 and a host system HOST for convenience of explanation.

Referring to FIG. 27, a tiled display device TD according to one or more embodiments may include a host system HOST, a broadcast tuning unit 210, a signal processing unit 220, a display unit 230, a speaker 240, a user input unit 250, an HDD 260, a network communication unit 270, a UI generating unit 280, and a control unit 290.

The host system HOST may be implemented as any one of a television system, a home theater system, a set-top box, a navigation system, a DVD player, a Blu-ray player, a personal computer (PC), a mobile phone system, and a tablet.

A user's command may be input to the host system HOST in various formats. For example, a command by a user's touch input may be input to the host system HOST. Alternatively, a user's command may be input to the host system HOST by a keyboard input or a button input of a remote controller.

The host system HOST may receive original video data corresponding to an original image from the outside. The host system HOST may divide the original video data by the number of display devices. For example, the host system HOST may divide the original video data into first video data corresponding to a first image, second video data corresponding to a second image, third video data corresponding to a third image, and fourth video data corresponding to a fourth image to correspond to the first display device 11, the second display device 12, the third display device 13, and the fourth display device 14. The host system HOST may transmit the first video data to the first display device 11, transmit the second video data to the second display device 12, transmit the third video data to the third display device 13, and transmit the fourth video data to the fourth display device 14.

The first display device 11 may display the first image according to the first video data, the second display device 12 may display the second image according to the second video data, the third display device 13 may display the third image according to the third video data, and the fourth display device 14 may display the fourth image according to the fourth video data. Accordingly, the user may view an original image in which the first to fourth images displayed on the first to fourth display devices 11, 12, 13, and 14 are combined.

The first display device 11 may include the broadcast tuning unit 210, the signal processing unit 220, the display unit 230, the speaker 240, the user input unit 250, the HDD 260, the network communication unit 270, the UI generating unit 280, and the control unit 290.

The broadcast tuning unit 210 may receive a broadcast signal of a corresponding channel through an antenna by tuning a suitable channel frequency (e.g., a predetermined channel frequency) under the control of the control unit 290. The broadcast tuning unit 210 may include a channel detection module and an RF demodulation module.

A broadcast signal demodulated by the broadcast tuning unit 210 is processed by the signal processing unit 220 and output to the display unit 230 and the speaker 240. Here, the signal processing unit 220 may include a demultiplexer 221, a video decoder 222, a video processing unit 223, an audio decoder 224, and an additional data processing unit 225.

The demultiplexer 221 separates the demodulated broadcast signal into a video signal, an audio signal, and additional data. The separated video signal, audio signal, and additional data are restored by the video decoder 222, the audio decoder 224, and the additional data processing unit 225, respectively. In this case, the video decoder 222, the audio decoder 224, and the additional data processing unit 225 restore the separated video signal, audio signal, and additional data in a decoding format corresponding to an encoding format when the broadcast signal is transmitted.

On the other hand, the decoded video signal is converted by the video processing unit 223 to be suitable for a vertical frequency, a resolution, an aspect ratio, and the like that meet an output standard of the display unit 230, and the decoded audio signal is output to the speaker 240.

The display unit 230 includes a display panel 100 on which an image is displayed and a panel driver controlling driving of the display panel 100. A detailed block diagram of the display panel 100 and the panel driver has already been described in detail above with reference to FIG. 4.

The user input unit 250 may receive a signal transmitted by the host system HOST. The user input unit 250 may be provided so that data for selection and input of the user with respect to commands related to communication with other display devices as well as data related to selection of a channel transmitted by the host system HOST and selection and operation of a user interface (UI) may be input.

The HDD 260 stores various software programs including OS programs, recorded broadcast programs, videos, photos, and other data, and may be formed of a storage medium such as a hard disk or non-volatile memory.

The network communication unit 270 is for short-distance communication with the host system (HOST) and other display devices, and may be implemented as a communication module including an antenna pattern capable of implementing mobile communication, data communication, Bluetooth, RF, Ethernet, and the like.

The network communication unit 270 may transmit and receive a wireless signal with at least one of a base station, an external terminal, and a server on a mobile communication network constructed according to technical standards or communication methods for mobile communication (e.g., Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), 5G, etc.) through an antenna pattern to be described later.

The network communication unit 270 may transmit and receive a wireless signal in a communication network according to wireless Internet technologies through an antenna pattern to be described later. Examples of the wireless Internet technology include, for example, Wireless LAN (WLAN), Wireless-Fidelity (Wi-Fi), Wireless Fidelity (Wi-Fi) Direct, Digital Living Network Alliance (DLNA), Wireless Broadband (WiBro), World Interoperability for Microwave Access (WiMAX), High Speed Downlink Packet Access (HSDPA), High Speed Uplink Packet Access (HSUPA), Long Term Evolution (LTE), Long Term Evolution-Advanced (LTE-A), and the like, and the antenna pattern transmits and receives data according to at least one wireless Internet technology within a range including Internet technologies not listed above.

The UI generating unit 280 generates a UI menu for communication with the host system HOST and other display devices, and may be implemented by an algorithm code and an OSD IC. The UI menu for communication with the host system HOST and other display devices may be a menu for designating a counterpart digital TV with which communication is desired and selecting a desired function.

The control unit 290 performs overall control of the first display device 11, and performs communication control of the host system HOST and the second to fourth display devices 12, 13, and 14, and may be implemented by a microcontroller unit (MCU) in which a corresponding algorithm code for control is stored and the stored algorithm code is executed.

The control unit 290 performs control so that the corresponding control commands and data are transmitted to the host system HOST and the second to fourth display devices 12, 13, and 14 through the network communication unit 270 according to the input and selection of the user input unit 250. When suitable control commands and data (e.g., predetermined control commands and data) are input from the host system HOST and the second to fourth display devices 12, 13, and 14, the control unit 290 performs an operation according to the corresponding control command.

Because a block diagram of the second display device 12, a block diagram of the third display device 13, and a block diagram of the fourth display device 14 are substantially the same as the block diagram of the first display device 11 described with reference to FIG. 4, a description thereof will be omitted.

However, the aspects and features of embodiments of the present disclosure are not restricted to the one set forth herein. The above and other aspects of the present disclosure will become more apparent to one of daily skill in the art to which the present disclosure pertains by referencing the claims, with functional equivalents thereof to be included therein.

What is claimed is:

1. A display device comprising:
- a first data line configured to receive a first data voltage;
- a second data line configured to receive a second data voltage;
- a low driving voltage line configured to receive a low driving voltage; and
- a first sub-pixel connected to the first data line, the second data line, and the low driving voltage line,
- wherein the first sub-pixel comprises:
  - a cathode pad electrode connected to the low driving voltage line;
  - a first transistor configured to generate a control current according to the first data voltage of the first data line and having a first gate electrode;
  - a second transistor configured to generate a driving current applied to a light emitting element according to the second data voltage of the second data line; and
  - a first capacitor comprising a first capacitor electrode connected to the first gate electrode, and a second capacitor electrode on the first capacitor electrode, and
- wherein the low driving voltage line is at a same layer as the second capacitor electrode and is surrounding the second capacitor electrode, and
- wherein the low driving voltage line comprises a hole and the second capacitor electrode is located in the hole in a plan view.

2. The display device of claim 1, further comprising a scan write line configured to receive a scan write signal; and
- a third transistor comprising a third gate electrode connected to the scan write line,
- wherein the third gate electrode overlaps the low driving voltage line.

3. The display device of claim 1, wherein the low driving voltage line is on a lower side of the first data line and the second data line.

4. The display device of claim 1, wherein the cathode pad electrode is connected to the low driving voltage line through a pad contact hole.

5. The display device of claim 4, wherein the cathode pad electrode comprises a stem portion extending in a first direction, and a branch portion connected to the stem portion and extending in a second direction intersecting the first direction, and wherein the pad contact hole is in the stem portion.

6. The display device of claim 4, further comprising:
- a second light emitting line configured to receive a second light emitting signal;
- a second high driving voltage line configured to receive a second high driving voltage; and
- a fourth transistor connecting the second high driving voltage line to one electrode of the second transistor according to the second light emitting signal,
- wherein the second high driving voltage line is on the low driving voltage line.

7. The display device of claim 6, wherein the low driving voltage line further comprises:
- a hole exposing one electrode of the fourth transistor; and
- a connection electrode having a contact hole connecting the one electrode of the fourth transistor and the second high driving voltage line to each other in the hole.

8. The display device of claim 7, further comprising a substrate supporting the first sub-pixel, wherein the low driving voltage line, the connection electrode, and the second high driving voltage line are sequentially located in a thickness direction of the substrate.

9. The display device of claim 6, wherein the second high driving voltage line comprises an opening exposing the low driving voltage line, and wherein the cathode pad electrode is connected to the low driving voltage line in the opening.

10. The display device of claim 1, further comprising an anode pad electrode spaced from the cathode pad electrode, wherein the light emitting element is on the cathode pad electrode and the anode pad electrode.

11. The display device of claim 1, further comprising:

a first light emitting line configured to receive a first light emitting signal;

a first high driving voltage line configured to receive a first high driving voltage; —and a fifth transistor connecting the first high driving voltage line to one electrode of the first transistor according to the first light emitting signal, wherein the low driving voltage line includes a hole exposing one electrode of the fifth transistor.

12. The display device of claim 1, wherein the light emitting element is a flip chip type micro light emitting diode element.

13. A display device comprising:

a first data line configured to receive a first data voltage;

a second data line configured to receive a second data voltage;

a low driving voltage line configured to receive a low driving voltage;

a second high driving voltage line configured to receive a second high driving voltage; and a first sub-pixel connected to the first data line, the second data line, the low driving voltage line, and the second high driving voltage line, wherein the first sub-pixel comprises:

a first transistor configured to generate a control current according to the first data voltage of the first data line and having a first gate electrode;

a second transistor configured to generate a driving current applied to a light emitting element according to the second data voltage of the second data line; and a capacitor electrode on the first gate electrode, and wherein the low driving voltage line is at a same layer as the capacitor electrode, and the second high driving voltage line includes an opening exposing the low driving voltage line.

14. The display device of claim 13, further comprising a cathode pad electrode connected to the low driving voltage line within the opening.

15. The display device of claim 13, wherein the light emitting element is a flip chip type micro light emitting diode element.

16. A tiled display device comprising:

a plurality of display devices and a joint located between the plurality of display devices, a first display device of the plurality of display devices comprising: a substrate, a first data line on one surface of the substrate and configured to receive a first data voltage, a second data line configured to receive a second data voltage, a low driving voltage line configured to receive a low driving voltage, and a first sub-pixel connected to the first data line, the second data line, and the low driving voltage line, wherein the first sub-pixel comprises:

a light emitting element;

a cathode pad electrode connected to the low driving voltage line;

a first transistor configured to generate a control current according to the first data voltage of the first data line and having a first gate electrode;

a second transistor configured to generate a driving current applied to the light emitting element according to the second data voltage of the second data line; and a first capacitor comprising a first capacitor electrode connected to the first gate electrode, and a second capacitor electrode on the first capacitor electrode, and wherein the low driving voltage line is at a same layer as the second capacitor electrode and is surrounding the second capacitor electrode, and wherein the low driving voltage line comprises a hole and the second capacitor electrode is located in the hole in a plan view.

17. The tiled display device of claim 16, wherein the light emitting element is a flip chip type micro light emitting diode element.

18. The tiled display device of claim 16, wherein the substrate comprises glass.

19. The tiled display device of claim 16, wherein the first display device further comprises:

a pad on a first surface of the substrate; and a side connection line on the first surface of the substrate, a second surface opposite to the first surface, and one side surface between the first surface and the second surface, and connected to the pad.

20. The tiled display device of claim 19, wherein the first display device further comprises:

a connection line on the second surface of the substrate; and a flexible film connected to connecting wiring through a conductive adhesive member, and the side connection line is connected to the connection line.

21. The tiled display device of claim 16, wherein the plurality of display devices are arranged in a matrix form of M rows and N columns.

* * * * *